(12) United States Patent
Tahir-Kheli

(10) Patent No.: US 11,611,031 B2
(45) Date of Patent: Mar. 21, 2023

(54) HIGH TEMPERATURE SUPERCONDUCTING MATERIALS

(71) Applicant: California Institute of Technology, Pasadena, CA (US)

(72) Inventor: Jamil Tahir-Kheli, Pasadena, CA (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 758 days.

(21) Appl. No.: 15/896,697

(22) Filed: Feb. 14, 2018

(65) Prior Publication Data

US 2018/0233650 A1 Aug. 16, 2018

Related U.S. Application Data

(60) Provisional application No. 62/458,740, filed on Feb. 14, 2017.

(51) Int. Cl.
*H01L 39/12* (2006.01)
*H01L 39/24* (2006.01)
(Continued)

(52) U.S. Cl.
CPC ............ *H01L 39/126* (2013.01); *C04B 35/45* (2013.01); *C04B 35/4504* (2013.01); *C04B 35/4508* (2013.01); *C04B 35/62645* (2013.01); *H01L 39/2422* (2013.01); *C04B 2235/3206* (2013.01); *C04B 2235/327* (2013.01); *C04B 2235/3208* (2013.01); *C04B 2235/3213* (2013.01); *C04B 2235/3215* (2013.01); *C04B 2235/3222* (2013.01); *C04B 2235/3224* (2013.01); *C04B 2235/3225* (2013.01); *C04B 2235/3232* (2013.01); *C04B 2235/3241* (2013.01); *C04B 2235/3244* (2013.01);
(Continued)

(58) Field of Classification Search
CPC .................................................... H01L 39/126
See application file for complete search history.

(56) References Cited

U.S. PATENT DOCUMENTS 5,157,466 A 10/1992 Char et al.
5,447,909 A * 9/1995 Takahashi ........... H01L 39/2441
505/447
(Continued)

FOREIGN PATENT DOCUMENTS

EP 0374689 6/1990

OTHER PUBLICATIONS

EPO Invitation pursuant to Rule to 63(1) EPC dated Nov. 13, 2020 for EP Application No. 18754979.5.
(Continued)

*Primary Examiner* — Paul A Wartalowicz
(74) *Attorney, Agent, or Firm* — Gates & Cooper LLP

(57) ABSTRACT

A superconducting composition of matter including overlapping first and second regions. The regions comprise unit cells of a solid, the first region comprises an electrical insulator or semiconductor, and the second region comprises a metallic electrical conductor. The second region extends through the solid and a subset of said second region comprise surface metal unit cells that are adjacent to at least one unit cell from the first region. The ratio of the number of said surface metal unit cells to the total number of unit cells in the second region being at least 20 percent.

14 Claims, 26 Drawing Sheets

(51) Int. Cl.
*C04B 35/45* (2006.01)
*C04B 35/626* (2006.01)

(52) U.S. Cl.
CPC ............ *C04B 2235/3262* (2013.01); *C04B 2235/3275* (2013.01); *C04B 2235/3279* (2013.01); *C04B 2235/3281* (2013.01); *C04B 2235/3282* (2013.01); *C04B 2235/3284* (2013.01); *C04B 2235/3287* (2013.01); *C04B 2235/3289* (2013.01); *C04B 2235/3293* (2013.01); *C04B 2235/3296* (2013.01); *C04B 2235/3418* (2013.01); *C04B 2235/422* (2013.01)

(56) References Cited

U.S. PATENT DOCUMENTS

| | | | |
|---|---|---|---|
| 2005/0085394 A1 | 4/2005 | Sanchez | |
| 2006/0094603 A1* | 5/2006 | Li | H01L 39/2425 505/445 |
| 2010/0048406 A1* | 2/2010 | Rupich | H01L 39/2483 505/238 |
| 2012/0172231 A1* | 7/2012 | Taft | H01L 39/24 505/122 |

OTHER PUBLICATIONS

Buckley et al., "Ca- and La-substitution in YBa2Cu3O7-δ, Y2Ba4Cu7O15-δ and YBa2Cu4O8". PhysicaC 174 (1991) 383-393 North-Holland.

Tallon et al., "Generic superconducting phase behavior in high-Tc cuprates: Tc variation with hole concentration in YBa2Cu3O7_6". Rapid Communications, Physical Review B, vol. 51, No. 18, May 1, 1995, pp. 12 911-12 914.

H. M. Mook et al., 'Magnetic Order in YBa2Cu3O6+x Superconductors', Physical Review B, Oct. 30, 2002, vol. 66, Issue 14, pp. 1-11.

A. Schilling et al., 'Superconductivity above 130 K in the Hg—Ba—Ca—Cu—O system', Nature, May 6, 1993, vol. 363, pp. 56-57.

S. A. Sunshine et al., 'Structure and physical properties of single crystals of the 84-K superconductor Bi2.2Sr2Ca0.8Cu2O8+δ', Physical Review B, Jul. 1, 1988, vol. 38, Issue 1, ages 893-895.

PCT International Search Report and Written Opinion dated Jul. 30, 2018 for PCT application No. PCT/US2018/018190.

Ghiringhelli et al., "Long-Range Incommensurate Charge Fluctuations in (Y,Nd)Ba2Cu3O6+x". Science vol. 337 Aug. 17, 2012 (6096), pp. 821-825.

Grant, P., "Do-it-yourself superconductors". New Scientist Jul. 30, 1987, pp. 36-39.

Snider et al., "Room-temperature superconductivity in a carbonaceous sulfur hydride". Nature | vol. 586 | Oct. 15, 2020, pp. 373-386.

Zeljkovic et al., "Imaging the Impact of Single Oxygen Atoms on Superconducting Bi2+ySr2—yCaCu2O8+x". Science vol. 337 Jul. 20, 2012 (6092), pp. 320-323.

Zhao et al., "A global inversion-symmetry-broken phase inside the pseudogap region of YBa2Cu3Oy". Nature Physics | vol. 13 | Mar. 2017, pp. 250-255.

Tahir-Kheli et al., "Latent Room-Temperature Tc in Cuprate Superconductors". Applied Physics and Chemistry, Feb. 16, 2017, 100 pages, https://arxiv.org/abs/1702.05001.

Extended European Search Report dated Mar. 18, 2021 for European Patent Application No. 18754979.5.

Suzuki et al., "Composition dependence of superconductivity in the YBa2—xMxCU30y system". Journal of Materials Science Letters 8 (1989) pp. 1271-1273.

* cited by examiner

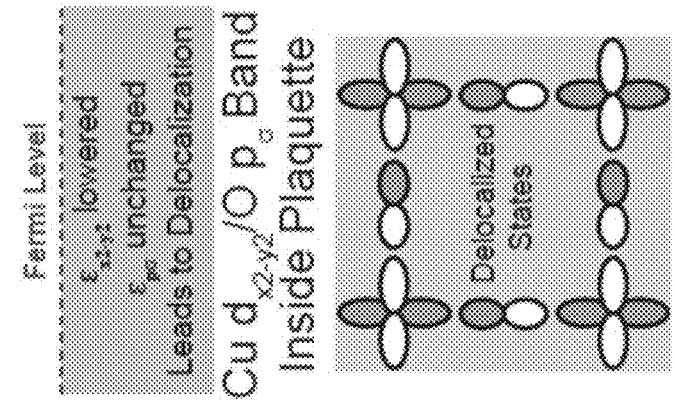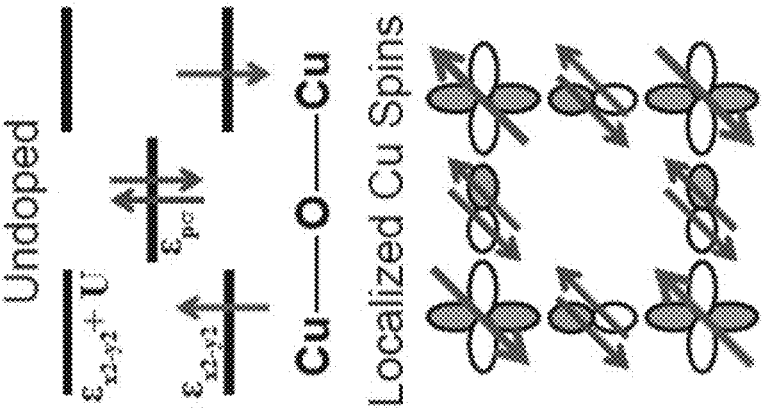
Figure 3A  Figure 3B  Figure 3C  Figure 3D

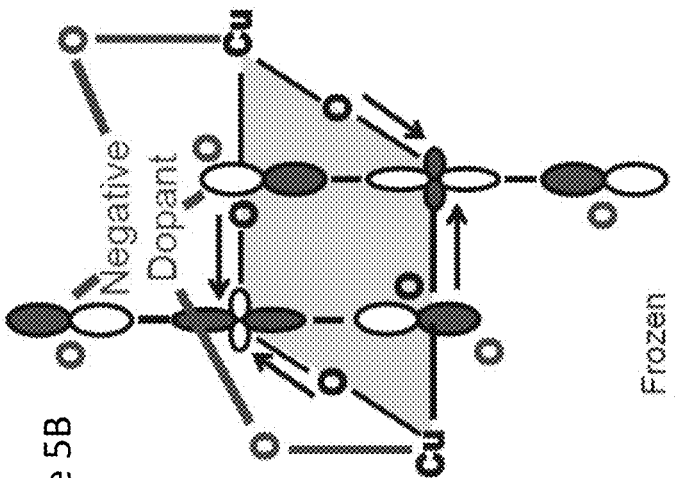
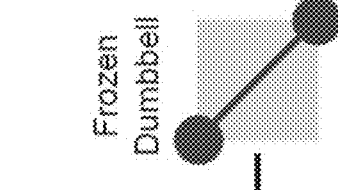
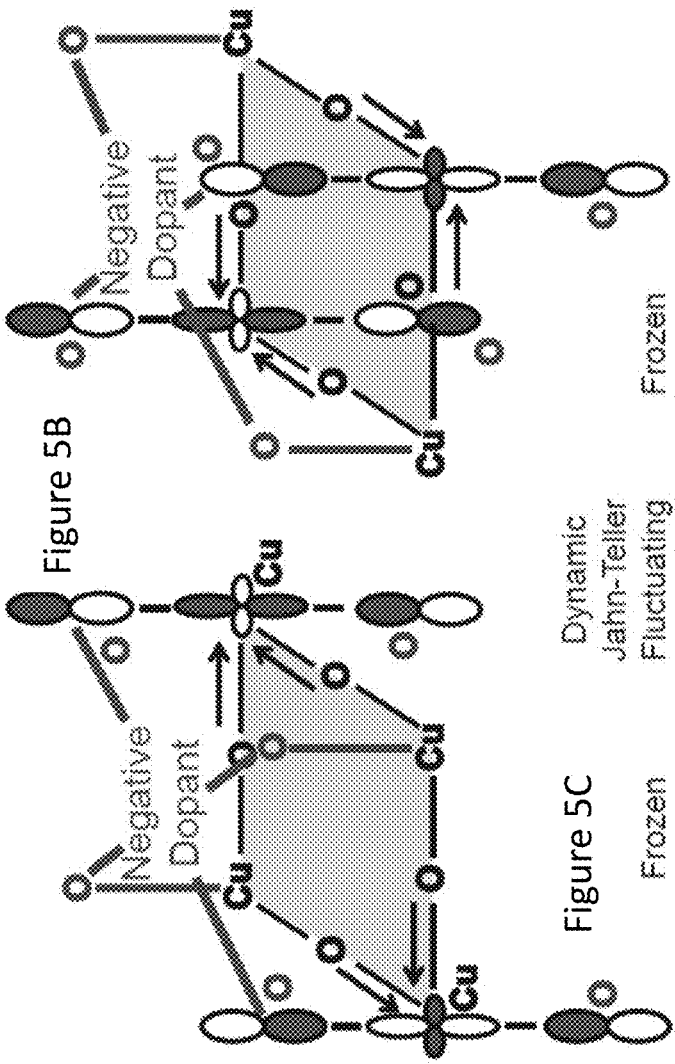
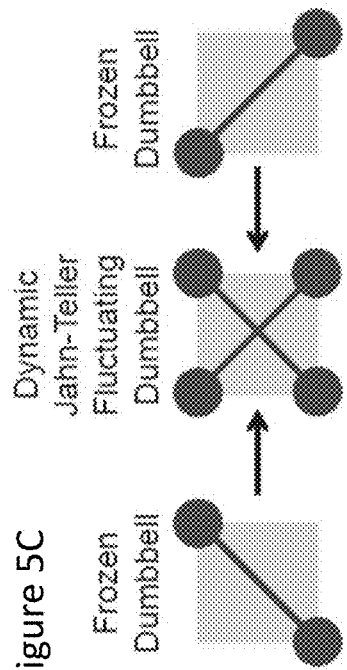
Figure 5B
Figure 5A
Figure 5C

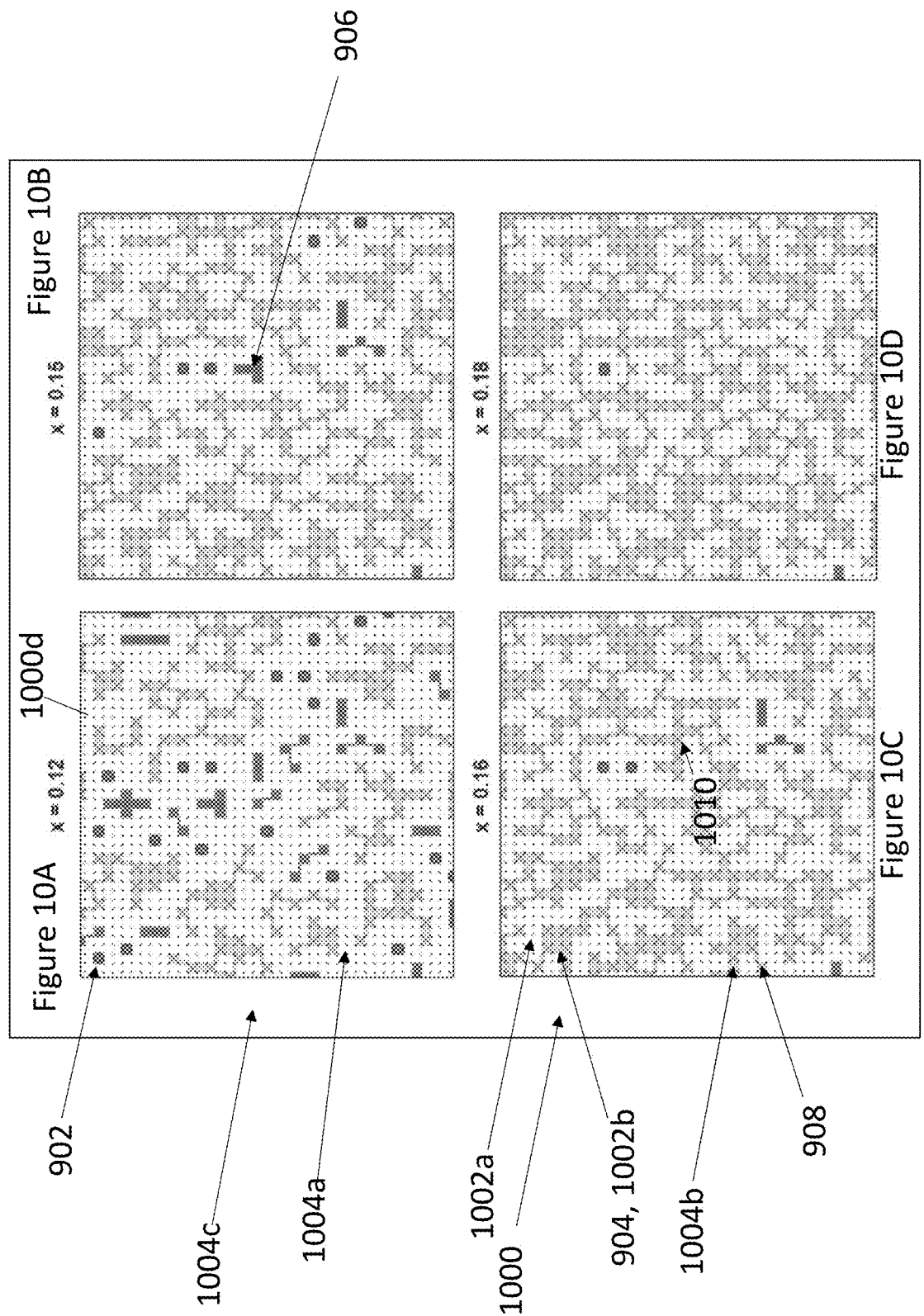

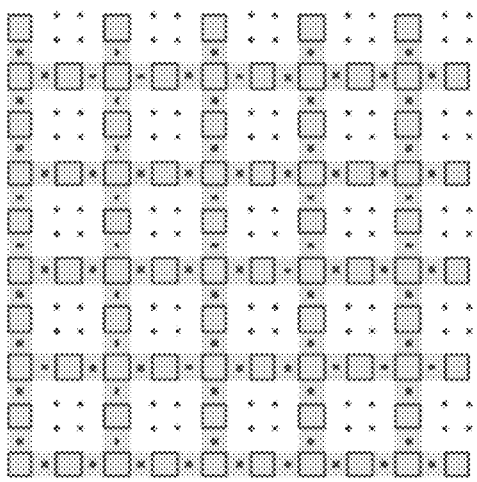
Figure 21C
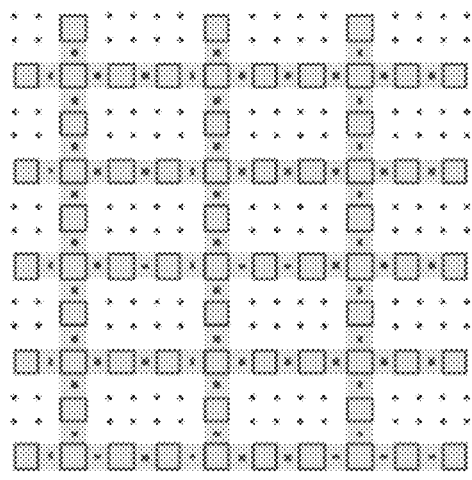
Figure 21B
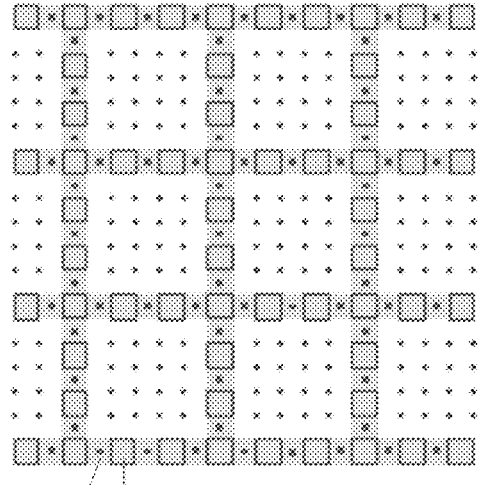
Figure 21A
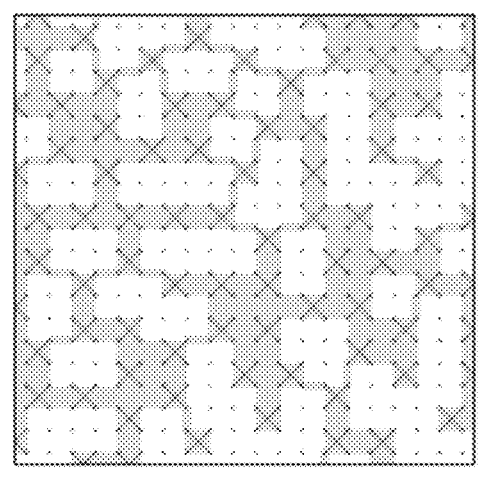
Figure 21F = 0.19
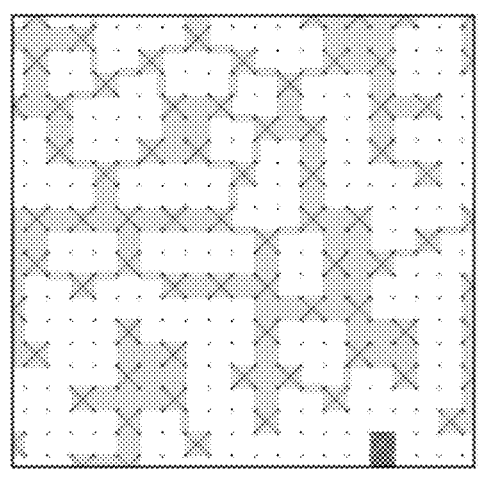
Figure 21E = 0.17
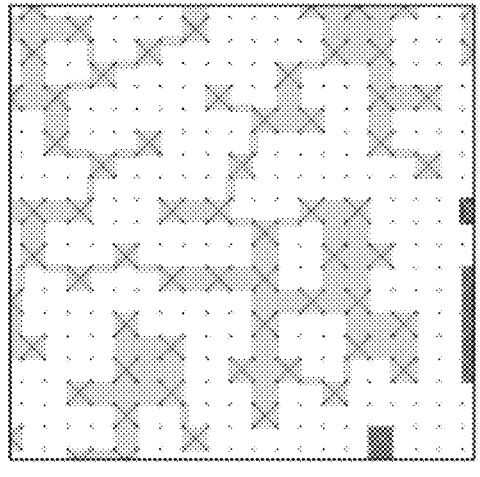
Figure 21D  x = 0.14

HIGH TEMPERATURE SUPERCONDUCTING MATERIALS

CROSS REFERENCE TO RELATED APPLICATIONS

This application claims the benefit under 35 U.S.C. Section 119(c) of and commonly-assigned U.S. Provisional Patent Application Ser. No. 62/458,740, filed on Feb. 14, 2017, by Jamil Tahir-Kheli, entitled "HIGH TEMPERATURE SUPERCONDUCTING MATERIALS"; which application is incorporated by reference herein.

STATEMENT REGARDING FEDERALLY SPONSORED RESEARCH AND DEVELOPMENT

This invention was made with government support under Grant No. N00014-18-1-2679 awarded by the Office of Naval Research. The government has certain rights in the invention.

BACKGROUND OF THE INVENTION

1. Field of the Invention

The present invention relates to superconducting materials and methods of fabricating the same.

2. Description of the Related Art (Note: This application references a number of different publications as indicated throughout the specification by one or mom reference numbers in brackets, e.g., [x]. A list of these different publications ordered according to these reference numbers can be found below in the section entitled "References." Each of these publications is incorporated by reference herein.)

The cuprate superconductors were discovered experimentally by materials scientists in 1986. Since then, there have been over 200,000 refereed papers on cuprate superconductivity, yet the mechanism that leads to superconductivity is unknown. It has been 24 years since the last discovery of the highest temperature superconductor at ambient pressure with a superconducting transition temperature, Tc, of 139 Kelvin. In addition, the critical current density, Jc, is 100 times smaller than the theoretical limit. The lack of progress in increasing Tc and Jc is due to a lack of understanding of the basic physics of these materials.

The current invention shows how significantly higher Tc and Jc can be achieved in the cuprate materials class and in other materials with metallic and insulating regions. Such materials are of immense practical value in electrical machinery and power transmission.

SUMMARY OF THE INVENTION

To overcome the limitations described above, and to overcome other limitations that will become apparent upon reading and understanding this specification, one or more embodiments of the present invention disclose a superconducting composition of matter comprising a first region and a second region. The first and second regions comprise unit cells of a solid (e.g., crystalline or amorphous lattice, periodic or aperiodic lattice), the first region comprises an electrical insulator or semiconductor, the second region comprises a metallic electrical conductor. The second region extends or percolates through the solid (e.g., crystalline or amorphous) lattice and a subset of the second region comprises surface metal unit cells that are adjacent to at least one unit cell from the first region. The ratio of the number of the surface metal unit cells to the total number of unit cells in the second region being at least 20 percent.

Examples of materials for the first region include an antiferromagnetic insulator, a non-magnetic insulator, and a semiconductor.

In one or more examples, the first region is comprised of metal-monoxides, MgO, CaO, SrO, BaO, MnO, FeO, CoO, NiO, CdO, EnO, PrO, or UO, and the second region is comprised of TiO, VO, NbO, NdO, or SmO.

In one or more further examples, the first region is comprised of $Al_2O_3$, and the second region is formed by replacing the Al atoms in the first region with Ti, V, or Cr atoms.

In yet further examples, the first region is comprised of $V_2O_3$ with up to 20% of the V atoms replaced by Cr atoms, and the second region is comprised of $(V_xTi_{1-x})_2O_3$ where x is greater than or equal to zero or less than or equal to one.

In yet further examples, in the composition of one or any combination of the previous examples, the second region is formed by replacing one type of atom in said first region by another type of atom of a different chemical valence.

In yet other examples, in the composition of one or any combination of the previous examples, the second region is formed by adding a type of atom to a subset of the unit cells of said first region, the type of atom of such chemical valence that the type of atom acts as an electrical donor or acceptor when added to said unit cells.

In further examples, in the composition of one or any combination of the previous examples, the second region is formed by adding interstitial atoms in said first region.

In yet other examples, in the composition of one or any combination of the previous examples, the first region is formed by replacing one type of atom in said second region by another type of atom of a different chemical valence.

In one or more examples, in the composition of one or any combination of the previous examples, the first region is formed by adding a type of atom to a subset of the unit cells of said second region, the type of atom of such chemical valence that the type of atom acts as an electrical donor or acceptor when added to said unit cells.

In further examples, in the composition of one or any combination of the previous examples, said first region is formed by adding interstitial atoms in said second region.

In one or more examples, in the composition of one or any combination of the previous examples, the second region is comprised of approximately linear subregions. For example, the approximately linear subregions of the second region can surround regions of the first kind (first region). In other examples, some of the surrounded regions of the first kind (first region) have atomic substitutions, grain boundaries, or interstitial atoms.

The present disclosure further describes a superconductor from the hole-doped cuprate class comprising two distinct atoms (first and second atoms) having such chemical valence that the first atom when added to the cuprate acts as an electrical acceptor, the second atom acts as an electrical donor, and 20% or at least 20% of said second atoms reside inside the unit cell between two of the first atoms that are a distance of two unit cells from each other. In one or more examples, the superconductor has the composition of one or any combination of the previous examples having the first and second regions (the second region including the distinct atoms).

The present disclosure further describes a superconducting composition of matter comprised of $YBa_2Cu_3O_{6+x}$ where at least 5% of the Y atoms are replaced by +2 oxidation state atoms, Mg, Ca, Sr, Zn, Cd, Cu, Ni, or Co, at least 2% of the Y atoms are replaced by +4 oxidation state atoms, Ti, Zr, Hf, C, Si, Ge, Sn, or Pb. In one or more examples, the superconducting composition of matter has the composition of one or any combination of the previous examples having the first and second regions.

The present disclosure further describes a superconductor from the electron-doped cuprate class comprising two distinct atoms (first and second atoms) having such chemical valence that the first atom when added to the cuprate acts as an electrical donor, the second atom acts as an electrical acceptor, and 20% of said second atoms reside inside the unit cell between two of the first atoms that are a distance of two unit cells from each other. In one or more examples, the superconductor has the composition of one or any combination of the previous examples having the first and second regions (the second region including the distinct atoms).

The materials characteristics that are relevant for fabricating room-temperature superconductors and high current densities are also described.

BRIEF DESCRIPTION OF THE DRAWINGS

Referring now to the drawings in which like reference numbers represent corresponding parts throughout:

(FIG. 1A), versus the "chemist's" hybrid density functionals (FIG. 19). The dopant is negatively charged and resides out-of-the $CuO_2$ plane. The physicist's hole state has density in the $CuO_2$ plane and is delocalized over the crystal. It is a peculiar hole state. Intuitively, one would expect the positive hole charge to point at the negatively charged dopant. The chemist's hole state density is out-of-the-$CuO_2$ plane (points at dopant), and is localized around the four-Cu-site plaquette beneath the dopant. In the chemist's view, the crystal has atomic-scale inhomogeneity that is not a small perturbation of translational symmetry. The physicist's view leads to an approximately homogeneous crystal.

FIGS. 3A-3D illustrate the mechanism for the creation of delocalized planar metallic wavefunctions inside a doped plaquette. FIG. 3A shows the Cu $d_{x2-y2}$ and O $p\sigma$ orbital energies in an undoped plaquette. The energy ordering, $\varepsilon_{x2-y2} < \varepsilon_{p\sigma} < \varepsilon_{x2-y2} + U$, where U is the large on-site Cu $d_{x2-y2}$ Coulomb repulsion leads to localization of the spins on the Cu sites, and hence the undoped. AF state. FIG. 3B shows the Fermi Level for a doped plaquette. FIG. 3C shows the induced delocalization (shaded overlay) of the planar Cu $d_{x2-y2}$ and O $p\sigma$ electrons in the plaquette from the decrease of the Cu $d_{x2-y2}$ orbital energy relative to the O $p\sigma$ orbital energy. The decrease occurs because the positive charge of the chemist's out-of-the-plane hole from FIGS. 1B and 2 is closer to the planar Cu site than the planar O site. The out-of-plane hole is not shown here. There are a total of 4 O atom $p\sigma$ orbitals and 4 Cu $d_{x2-y2}$ orbitals inside the four-Cu-site plaquette. Since there are two spin states for each orbital, there is a total of $(4+4) \times 2 = 16$ states in the shaded overlay in the bottom right figure. These 16 states are filled with the 12 electrons (4 red plus 8 blue) shown in the lower left FIG. 3D.

FIGS. 5A-5C illustrate the character of the out-of-plane hole inside a doped plaquette. The arrows show the displacement of the O atoms in the $CuO_2$ plane with each "frozen dumbbell" configuration. Proposed herein is that the out-of-plane hole wavefunction is a dynamic Jahn-Teller state that is a linear superposition (resonance) of the two dumbbells shown in FIGS. 5A and 5B (called a "fluctuating dumbbell"). The two frozen dumbbells in FIGS. 5A and 5B are represented schematically by the left and right figures in FIG. 5C. The fluctuating dumbbell is shown in the center figure in FIG. 5C. The shaded overlay represents the planar Cu $d_{x2-y2}$ and O $p\sigma$ electrons (not shown) that are delocalized inside the plaquette.

FIG. 6A illustrates two non-overlapping plaquettes with fluctuating dumbbells, the $CuO_2$ layer and the out-of-the-plane Sr dopants. The schematic FIG. 6B shows the metallic delocalization of the planar Cu $d_{x2-y2}$ and O $p\sigma$ orbital electrons (shaded overlay) and the two fluctuating dumbbells. FIG. 6C shows two overlapping plaquettes. The degeneracy of the two dumbbell states inside each plaquette is broken and the two dynamic Jahn-Teller fluctuating dumbbells become two frozen dumbbells. FIG. 6D shows a schematic of the metallic regions (shaded overlay) and the frozen dumbbells. The orientation of the dumbbells in this figure is arbitrary. The actual orientation in the crystal will depend on the environment.

FIGS. 10A-10D. Plaquette doping at x=0.12 (FIG. 10A), 0.15 (FIG. 10B), 0.16 (FIG. 10C), and 0.18 (FIG. 10D). The caption of FIGS. 9A-9D explains the symbols in this figure. Optimal Tc occurs for x≈0.16 (FIG. 10C) because the product of the size of the metallic region (number of electrons that can participate in superconducting pairing) and the size of the interface (the number of pairing phonon modes) is maximized. Percolation in 2D occurs at x≈0.15 (FIG. 10B). In the finite lattice shown here, there is no 2D percolating metallic pathway for x=0.15. A 2D percolating pathway appears at x=0.16, as shown in FIG. 4. The number of isolated plaquettes rapidly decreases over this doping range. By x≈0.18 doping, there is only one isolated plaquette in its 40×40 lattice. At optimal doping, the percolation pathway is very tenuous. The maximum critical current density, Jc, will be much less than the maximum due to Cooper pair depairing. Using current fabrication methods, cuprates have a low Jc at the highest Tc. Crossing continuous metallic pathways one plaquette in width would have both large Tc and Je.

FIG. 14A is a schematic representation and FIG. 14B shows the scattering matrix element between two Cooper pairs ($\psi\uparrow$, $\psi\downarrow$) and ($\psi'\uparrow$, $\psi'\downarrow$) with the exchange of a phonon. The two electrons in each pair are time-reversed partners. The symbol x with a horizontal line above the x means the complex conjugate of x. For scatterings in the vicinity of the Fermi level, the matrix element is always negative, leading to a superconducting pair wavefunction that is a linear superposition of Cooper pairs with the same sign. Such a pair wavefunction is called isotropic S-wave. Unfortunately, it is known that the cuprate pair wavefunction changes sign and is of D-wave form (more specifically, of $d_{x2-y2}$ form). See Tc Concept 6 for a resolution to the problem.

Figure 18:
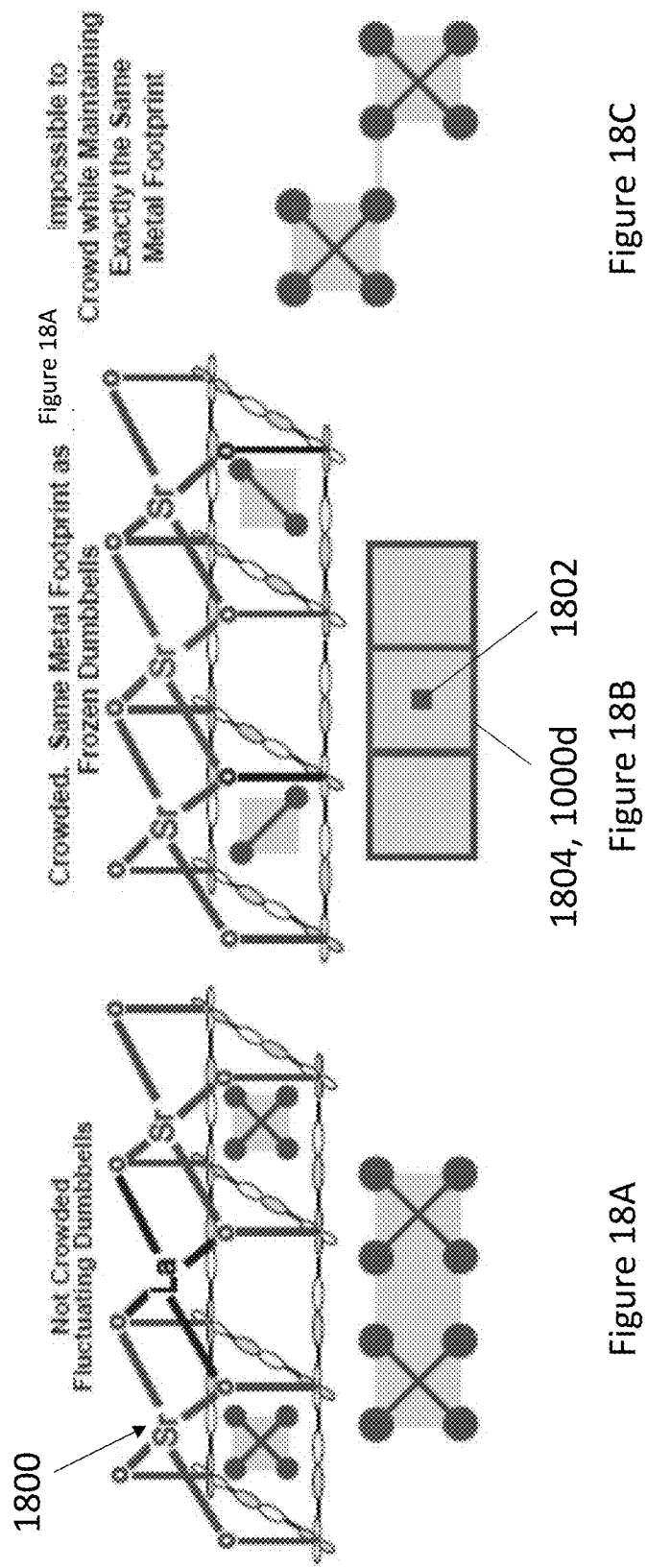
FIG. 18A shows two non-overlapped plaquettes with their fluctuating dumbbells and their metallic region (shaded region, yellow) for the case of Sr dopants in $La_{2-x}Sr_xCuO_4$. The bottom schematic shows the fluctuating dumbbells as crosses and the metallic region in yellow.
FIG. 18B shows that adding Sr dopant between the two plaquettes freezes the two fluctuating dumbbells while maintaining exactly the same metallic footprint. The S-wave Tc increases due to the decrease of the Coulomb pseudopotential while the D-wave Tc remains unchanged. The blue squares in the bottom schematic represent the frozen dumbbells. The added Sr dopant is shown by the red square. However, any atom that breaks the degeneracy of the dumbbell states will work instead. The shaded (yellow) metallic overlay is unchanged from FIG. 18A. The orientation of the frozen dumbbells is arbitrary in the figure because it depends on the environment (not shown).
FIG. 18C shows two adjacent plaquettes that are shifted by one lattice spacing. No plaquette can be added to freeze the dumbbells while maintaining the same metallic footprint.

where $\mu^*_{Fluc}=7$ (the fluctuating dumbbell $\mu^*$), $\mu^*_{BCS}=0.1$ (a typical BCS value), and the cutoff $$F(i\omega_n) = \omega_{Fluc}^2/(\omega_n^2 + \omega_{Fluc}^2)$$

uses $\omega_{Fluc}=60$ meV. The Eliashherg imaginary frequency, $i\omega_n$, is defined in Appendix G. In order to achieve 100% frozen dumbbells, "domino" doping as shown in FIGS. 18a and b was used. We set $\delta\varepsilon = \delta t = 0.30, 0.30, 0.15$ eV for Edge, Convex, and Concave orbital and hopping energies, respectively. See the definitions in FIG. 12. We used a larger than FIG. 16 and the computational methods section because $\delta\varepsilon$ should be greater than $\delta t$ due to its proximity to the planar O atom. Since the D-wave Tc is weakly dependent on $\delta\varepsilon$, our choices in FIG. 16 were very conservative. The S-wave Tc values for 100% frozen dumbbells for the black, magenta, and red curves in FIG. 16 at optimal doping are 280.1 K, 164.4 K, and 99.0 K, respectively. The corresponding D-wave Tc values are 92.2 K, 38.5 K, and 27.7 K. Hence, the S-wave Tc is in the range of ≈280-390 K.

Figure 20:
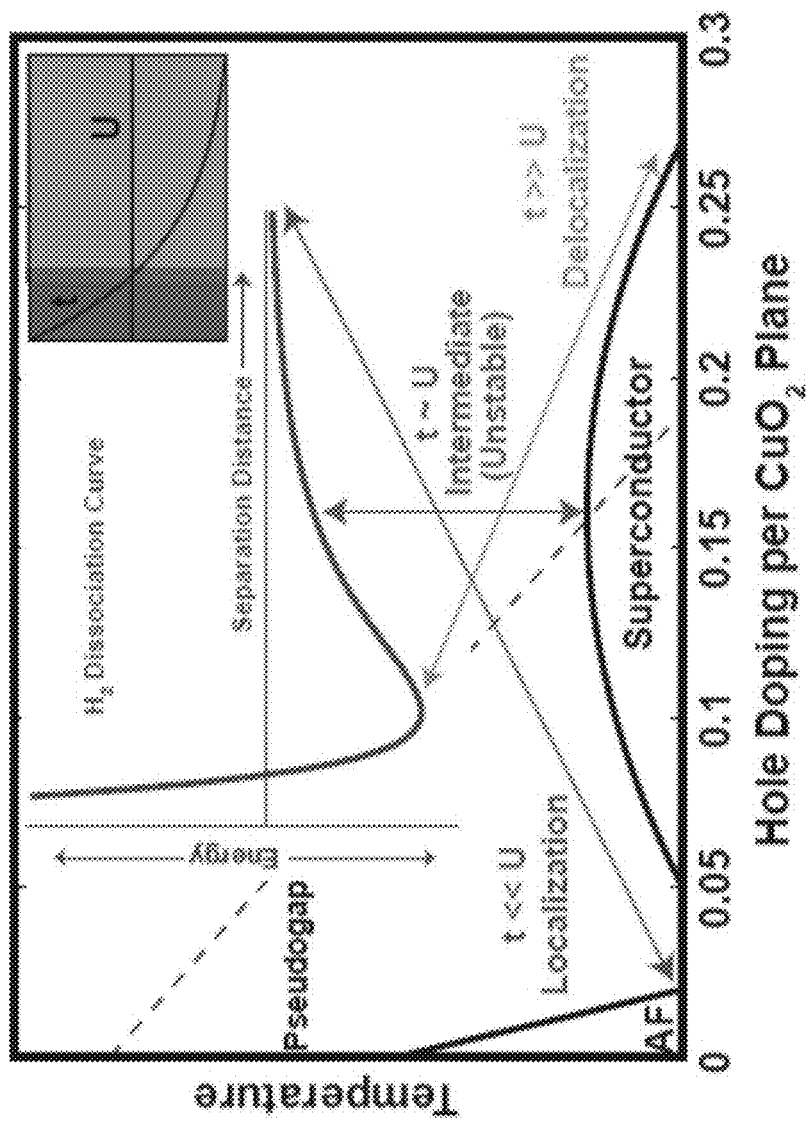

FIG. 20. The iconic $H_2$ dissociation curve in chemistry (inset) and the iconic cuprate phase diagram (larger black figure). Both figures show the regimes of delocalized, intermediate, and localized electronic states. For $H_2$, electron delocalization occurs near the equilibrium bond distance of 0.74 Angstroms where the effective hopping, t, is larger than the effective Coulomb repulsion, U, of the electrons (see inset in upper right corner). Molecules do not exist at the intermediate (magenta) region since the potential is not a local minimum. Similarly, semiconductors can be classified into delocalized (covalent) and localized (ionic) with a sharp transition in-between based upon their Fermi level stabilization at a semiconductor-metal interface [43]. In cuprates, the intermediate regime is where the optimal superconducting Tc occurs. In analogy to molecules and semiconductors, the present disclosure believes that cuprates are unstable here, and thereby "phase separate" into delocalized metallic and insulating magnetic AF regions. Finally, we intentionally avoided using the terms "weak correlation" and "strong correlation" in the figure. The word correlation means different things to different scientists. For chemists, the delocalized region (t>>U) is "weak electron correlation," and the localized region (t<<U) is "strong electron correlation." For physicists, cuprates are considered a "strong correlation" problem.

FIGS. 21A-21F. "Crowded" crossed wires that have high Tc and Jc. The crossed metallic wires are one plaquette in width. The symbols in the metallic wires are defined in FIGS. 18 and 19, with one change solely for clarity. Here, the added dopant (solid (red) square) that overlaps two plaquettes (larger blue squares with darker outline) does not have a red square boundary. The black circles are undoped AF Cu spins. FIGS. 21-21C show crossed wires with 4×4, 2×4, and 2×2 AF spins, respectively, inside each interior region formed by the perpendicular wires on 20×20 $CuO_2$ lattices. FIGS. 21D-21F show the corresponding lattices that are randomly doped to approximately the same fraction of metallic unit cells as the crossed wires in FIGS. 21A-21C (x=0.14, 0.17, and 0.19). The Tc for each wire configuration is approximately equal to the S-wave Tc for an optimally doped system since the ratio of the surface metal cells to the total metal cells is 68%, 75%, and 80% for FIGS. 21A, 21B, and 21C, respectively. The ratio is ≈91% at random optimal doping. The Tc's of FIGS. 21A, 21B, and 21C are approximately 12%, 8%, and 6% less than the S-wave Tc at optimal doping. The Jc for FIG. 21A is (½)Jc,max, where Jc,max is the theoretical maximum of ~2×10$^7$ A/cm$^2$ for $YBa_2Cu_3O_{7-\delta}$. In FIG. 21B, Jc=(⅓)Jc,max and (½)Jc,max for currents along the x and y-axes, respectively. For FIG. 21C, Jc=(⅓) Jc,max. Random optimal doping leads to Jc~10$^{-2}$Jc,max (see FIG. 4).

Figure 22B:
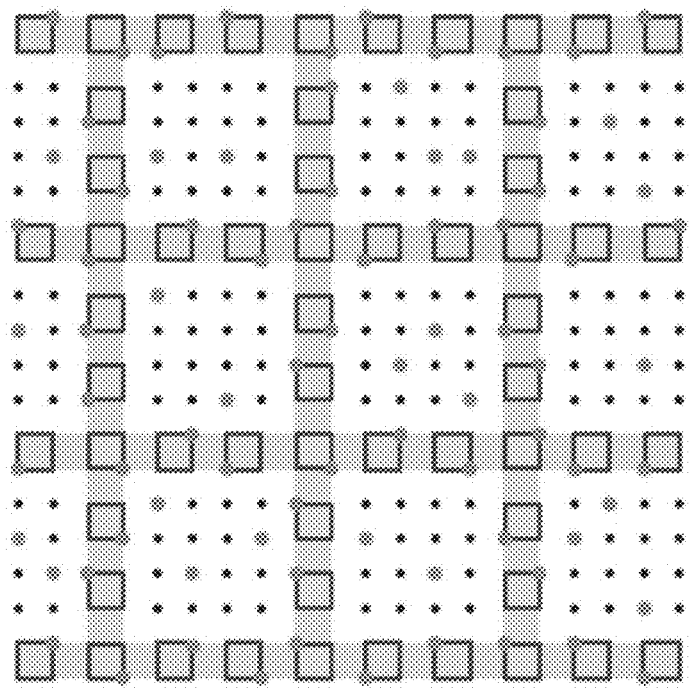
Figure 22A:
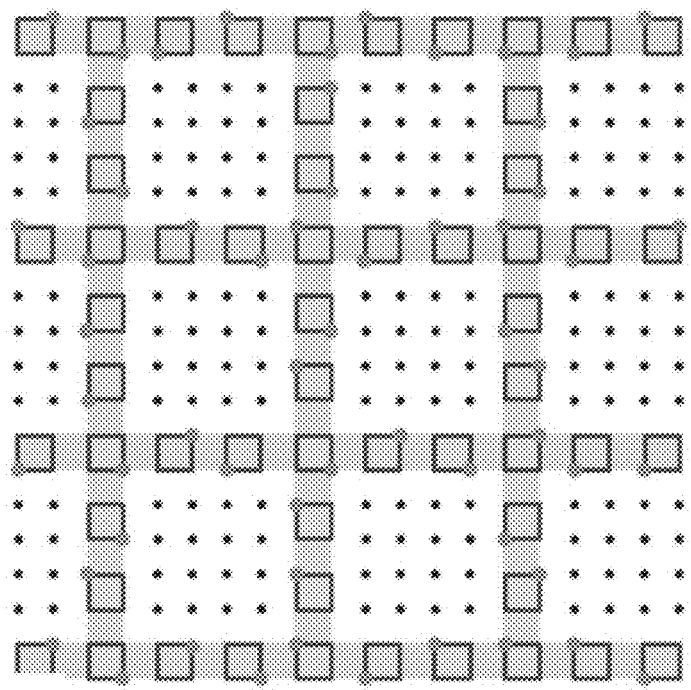

FIGS. 22A-22B. Atomic substitution inside non-overlapping plaquettes can freeze dumbbells by breaking the dumbbell degeneracy inside the plaquette. FIGS. 22A-22B show 20×20 $CuO_2$ lattices with 4×4 AF interiors and crossing metallic wires one plaquette in width. In FIG. 22A, the solid (green) dots/circles show random atomic substitutions or interstitial atoms inside the plaquettes. The atomic substitutions may occur at the Cu atom in the plaquette (shown here), the O atoms inside the $CuO_2$ plaquette, or the apical O atom sites. The O atoms are not shown in the figure. In FIG. 22B, solid (green) dots/circles representing atomic substitutions or interstitial atoms in the insulating AF region are also shown. So long as these solid (green) dots circles do not disrupt the insulating behavior of these regions, the superconductivity will not be disturbed. FIG. 22B may be easier to engineer than FIG. 22A because the solid (green) dots/circles are dispersed more randomly.

Figure 23:
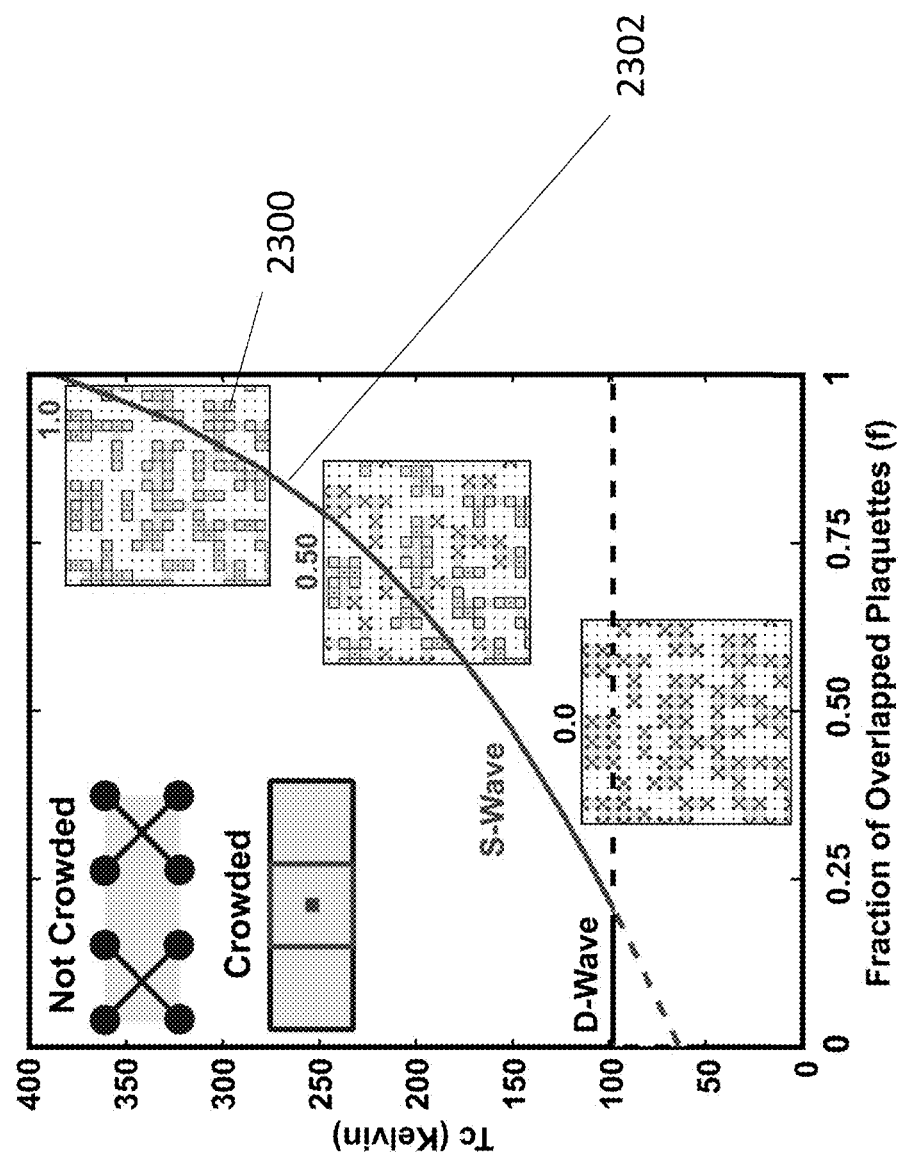

FIG. 23. Plot of Tc as a function of number of overlapped plaquettes.

Figure 24:
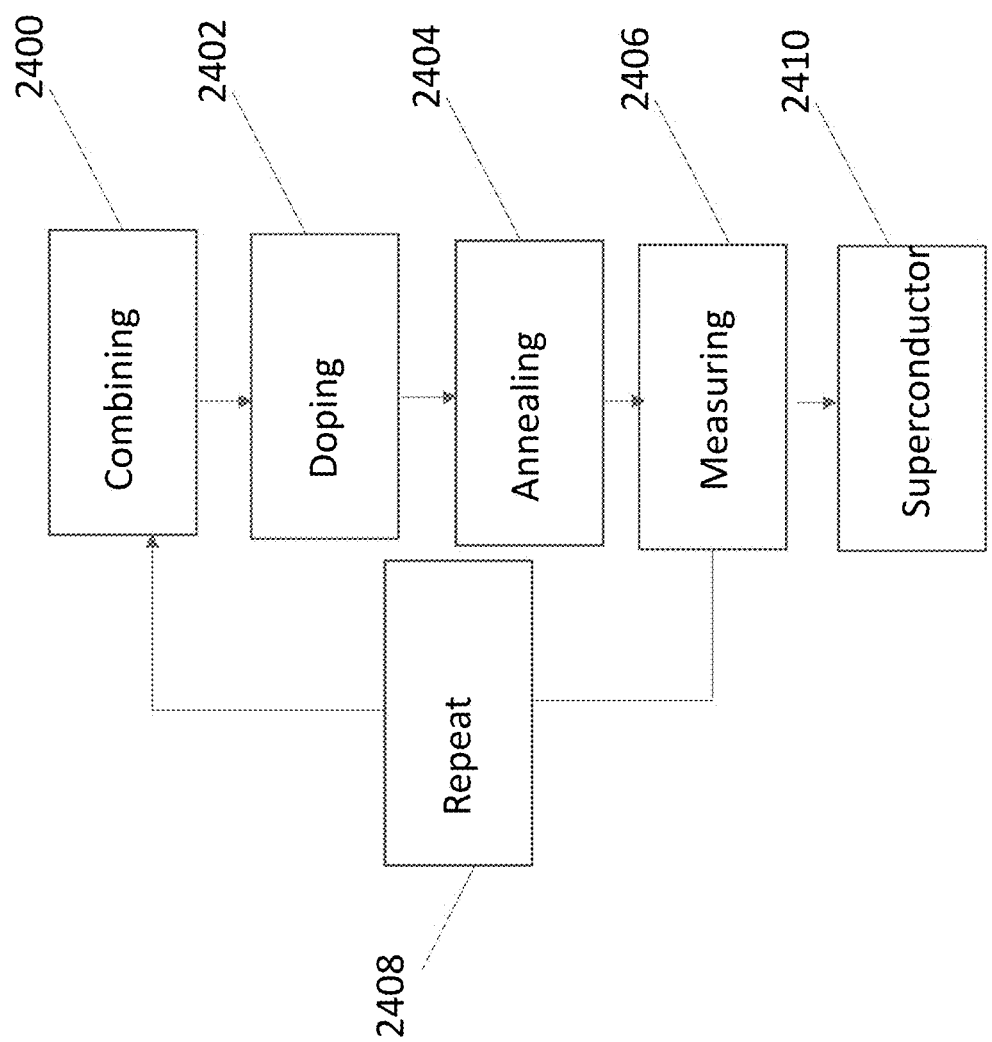

FIG. 24. Flowchart illustrating a method of fabricating superconducting materials.

Figure 25:
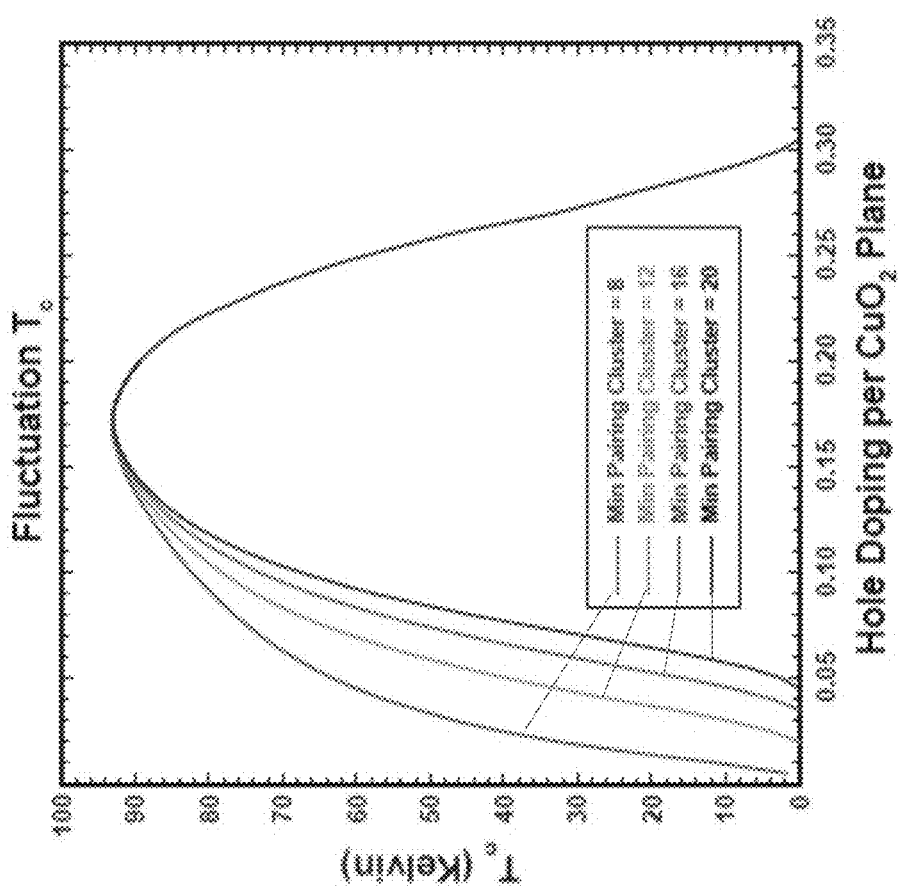

FIG. 25. The change in the Tc-dome as a function of the minimum plaquette cluster size for superconducting pairing. The black curve is identical to the black Tc curve in FIG. 16. All parameters are described in the computational methods section.

Figures 12A, 12B:
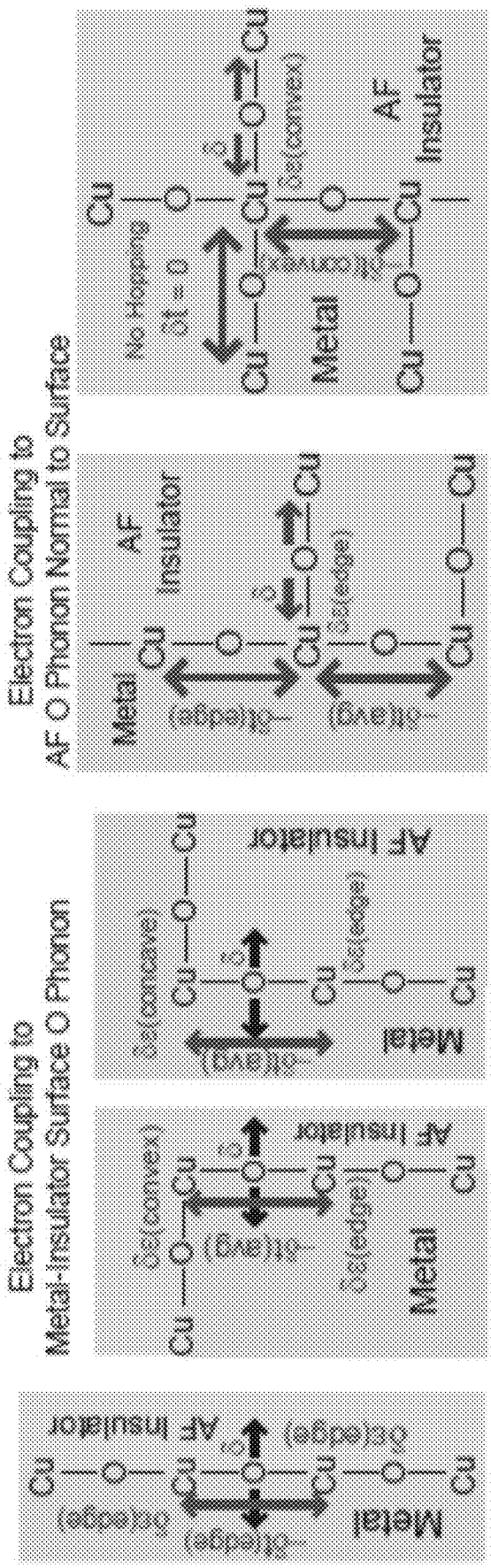
FIG. 12A shows the planar O atom phonon mode at the metal-insulator interface. Its displacement is planar and normal to the Cu—O—Cu along the metal-insulator interface. Displacement by δ leads to changes to the neighboring interface Cu $d_{x2-y2}$ orbital energy by δε (δε>0). There are three kinds of Cu atoms, edge, convex, and concave. Similarly, there is a change in the Cu to Cu hopping matrix element −δt (δt>0). We choose δt to equal the average of the δt at each Cu.
FIG. 12B shows the planar O atom phonon mode in the insulating region adjacent to the metal-insulator interface. The displacement is planar and normal to the metal-insulator interface. The δε and δt are defined in the same way as in FIG. 12A. There is a δε for the metallic Cu closest to the O atom and two −δt for hopping to neighboring metallic Cu sites. The metallic screening of the O atom charge is not strong because it resides in the insulating AF region. Hence, the two δt are large. As illustrated herein, the vibrational energy of these two phonon modes is set to 60 meV. [18] See Table III.
Figure 26:
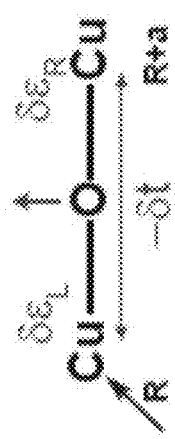

FIG. 26. A surface O atom phonon mode. The change in Cu orbital energy for the Cu atom, $\delta\varepsilon_L$ for the left Cu atom, and $\delta\varepsilon_R$, for the right Cu atom due to the displacement of the surface O atom on the metal-insulator interface. $-\delta t$ is the change in the hopping energy. The position of the left Cu atom is at R and the right Cu atom is at R+a. $\delta \varepsilon_L$, $\delta \varepsilon_R$, and $\delta t$ are functions of R as seen in FIG. 12A. We choose the energy of all the surface phonon modes to be the same and equal to $\omega_{ph}$.

Figure 27:
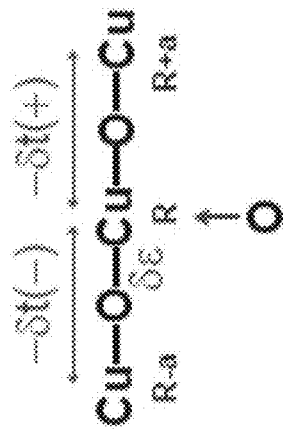

FIG. 27. The Perpendicular O atom phonon mode. The O atom is in the insulating AF region. The chain Cu—O—Cu—O—Cu is on the metal-insulator surface. The change in Cu orbital energy for the central Cu atom located at position R is $\delta \varepsilon$. $\delta \delta t(-)$ is the change in the hopping between the Cu site at R−a and R. $-\delta t(+)$ is the change in the hopping between the Cu site at R+a and R. $\delta \varepsilon$, $\delta t(-)$, and $\delta t(+)$ are functions of position R as seen in FIG. 27. We choose the energy of all the perpendicular surface phonon modes to be the same and equal to $\omega_{ph}$. In this figure, the displaced O atom is on the y-axis while the Cu—O—Cu—O—Cu chain is along the x-axis. We choose the convention of labeling the phonon mode by the axis of the AF O atom. Hence, this figure is a y-axis O phonon mode.

DETAILED DESCRIPTION OF THE INVENTION

In the following description of the preferred embodiment, reference is made to the accompanying drawings, which form a part hereof, and in which is shown by way of illustration a specific embodiment in which the invention may be practiced. It is to be understood that other embodiments may be utilized and structural changes may be made without departing from the scope of the present invention.

Technical Description

The present disclosure describes a new composition of matter useful as high temperature superconductors. The compositions are fabricated from a wide range of materials including, but not limited to, cuprate superconductors.

1. First Example: Cuprate Superconductors

The highest superconducting transition temperature, Tc, at ambient pressure is 138 K in the Mercury cuprate $HgBa_2Ca_2Cu_3O_{8-\delta}$ (Hg1223 was discovered in 1993) with three $CuO_2$ layers per unit cell [1,2]. The longest time period between record setting Tc discoveries is the 17 years between Pb (1913 with Tc=7.2 K) to Nb (1930 with Tc=9.2 K). With the enormous increase in focus on superconductivity after the discovery of cuprates 30 years ago, the current 24 years without a new record at ambient pressure indicates we may be reaching the maximum attainable Tc.

The present disclosure shows this conclusion to be wrong, demonstrating that Tc can be raised above room-temperature to ≈400K in cuprates by precise control of the spatial separation of dopants. Hence, there still remains substantial "latent" Tc in cuprates. However, the proposed doping strategy and superconducting mechanism is not restricted to cuprates and may be exploited in other materials.

The room-temperature Tc result described herein is based upon four observations:

(1) Cuprates are intrinsically inhomogeneous on the atomic-scale and are comprised of insulating and metallic regions. The metallic region is formed by doping the material.

(2) A diverse set of normal state properties are explained solely from the topological properties of these two regions and their doping evolution.

(3) Superconductivity results from phonons at or adjacent to the interface between the metallic and insulating regions. Transition temperatures Tc~100 K are possible because the electron-phonon coupling is of longer-range than metals (nearest neighbor coupling).

(4) These interface phonons explain the observed superconducting properties and lead to our prediction of room-temperature superconductivity.

Research and funding invested into finding the mechanism for cuprate superconductivity and higher Tc materials has led to more than 200,000 refereed papers [3]. After this mind-boggling quantity of literature, it would be unlikely that any unturned stones remain that could lead to the room temperature superconductivity properties described herein.

However, as illustrated herein, the majority of the cuprate community settled upon the incorrect orbital nature of the doped hole. This mistake led to Hamiltonians (Hubbard models) that overlook significant features.

A major reason for the early adoption of these Hubbard models for cuprates was due to computational results using the ab initio local density approximation (LDA) in density functional theory (DFT). While LDA is now deprecated, being replaced by the Perdew-Burke-Emzerhof functional [4] (PBE), both functionals lead to exactly the same doped hole wavefunction in cuprates. These "physicist" functionals find the doped hole to be a de-localized wavefunction comprised of orbitals residing in the $CuO_2$ planes common to all cuprates [5-7]. Unfortunately, LDA and PBE both contain unphysical Coulomb repulsion of an electron with itself [8]. The "chemist" hybrid density functionals, invented in 1993 (seven years after the discovery of cuprate superconductivity), corrected for this self-Coulomb error, and thereby found the doped hole residing in a localized wavefunction surrounding the dopant atom with orbital character pointing out of the $CuO_2$ planes [9,10].

A. Electronic Structure

Figures 1A, 1B:
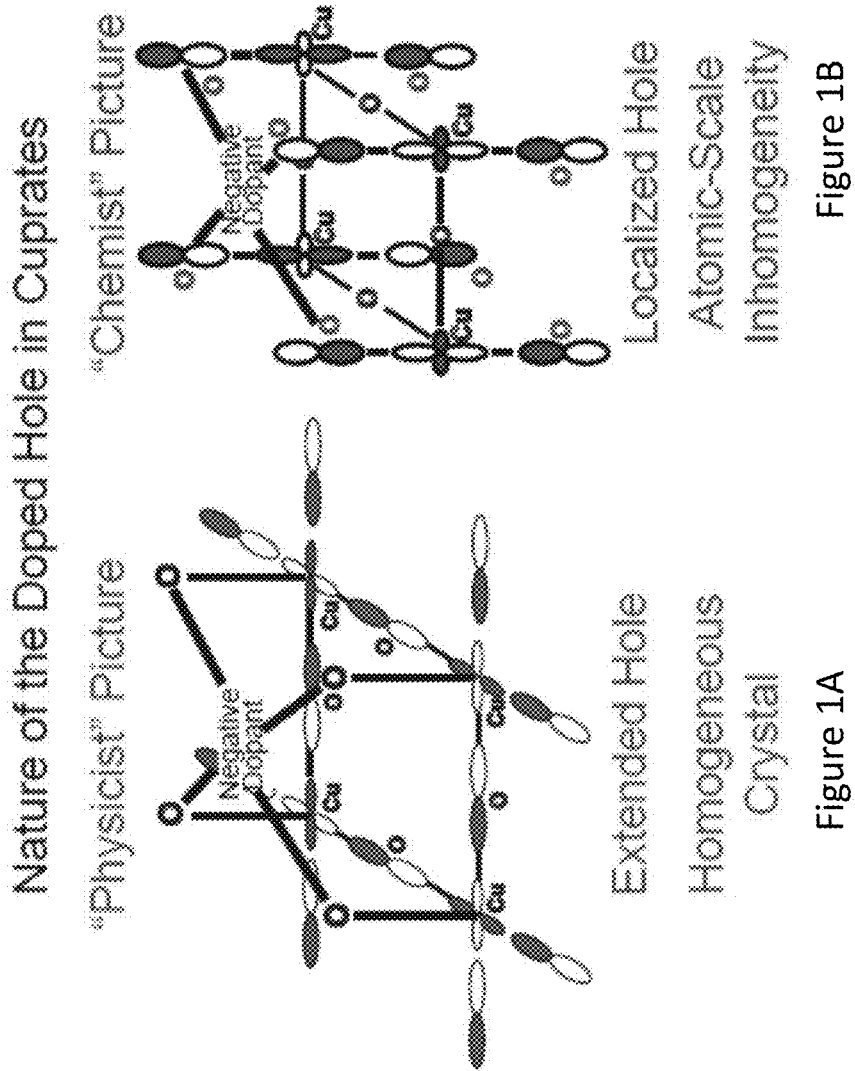
FIG. 1A and FIG. 1B illustrate the difference in the character of the doped hole using the "physicist's" density functionals, LDA and PBE.

FIG. 1A illustrates the nature of doped holes using the "physicist's" picture and FIG. 1B illustrates the nature of doped holes using the "chemist's" picture. As described herein, the "chemist's" ab initio doped hole picture leads to eight electronic structure concepts that explain a vast array of normal and superconducting state phenomenology using simple counting. These eight structural concepts are described below.

1. Structural Concept 1: Cuprates are inhomogeneous on an atomic-scale. The inhomogeneity is not a small perturbation to translational symmetry. It must be included at zeroth order.

Figure 2:
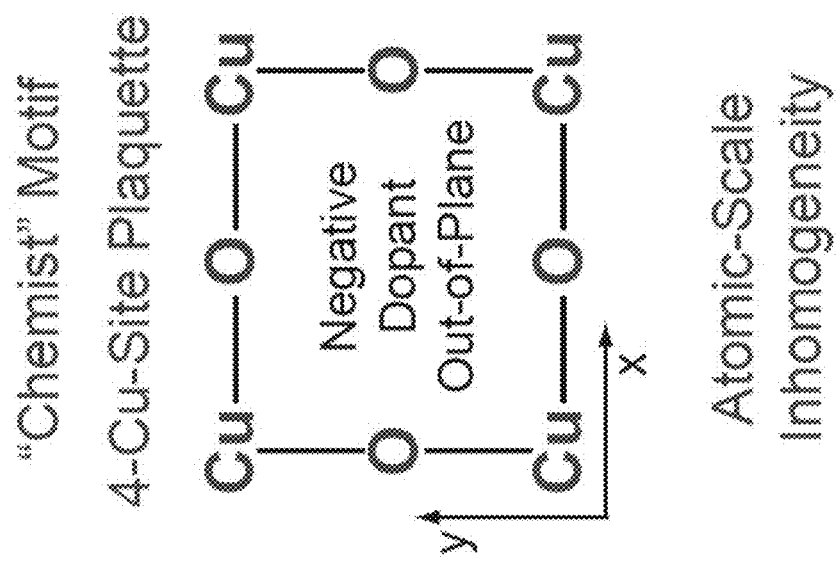
FIG. 2. The doped four-Cu-site plaquette "motif."

2. Structural Concept 2: The cuprate motif is a four-Cu-site plaquette formed by each dopant, as shown in FIG. 2. The out-of-the-$CuO_2$ plane negative dopant is surrounded by an out-of-the-$CuO_2$ plane hole. The hole is comprised of apical Oxygen $p_z$ and planar Cu $d_{3z^2-r^2}$ character. There is also some planar O $p\sigma$ character that is not drawn.

3. Structural Concept 3: A tiny piece of metal is formed within each plaquette from electron delocalization in the planar Cu $d_{x^2-y^2}$ and O $p\sigma$ ($p_x$ and $p_y$) orbitals, as shown in FIG. 3C. Delocalization occurs because the positive charge of the out-of-plane hole lowers the Cu $d_{x^2-y^2}$ orbital energy relative to the O $p_o$ orbital energy. In contrast, these electrons are localized in a spin-½ anti ferromagnetic (AF) state in an undoped plaquette.

Figure 4:
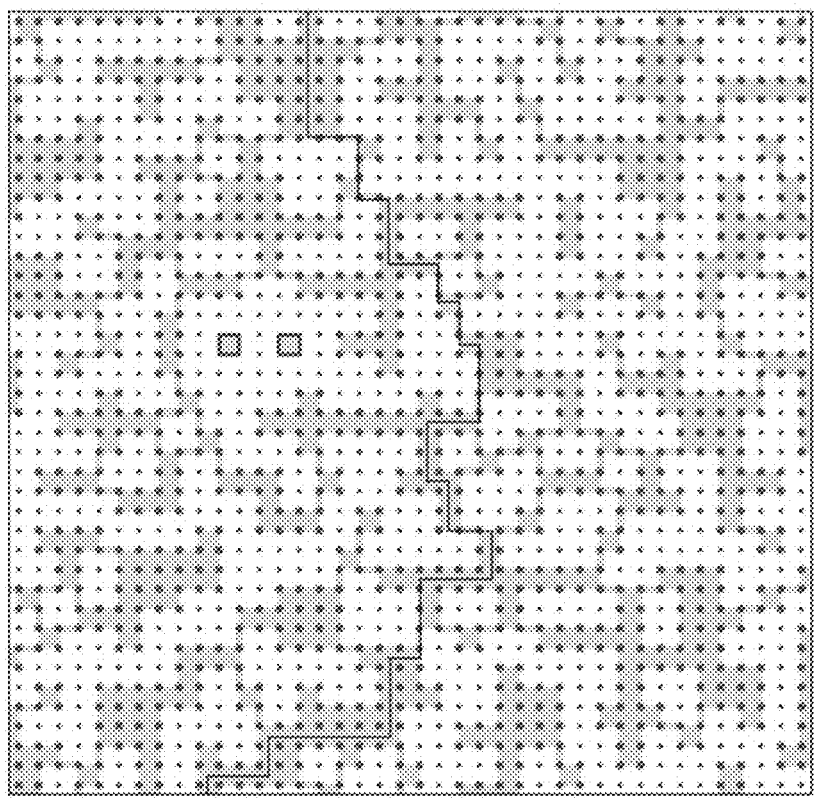
FIG. 4 illustrates a 2D percolating pathway in an optimally doped $CuO_2$ plane (x=0.16 dopants per planar Cu). The black line shows a pathway from the left to the right side of this 40×40 $CuO_2$ lattice. The localized antiferromagnetie (AF) spins on the Cu sites are shown as black dots in the white region. The blue dots are Cu sites inside the doped metallic region. The O atoms are not shown. The yellow overlay represents the delocalized metallic band comprised of planar orbitals inside the doped region. The blue squares represent isolated plaquettes (not adjacent to another plaquette). There is a degeneracy at the Fermi level inside each isolated plaquette that is split by its interaction with the crystal environment, and thereby leads to the pseudogap [11]. The number of isolated plaquettes "vanish" (become of measure zero) at hole doping x≈0.19 where the cuprate pseudogap is known to disappear [11]. The tenuous percolating pathway has poor critical current.
Figures 6A, 6B, 6C, 6D:
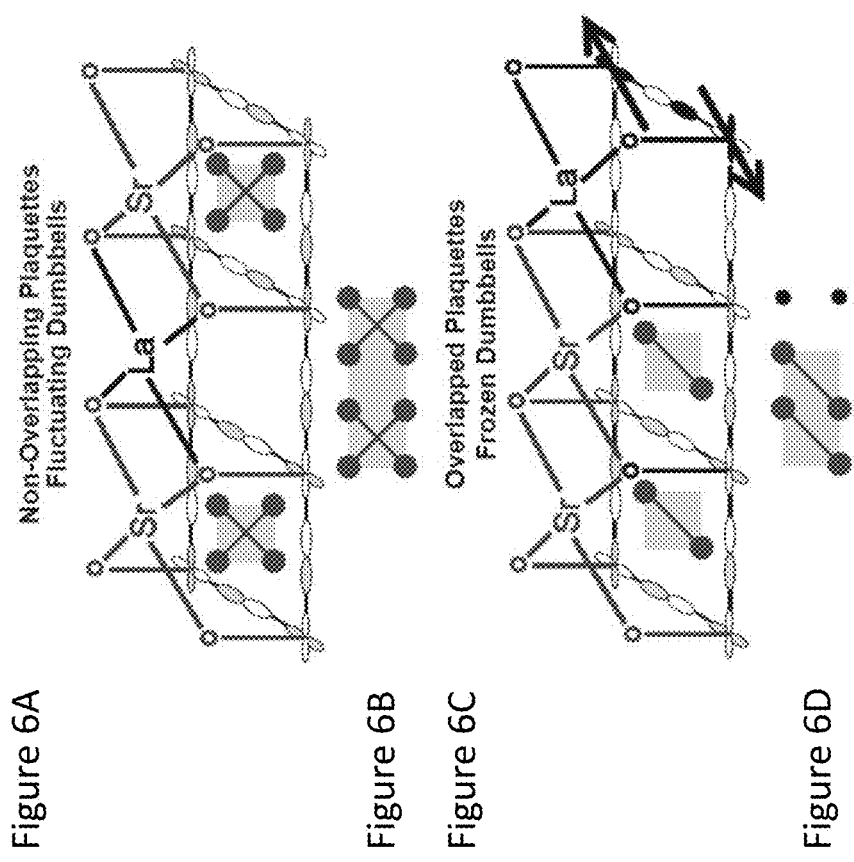
FIGS. 6A-6D illustrate the effect of overlapping plaquettes on the fluctuating dumbbells for the case of Sr doping of $La_{2-x}Sr_xCuO_4$.

4. Structural Concept 4: A metal is formed when the doped plaquettes percolate through the crystal. When a three-dimensional (3D) pathway of adjacent doped plaquettes is created through the crystal (percolation of the plaquettes), a metallic band comprised of planar Cu $d_{x^2-y^2}$ and O $p_o$ orbitals is created inside the percolating region. These delocalized metallic wavefunctions do not have momentum, k, as a good quantum number. Two-dimensional (2D) percolation occurs at a higher doping ($x \approx 0.15$ holes per planar Cu) than the start of 3D percolation (at $x \approx 0.05$ holes per planar Cu), as shown in FIG. 4. The undoped (non-metallic) region remains an insulating spin-½ AF. Thus, cuprates have both insulating and metallic regions on an atomic-scale.

5. Structural Concept 5: The out-of-the-$CuO_2$ plane hole shown in FIG. 1 and FIG. 2 is a dynamic Jahn-Teller distortion that is a linear superposition of two "frozen dumbbell" states, as shown in FIGS. 5A-5C. The dynamic Jahn-Teller hole state is called a "fluctuating dumbbell."

6. Structural Concept 6: A fluctuating dumbbell can be frozen by overlapping its plaquette with another plaquette, as shown in FIGS. 6A-6D.

Figure 7:
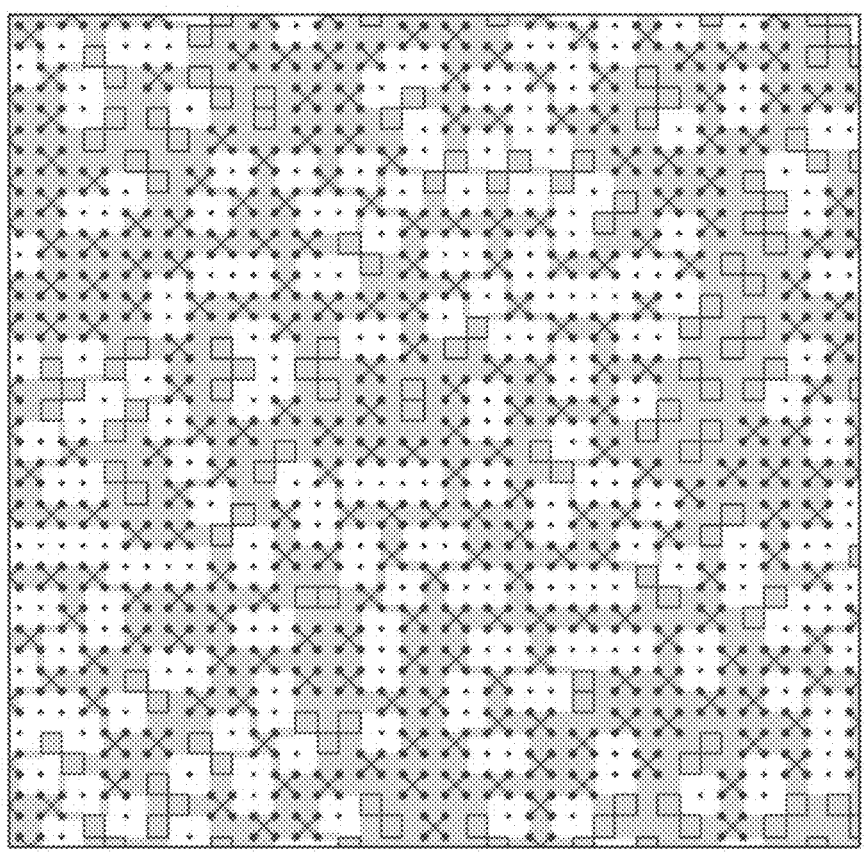
FIG. 7. Plaquette doping at x=0.23 on a 40×40 $CuO_2$ lattice. The black dots are undoped AF Cu sites. The O atoms are not shown. The shaded (yellow) overlay represents the delocalized metal comprised of planar Cu $d_{x2-y2}$ and planar O $p\sigma$ character. Fluctuating dumbbells (crosses) are seen in non-overlapped plaquettes. The overlapped plaquettes are shown as squares (square outline, blue). There are frozen dumbbells inside each shaded square. The frozen dumbbells are not shown in the figure.

7. Structural Concept 7: If possible, plaquettes avoid overlapping. Since the dopant atom is negatively charged, two plaquettes repel each other. Their Coulomb repulsion is short-ranged because of screening from the planar metallic electrons. Hence, plaquettes do not overlap, but are otherwise distributed randomly. Plaquettes can avoid overlap up to a hole doping of $x=0.187$. For dopings greater than $x=0.187$, plaquettes must overlap, but as little as possible in order to minimize their mutual repulsion. Up to $x=0.1.87$ doping, there always exists a four-site square of AF spins where the next plaquette can be placed. For the doping range $0.187<x<0.226$, added plaquettes can cover three AF spins. In the range $0.226<x<0.271$, plaquettes cover two AF spins, and from $0.271<x<0.316$, a single localized spin. At $x=0.316$, the crystal is fully metallic with no localized spins. Further doping cannot increase the number of metallic sites. FIG. 4 shows that plaquettes can avoid overlap at $x=0.16$ doping. FIG. 7 shows $x=0.23$ doping, where plaquettes must overlap.

Figure 8:
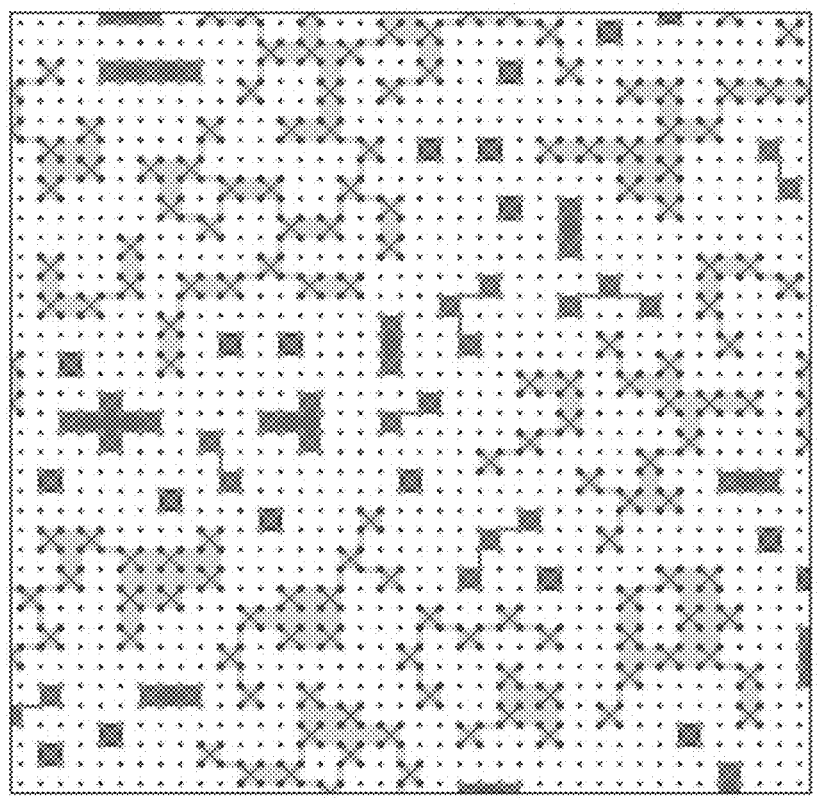
FIG. 8. Plaquette doping of x=0.12 on a 40×40 $CuO_2$ lattice. The black dots are undoped AF Cu sites. No O atoms are shown. The squares are isolated plaquettes (no neighboring plaquette). The shaded (yellow) overlay represents the metallic region comprised of planar Cu $d_{x2-y2}$ and planar O $p\sigma$ character. Fluctuating dumbbells (crosses) are seen in non-overlapped plaquettes. The darker shaded (magenta) clusters are smaller than the Cooper pair coherence length and do not contribute to superconducting pairing. Since the size of a single plaquette (the Cu—Cu distance) is ≈3.8 Angstroms and the superconducting coherence length is ~2 nm, we have chosen plaquette clusters fewer than or equal to 4 plaquettes in size to be fluctuating. The darker shaded (magenta) overlay means there is metallic delocalization of the planar Cu and O orbitals in these clusters. The isolated plaquettes do not contribute to the superconducting pairing and the superconducting fluctuations above Tc because they contribute to the pseudogap.
Figure 9A:
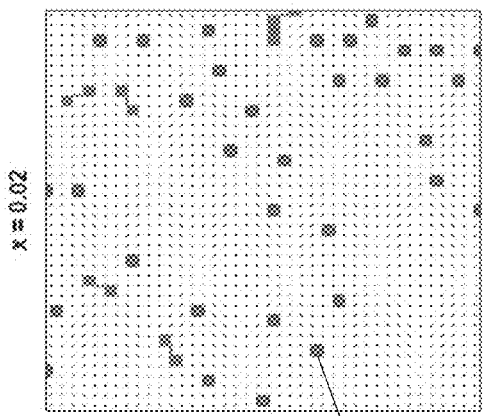
FIGS. 9A-9D. Plaquette doping of a 40×40 square $CuO_2$ lattice for dopings x=0.00 (FIG. 9A), 0.02 (FIG. 9B), 0.05 (FIG. 9C), and 0.10 (FIG. 9D). Only the Cu sites are shown. The black dots are undoped AF Cu sites. The blue outlined squares are isolated plaquettes (no neighboring plaquette). The shaded (yellow) plaquette clusters are larger than 4 plaquettes in size (larger than the coherence length), and thereby contribute to the superconducting pairing. The darker shaded (magenta) clusters are metallic clusters that are smaller than the coherence length. The blue and green crosses are the fluctuating dumbbells. There is no plaquette overlap in this doping range.
Figure 9B:
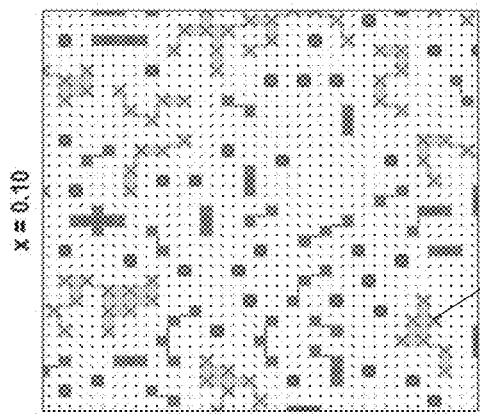
Figure 9C:
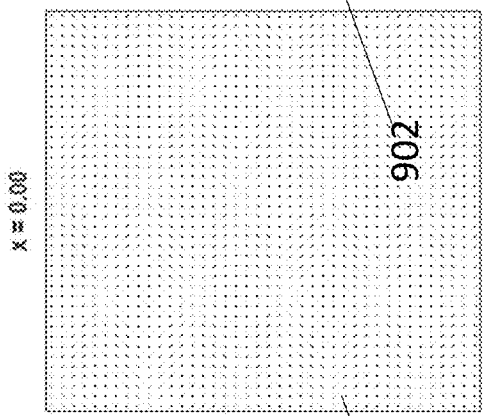
Figure 9D:
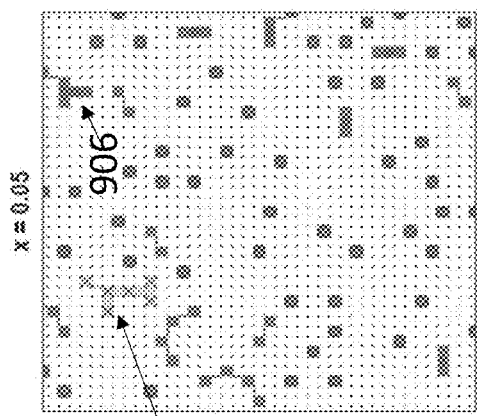
Figure 11A:
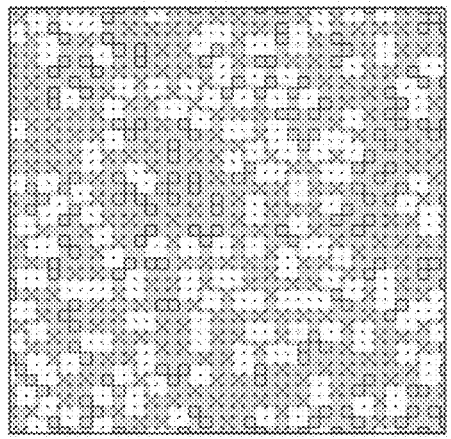
FIGS. 11A-11D. Plaquette doping of a 40×40 square $CuO_2$ lattice for dopings x=0.19 (FIG. 11A), 0.24 (FIG. 11B), 0.27 (FIG. 11C), and 0.32 (FIG. 11D). See the caption of FIG. 9 for an explanation of the symbols in this figure. The first plaquette overlap can be seen at 0.19 doping (blue squares with dark outline). The degeneracy of the two dumbbells states inside each overlapping plaquette has been broken. A frozen dumbbell configuration exists inside each overlapped plaquette. It is not drawn. At 0.27 doping, only isolated spins remain (black dots). At 0.32 doping, there are no localized spins remaining. The crystal is purely metallic. Only one isolated plaquette (blue square with dark outline and darker shaded (magenta) interior remains at x=0.19 doping. The number of isolated plaquettes never vanishes entirely. Instead, their number becomes of measure zero above x≈0.19 doping and leads to the vanishing of the pseudogap at x≈0.19. At x=0.32, the critical current density, Jc, will be close to the Cooper pairing depairing limit since the metallic pathways through the crystal are not tenuous. However, there is no interface pairing, leading to Tc=0.
Figure 11B:
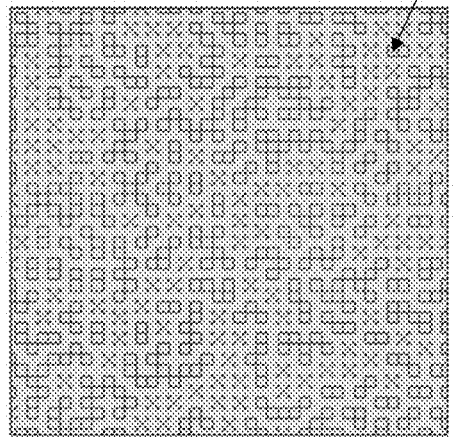
Figure 11C:
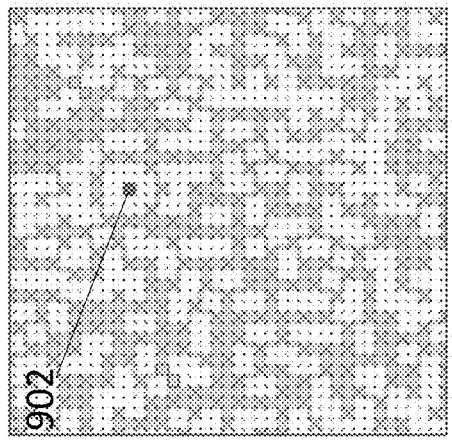
Figure 11D:
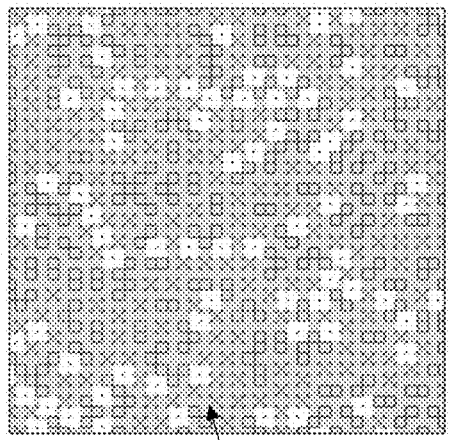

8. Structural Concept 8: Plaquette clusters smaller than the superconducting coherence length (~2 nm) thermally fluctuate and do not contribute to the superconducting pairing. At low dopings, the plaquettes have not yet merged into a single connected region. There exist plaquette clusters smaller than the coherence length, as shown in magenta in FIG. 8. They cannot contribute to the superconducting Tc. These fluctuating clusters lead to superconducting fluctuations above Tc.

FIGS. 9A-9D, 10A-10D, and 11A-11D show the evolution of the plaquettes as a function of doping. In the figures, the black dots 900 are undoped AF Cu sites, the blue outlined squares 902 are isolated plaquettes (no neighboring plaquette), the shaded (yellow) plaquette clusters 904 are larger than 4 plaquettes in size (larger than the superconducting coherence length), and thereby contribute to the superconducting pairing, and the darker shaded (magenta) clusters 906 are metallic clusters that are smaller than the coherence length. The blue and green crosses 908 are the fluctuating dumbbells. Squares 910 are overlapping plaquettes.

Only twelve dopings are shown here from the range $x=0.00$ to $x=0.32$. The Appendix in the provisional application 62/458,740 has similar figures for all dopings in this range in 0.01 increments (FIGS. S0-S32). Only one $CuO_2$ plane is shown in each of these figures.

B. Experimental Confirmation of the Electronic Structure Picture

The above identified eight electronic structural concepts explain a diverse set of normal state caprate phenomenology as a function of doping by simple counting arguments [11-14]. These include the following results.

1. The low and high-temperature normal state resistivity by counting the number of overlapped plaquettes and the size of the metallic region [12,13].
2. For $La_{2-x}Sr_xCuO_4$, the fluctuating dumbbells in adjacent $CuO_2$ layers become decorrelated above ~1 K. Phonon modes with character predominantly inside these plaquettes become 2D, leading to the low-temperature linear resistivity term. For the double-chain cuprate, $YBa_2Cu_4O_8$, if the fluctuating dumbbells between adjacent $CuO_2$ layers are correlated, then these phonons remain 3D, leading to a low-temperature resistivity that is quadratic in temperature, as observed [15].
3. The pseudogap and its vanishing at $x \approx 0.19$ doping from counting isolated plaquettes (not adjacent to another doped plaquette in the same $CuO_2$ plane) and their spatial distribution [11,12].
4. As discussed in Appendix B of the provisional application 62/458,740, there is a degeneracy near the Fermi level of the planar states inside an isolated plaquette. The degeneracy is broken by interaction with the environment. A nearby isolated plaquette strongly splits the degeneracy and leads to the pseudogap.
5. The "universal" room-temperature thermopower by counting the sizes of the insulating AF and metallic regions and taking the weighted average of the thermopower of each region [12,14]. Since the room-temperature thermopower of the AF region is ~100 μV/K and the metallic region thermopower is ~−10 μV/K, there is a rapid decrease in the thermopower as the size of the metallic region increases with doping.
6. The STM doping incommensurability by counting the size of the metallic regions [12,14].
7. The energy of the ($\pi$, $\pi$) neutron spin scattering resonance peak by counting the size of the AF regions [12,14]. The resonance peak arises from the finite spin correlation length of the AF regions.

Explanation of Superconducting Tc

Figure 19:
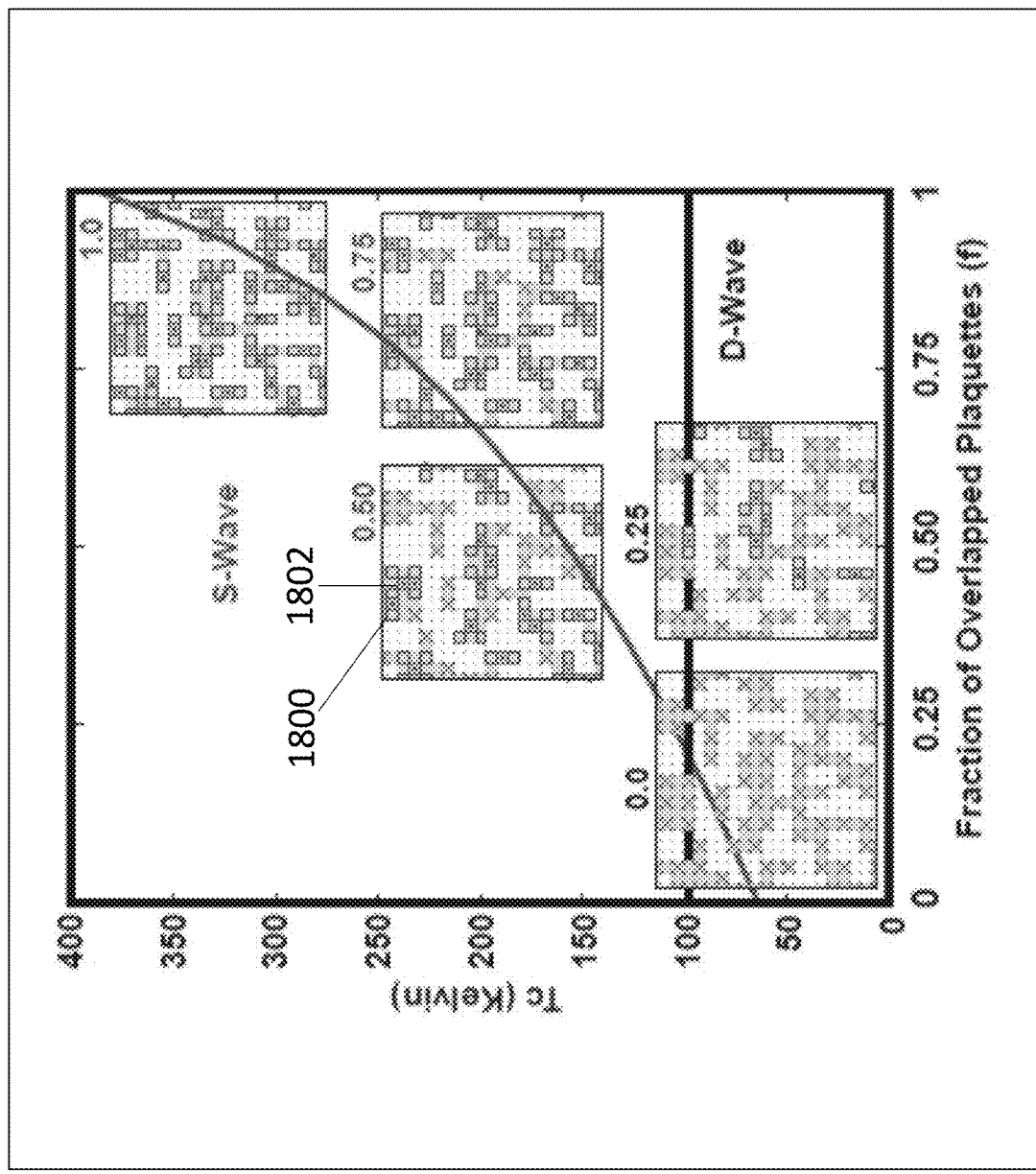
FIG. 19. The S-wave and D-wave Tc's as a function of overlapped plaquette fraction, f. The insets show the evolution of the frozen dumbbells (blue and red squares) for optimal doping of x=0.16. The metallic footprint is unchanged. The D-wave Tc is constant (the Coulomb pseudopotential, $\mu^*$, has no effect). The maximum S-wave Tc is 387.2 K and the D-wave Tc is 98.0 K. We assume $\mu^*$ varies linearly with $$f, \mu^*(f, i\omega_n) = \mu^*_{Fluc}F(i\omega_n)(1-f) + \mu^*_{BCS},$$

The present disclosure uses exactly the same doped electronic structure described above to explain the superconducting Tc and its evolution with doping. The Oxygen atom phonon modes at and adjacent to the interface between the insulating and metallic regions lead to superconductivity. The magnitude of the electron-phonon coupling is estimated and the following results are obtained:

1. A large Tc~100 K from phonons (because the range of the electron-phonon coupling near the metal-insulator interface increases from the poor metallic screening);
2. The observed Tc-dome as a function of hole doping (since the total pairing is the product of the size of the metallic region times the interface size);

3. The large Tc changes as a function of the number of $CuO_2$ layers per unit cell (from inter-layer phonon coupling of the interface O atoms plus inhomogeneous hole doping of the layers);
4. The D-wave symmetry of the superconducting Cooper pair wavefunction (also known as the D-wave superconducting gap). In general, an isotropic S-wave superconducting pair wavefunction is energetically favored over a D-wave pair wavefunction for phonon-induced superconductivity. However, the fluctuating dumbbells reduce the S-wave Tc below the D-wave Tc by drastically increasing the Cooper pair electron repulsion.
5. The lack of a superconducting Tc isotope effect at optimal doping (due to the random enharmonic potentials of each pairing O atom);
6. By overlapping plaquettes, the fluctuating dumbbells become frozen and the S-wave pair wavefunction Tc rises above the D-wave Tc, as shown in FIG. 19. FIG. 19 shows that, while maintaining the same metallic "footprint" of optimal doping (x=0.16), completely frozen dumbbells lead to an S-wave Tc of ≈400 K when the D-wave Tc=100 K.

C. Superconducting Transition Temperatures

All the superconducting transition temperatures described herein are computed using the strong coupling Eliashherg equations [16] as detailed in Appendix G of the provisional application 62/458,740. These equations include the electron "lifetime" effects that substantially decrease Tc from the simple BCS Tc expression.

Figure 13:
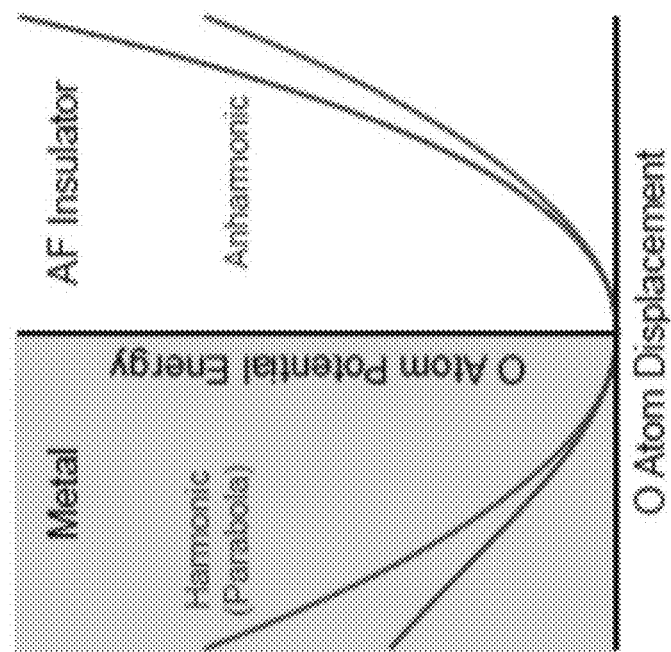
FIG. 13. Anharmonicity of the O atom phonon mode in FIG. 12A due to the difference of the electron screening in the metallic and insulating regions. For FIG. 1213, the shaded (yellow) overlay is shifted to the left.
Figures 14A, 14B:
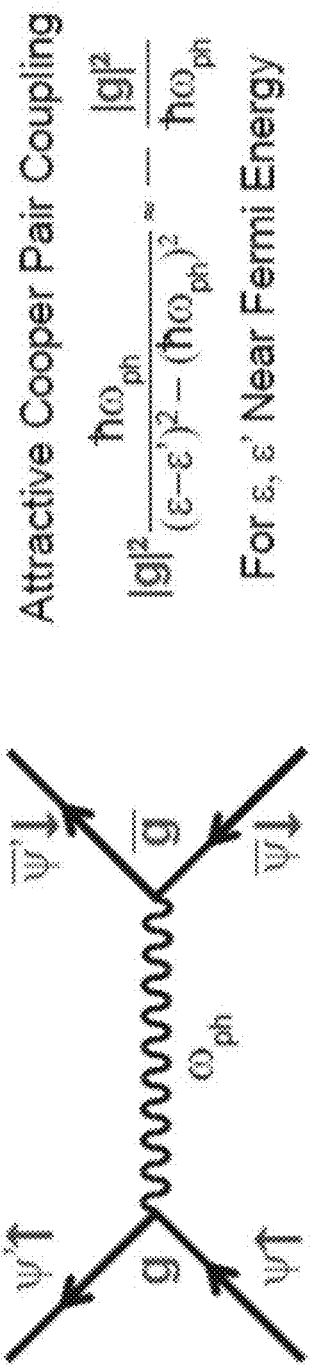
FIGS. 14A and 14B illustrate scattering between Cooper pairs.

These results are shown in the following set of Tc Concepts.
1. Tc Concern 1: FIGS. 12A-12B show there are two planar O atom phonon modes (one at the metal-AF insulator interface and the other adjacent to the interface on the insulating side) that have longer-range electron coupling due to poor electron screening from the metallic region. Hereinafter, the "effective" single band model for the metallic band [17] is used. In this model, the planar O atoms are eliminated. The model has a single effective Cu $d_{x^2-y^2}$ orbital per Cu in the $CuO_2$ plane with an effective hopping to neighboring metallic Cu atoms. The parameters of the band structure are the Cu $d_{x^2-y^2}$ orbital energy and the hopping terms (Table II, Appendix F in the provisional application 62/458,740).
2. Tc Concept 2: The typical magnitude of the electron-phonon coupling matrix element, g, is the geometric mean [16] of the Debye energy, can, and the Fermi energy, $E_F$, or $g=\sqrt{\omega_D E_F}$. The derivation is given in Appendix D in the provisional application 62/458,740. For $0.02$ eV$<\omega_D<0.1$ eV and $E_F=1$ eV, $0.14$ eV$<g<0.32$ eV. All Tc results described herein use electron-phonon coupling parameters in this range.
3. Tc Concept 3: FIG. 13 shows the potential energy of each O atom in FIG. 12A is strongly anharmonic due to the difference of the electron screening in the metallic and insulating regions. In fact, the phonon mode shown in FIG. 12A is anharmonic even without a nearby metal-insulator boundary. The "floppiness" of the bond-bending of a linear chain (here, the planar Cu—O—Cu chain) has been emphasized by Phillips [19] and seen by neutron scattering (the F atom [20] in $ScF_3$ and the Ag atom [21] in $Ag_2O$). However, without the metal-insulator boundary, reflection symmetry would force the electron-phonon coupling for this mode to be zero.
4. To Concept 4: Near optimal doping, x≈0.16, there is no Tc isotope effect. Harmonic potentials have no isotope variation of the superconducting pairing strength because the pairing is inversely proportional to $M\omega^2$ where M is the O atom mass and ω is the angular frequency of the phonon mode. For a derivation of this result, substitute $$g=\sqrt{(\hbar/M\omega)}\nabla V$$

into the pairing coupling in FIG. 14B, where V is the electron potential. Since $M\omega^2=K$, where K is the spring constant, there is no pairing isotope effect. For anharmonic potentials, the phonon pairing strength becomes dependent on the isotope mass [22]. Anharmonic potentials can decrease or increase the Tc isotope effect depending on the details of the anharmonicity [23-25]. Near optimal doping, the metallic and insulating environments for each O atom phonon is random, leading to an average isotope effect of zero, as has been observed [26,27]. The O atom environment becomes less random at lower dopings, as seen in FIGS. 9A-9D. Hence, the isotope effect appears at low dopings [26,27].
5. Tc Concept 5: Cooper pairing from phonons is maximally phase coherent for an isotropic S-wave pair wavefunction because the sign of the pairing matrix element in FIG. 14B is always negative. However, a D-wave pair wavefunction is observed for cuprates. It appears prima facie that phonons cannot be responsible for superconductivity in cuprates. Since Cooper pairs are comprised of two electrons in time-reversed states, the sign of the Cooper pair scattering is always negative and of the form [28,29]

$$\sim(-)|g|^2/\hbar\omega_{ph},$$

where g is the matrix element to emit a phonon and $\hbar\omega_{ph}$ is the energy of the phonon mode (see FIG. 14A, 14B). Hence, the lowest energy superconducting pairing wavefunction is a linear superposition of Cooper pairs with the same sign, called the isotropic "S-wave" state. In theory, the pair Coulomb repulsion, μ, could suppress the S-wave state and lead to a D-wave state because μ cancels out of Tc when performing the angular integral around the D-wave pair wavefunction. However, the electrons in a pair can couple via a phonon while avoiding each other (due to retardation of phonons). The "effective" repulsion, μ*, known as the Morel-Anderson pseudopotential [16,28-32] is too small to raise the D-wave Tc higher than the S-wave Tc. Unless there is a mechanism for drastically increasing μ*, any phonon model for cuprate superconductivity is bound to fail to obtain the correct superconducting pair wavefunction. However, as shown here in Tc concept 6 below, the fluctuating dumbbells in FIG. 5 increase $\mu^*$ to $\mu^*\sim\mu$ leading to a D-wave pairing wavefunction.

Figure 15:
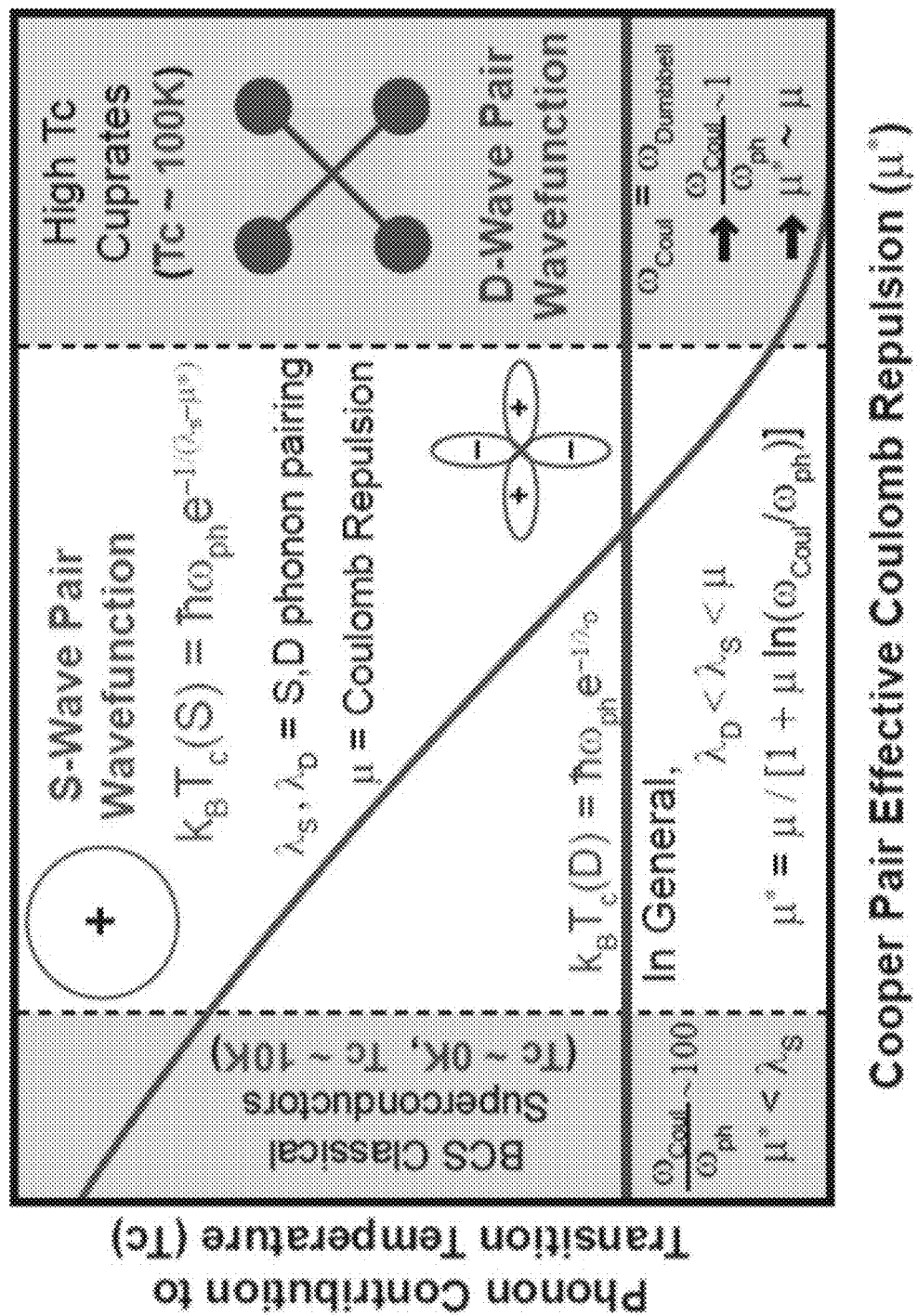
FIG. 15. Evolution of the S-wave and D-wave superconducting pairing wavefunctions as a function of the Coulomb pseudopotential, $\mu^*$. Typically, $\mu^*$ is small, leading to S-wave pairing as seen on the left-side of the figure. The fluctuating dumbbells raise $\mu^*$ to $\mu^* \sim \mu$ by disrupting the metallic electrons from screening the bare Coulomb repulsion, $\mu$. As $\mu^*$ increases, the S-wave Tc decreases while the D-wave Tc remains unchanged as shown in the red and green Tc expressions for S and D-wave, respectively. As $\mu^*$ approaches the "bare" Coulomb repulsion, $\mu$, the D-wave Tc becomes the favored pair symmetry for the superconductor. The right-side of the figure applies to cuprates.

6. Tc Concept 6: FIG. 15 illustrates how the fluctuating dumbbells suppress the S-wave pairing wavefunction and lead to a D-wave pairing wavefunction. The expression for the Morel-Anderson Coulomb pseudo-potential [16,28-32] $\mu^*$ (also shown in FIG. 15) depends on the ratio of the Coulomb and phonon energy scales as $\omega_{Coul}/\omega_{phonon}$. Since this ratio is large, $\mu^*$ is small, leading to an S-wave pair wavefunction rather than the experimentally observed D-wave pair wavefunction [33] (See Table 4 on page 999 of Ref. [33] entitled "summary of phase sensitive tests of cuprate pairing symmetry," wherein the cuprates tests include $Nd_{1.85}Ce_{0.15}CuO_{4-\delta}$ (NCCO) and the Table 4 heading states that all the experiments indicate dominant d-wave pairing). The fluctuating dumbbell frequency, $\omega_{Dumbell}$, is of the same order as $\omega_{phonon}$ because of the dynamic Jahn-Teller distortion of the planar O atoms in FIG. 5. The O atom distortion disrupts the metallic screening of the Coulomb repulsion, and thereby increases $\mu^*$ as shown in FIG. 15. In essence, $\omega_{Dumbell}$ substitutes for $\omega_{Coul}$ in the expression for $\mu^*$. When $\mu^*\sim\mu$, a D-wave pair wavefunction is formed.

Figure 16:
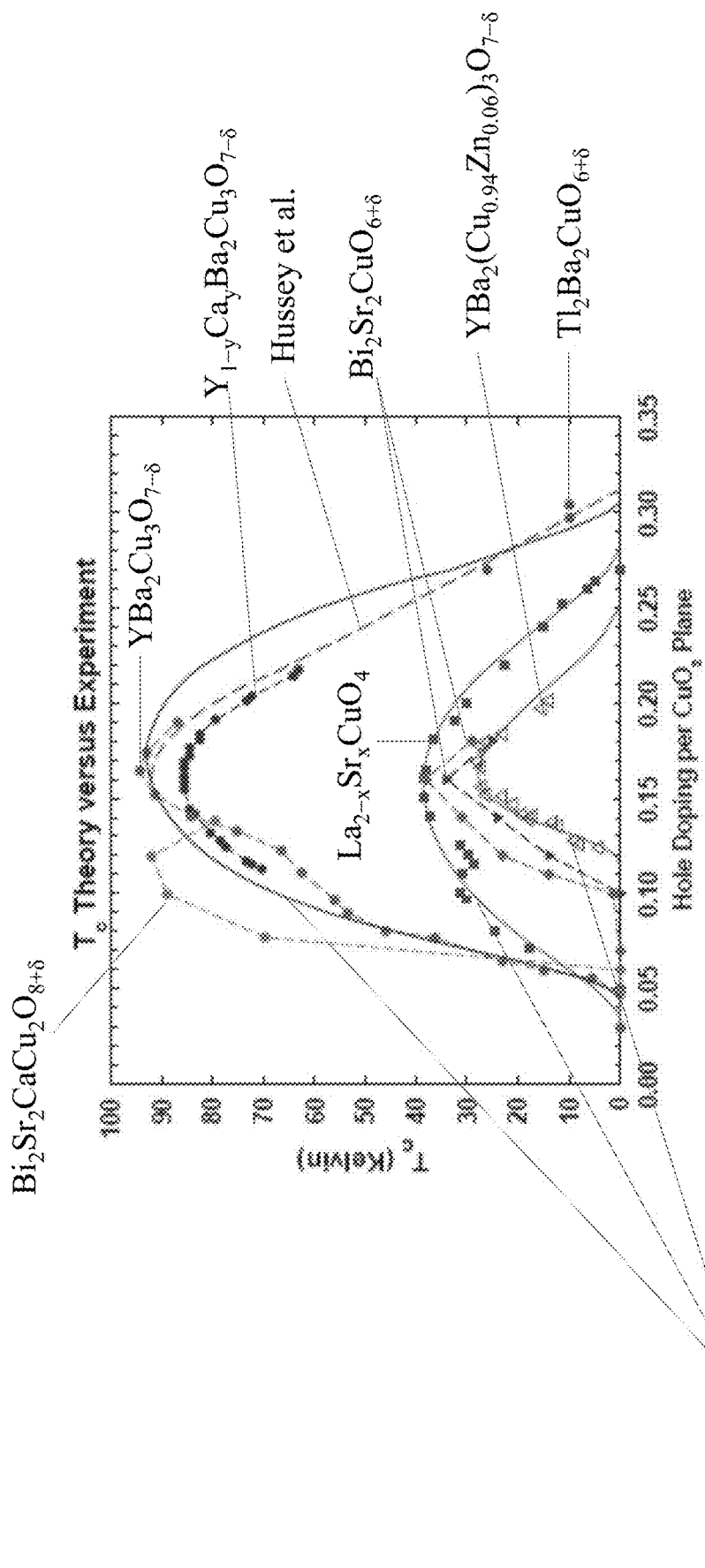
FIG. 16, Comparison of Experimental and Computed Tc-domes. $Bi_2Sr_2CaCu_2O_{8+\delta}$ (light blue solid circles [36]), $YBa_2Cu_3O_{7-\delta}$ (green circles [37]), $Y_{1-y}Ca_yBa_2Cu_3O_{7-\delta}$ (dark blue circles [38]), $La_{2-x}Sa_xCuO_4$ (magenta squares [39]), $Bi_2Sr_2CuO_{6+\delta}$ (green diamonds [40] and solid blue triangles, [17]), 6% Zn doped $YBa_2(Cu_{0.94}Zn_{0.06})_3O_{7-\delta}$ (open red triangles [38]), and $Tl_2Ba_2CuO_{6+\delta}$ (solid red circles [41,42]). The dashed red line is the proposed $Tl_2Ba_2CuO_{6+\delta}$ curve by Hussey et al. [41,42] The solid black, magenta, and red lines are computed according to the present invention (see computational methods section).

7. Tc Concept 7: Interface O atom-phonon pairing explains the experimental Tc domes. FIG. 16 shows the structure, the interface O phonon coupling parameters, and the inclusion of the remaining phonons into the Eliashberg calculations are described in appendices F and G in the provisional application 62/458,740. The parameters were intentionally chosen to be simple and conceptual and we did not attempt to fit the experimental points exactly. A goal of the present disclosure is to demonstrate that reasonable electron-phonon couplings and the proposed inhomogeneous cuprate electronic structure are sufficient to understand the experimental Tc-domes.

Figure 17:
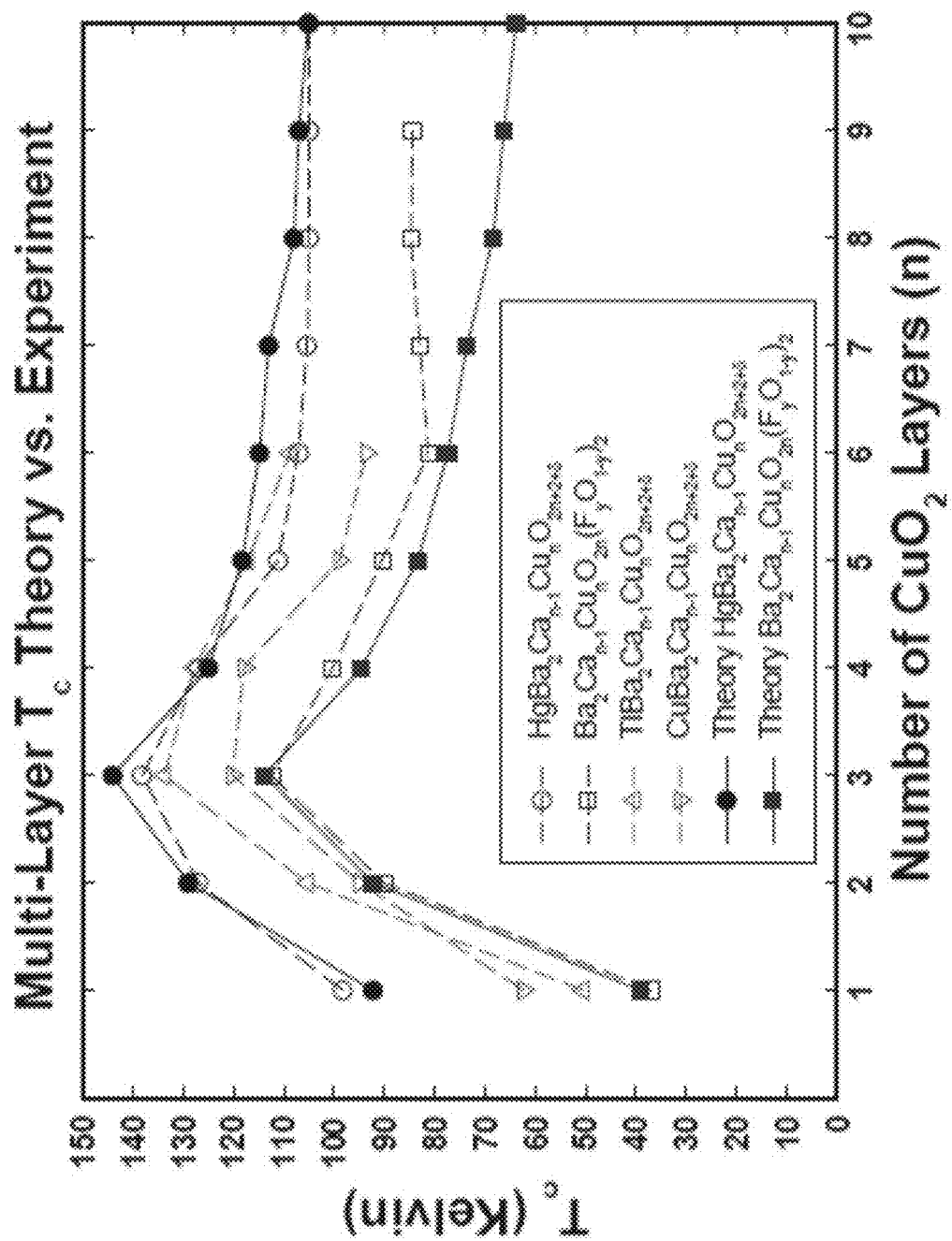
FIG. 17, Comparison of the computed and experimental Tc as a function of $CuO_2$ layers per unit cell. The experimental data points (open symbols and dashed lines) are from Mukuda et al. [2] Two theoretical Tc curves obtained using the present invention are shown (solid symbols and solid lines). AU parameters, including the hole dopings in each $CuO_2$ layer, are in the computational methods section. The generalization of the Eliashberg equations for one $CuO_2$ plane to multi-layers is also described in the computational methods section. If the hole doping in each layer is the same, then the computed Tc curve would monotonically increase with the number of layers, n, and saturate for large n. Since the hole doping for the inner layers is less than the hole doping on the outermost layers (see Table V in the computational methods section), there are fewer interface O atom phonons that contribute to the high Tc in the inner layers. The maximum Tc occurs at three layers.

8. Tc Concept 8: The experimental variation of Tc with the number of $CuO_2$ layers per unit cell is due to interlayer coupling of the interface O atom-phonons and the nonuniform hole doping between layers. Since the O atom phonons near the metal-insulator interface are longer-ranged, they couple to adjacent $CuO_2$ planes. Hence, there is a strong dependence of Tc on the number of $CuO_2$ layers per unit cell. In addition, the Cu Knight shift measurements of Mukuda et al [2] have shown that the hole doping is not the same in each $CuO_2$ layer. The computed Tc as a function of the number of $CuO_2$ layers is shown in FIG. 17.

9. Tc Concept 9: The D-wave Tc values computed in FIGS. 16 and 17 are weakly dependent on the orbital energy change, $\delta\varepsilon$, and strongly dependent on the hopping energy change. $\delta t$. See Table I for the change in Tc at optimal doping of x=0.16 for the computed black, red, and magenta curves in FIG. 16.

TABLE I

The change in the Tc at optimal doping (x = 0.16) for the three computed curves in FIG. 16. The orbital energy parameter, $\delta\varepsilon$, and the hopping enemy parameter, $\delta t$, are each changed by 0% and ±10% from their initial values found in Appendix F. In appendices G2a and G2b, the $\delta\varepsilon$ terms lead to a more isotropic electron-phonon pairing, and the $\delta t$ terms are more anisotropic. For a D-wave Tc, an isotropic electron-phonon pairing does not contribute to Tc. In the fourth column (red curve), $\delta\varepsilon = 0$ (see Appendix F). Hence, changes to $\delta\varepsilon$ do not affect Tc.

| Change in ($\delta\varepsilon$, $\delta t$) | Black Curve $YBa_2Cu_3O_{7-\delta}$ | Magenta Curve $La_{2-x}Sr_xCuO_4$ | Red Curve $YBa_2(Cu_{0.94}Zn_{0.06})_3O_{7-\delta}$ |
|---|---|---|---|
| (0%, 0%) | 92.2K | 38.5K | 27.7K |
| (0%, −10%) | 83.1K | 30.7K | 19.9K |
| (0%, +10%) | 100.0K | 46.3K | 35.6K |
| (−10%, 0%) | 93.6K | 39.4K | 27.7K |
| (−10%, −10%) | 84.7K | 31.3K | 19.9K |
| (−10%, +10%) | 101.1K | 47.5K | 35.6K |
| (+10%, 0%) | 90.5K | 37.5K | 27.7K |
| (+10%, −10%) | 81.4K | 30.1K | 19.9K |
| (+10%, +10%) | 98.5K | 45.0K | 35.6K | calculated Tc-domes versus experiment as a function of doping for different cuprates using the phonon modes from FIG. 12 and the electron-phonon couplings estimated in Tc Concept 2. All three computed D-wave Tc domes were obtained from the strong-coupling Eliashberg equations for Tc [16,34,35]. Other phonon modes also contribute to Tc. These phonons primarily reduce the magnitude of Tc due to their contribution to electron pair "lifetime effects" (strictly speaking, the "wavefunction renormalization effects"). The effect of all the phonon modes on Tc is included in the computations described herein. All the details of the hand From Table I, a 10% increase in $\delta\varepsilon$ always decreases the D-wave Tc by $\approx$2-3%. A ±10% change in $\delta t$ leads to $\approx$±10-30% change in the D-wave Tc. In appendices G2a and G2b, the exact dependence of the electron-phonon pairing parameter, $\lambda$, is derived. The contribution of $\delta\varepsilon$ to $\lambda$ is approximately isotropic around the Fermi surface leading to a weak dependence of the D-wave Tc on changes in $\delta\varepsilon$. In contrast, an S-wave pairing symmetry Tc depends strongly on both $\delta\varepsilon$ and $\delta t$. The weak dependence of the D-wave Tc on $\delta\varepsilon$ implies the $\delta\varepsilon$ parameters for the Tc curves in FIGS. 16 and 17 cannot be determined unambiguously from the experimental Tc data. The uncertainty in the magnitude of δε leads to an S-wave Tc range from ≈270-400 K due to dopant "crowding," as shown below.

10. Tc Concept 10: Overlapping plaquettes ("crowding" the dopants) freeze the dumbbells, decrease the Coulomb pseudopotential, $\mu^*$, and thereby raise the S-wave Tc. If the same metallic "footprint" can be maintained, then there is no change in the phonon pairing. Only $\mu^*$ is reduced (see FIG. 15). If all the dumbbells can be frozen, then from FIGS. 14 and 15, the S-wave Tc will be larger than the D-wave Tc. FIGS. 18A-18C shows how two plaquettes with fluctuating dumbbells can be crowded by adding an additional dopant (Sr in the figure) while retaining exactly the same metallic footprint. For random doping, there will always exist adjacent plaquette pairs as shown in FIG. 18C that cannot be overlapped by another plaquette within the existing metallic footprint. There are two ways to obtain an optimally doped metallic footprint and freeze 100% of the dumbbells. First, dope "dominoes" (adjacent pairs of plaquettes as in FIGS. 18A and 18B). Second, dope to less than optimum doping. Next, crowd all of the plaquettes in such a way as to end up with an optimally doped metallic footprint and 100% frozen dumbbells.

11. Tc Concept 11: FIG. 19 shows crowding dopants while maintaining the optimal doping metallic footprint leads to room temperature S-wave Tc. In FIG. 20, the ground state electronic wavefunction of $H_2$ at the equilibrium bond separation of 0.74 Angstrom is well approximated by a restricted Hartree-Fock form (a spin up and spin down electron pair occupying the same bonding orbital). In the language of an effective electron hopping, t, and an onsite Coulomb repulsion, U, this region is represented by $t \gg U$. At dissociation ($t \ll U$), the ground state electronic wavefunction is highly correlated. The wavefunction is large only when there is one electron on each H atom. From FIG. 20, the optimal superconducting Tc of cuprates is at "intermediate" correlation. Molecules do not generally "settle" at intermediate correlation. Since the dopants ill cuprates are frozen in at high temperatures, the material avoids intermediate correlation by phase separating on an atomic-scale into a metallic (weak correlation) and insulating AF (strong correlation) regions.

Atomic-scale inhomogeneity explains three important materials issues about cuprates. First, cuprates are known to "self-dope" to approximately optimal Tc. Since plaquette overlap occurs at x=0.1.87 doping, we believe it is energetically favorable for dopants to enter the crystal until their plaquettes begin to overlap. Adding further dopants is energetically unfavorable. The change in Tc between optimal doping (x≈0.16) and plaquette overlap (x=0.187) is ≈5%. Hence, cuprates "self-dope" to approximately optimal Tc as a consequence of the energetics of overlapping plaquettes.

Second, $YBa_2Cu_3O_{7-\delta}$ cannot be doped past x≈0.23, as shown in FIG. 16. The phenomenon can be understood if it is energetically unfavorable to overlap plaquettes that share an edge (occurring at doping x=0.226). In the earliest days of cuprate superconductivity, materials scientists had difficult), observing superconductivity in $La_{2-x}Sr_xCuO_4$ above ≈0.24 doping [44]. We believe the difficulty was also due to the energetics of overlapping plaquettes with shared edges. Annealing in an $O_2$ atmosphere solved the $La_{2-x}Sr_xCuO_4$ overdoping problem. However, the problem still remains for $YBa_2Cu_3O_{7-\delta}$.

Third, it is known that a room-temperature thermopower measurement is one of the fastest ways to determine if a cuprate sample is near optimal doping for Tc because the room-temperature thermopower is very close to zero near optimal doping. This peculiar, but useful, observation can be understood because 2D percolation of the metallic region occurs at x≈0.15 doping. Since the AF region thermopower is large (~+100 μV/K) and the metallic thermopower is ~−10 μV/K at high overdoping, 2D metallic percolation "shorts out" the AF thermopower and drives the thermopower close to zero near optimal Tc.

Finally, the potential energy curve in the intermediate correlation regime is hard to study for molecules. For $H_2$, the equilibrium bond distance is 0.74 Angstroms. The intermediate correlation regime is at ~2.0 Angstrom bond separation. At this distance, the blue potential energy curve in FIG. 20 can only be observed indirectly [45-47] because it is not at a local minimum. For $H_2$, the ultraviolet spectrum of the vibrational modes (there are 14 discrete levels below the continuum) can be fitted to a simple Morse potential to estimate the potential energy as a function of the H—H separation distance. The 10th bond-stretching phonon mode probes the potential energy of the two of H atoms up to ≈2.0 Angstroms.

II. Second Example: General Materials Approaches to Room-Temperature Tc and Large Jc As illustrated herein, there is enormous "latent" Tc residing in the cuprate class of superconductors from converting the D-wave superconducting pairing wavefunction to an S-wave pairing wavefunction. The result is surprising and unexpected because it has been assumed by most of the high-Tc cuprate community that there was something special about the D-wave pairing symmetry that led to Tc~100 K.

Plaquettes have been overlapped with regularity for 30 years. However, these materials are all overdoped with doping x≈0.187, as shown in FIGS. 11A-11D. Hence, dumbbells have been frozen and the S-wave Tc has increased. However, the calculations presented herein find the S-wave Tc remains below the D-wave Tc for reasonable parameter choices. Unfortunately, the optimally doped metallic footprint is not obtained by naive dopant crowding. Instead, the size of the metallic footprint increases and its pairing interface decreases. The right side of the Tc-dome shown in FIG. 16 is the result. Even the layer-by-layer Molecular Beam Epitaxy (MBE) of Bozovic et al. [48] does not control the placement of the dopants in each layer, leading to the same result as above.

While almost everything that can be possibly be suggested for the mechanism for cuprate superconductivity has been suggested in over 200,000 papers (percolation, inhomogeneity, dynamic Jahn-Teller distortions, competing orders, quantum critical points at optimal doping or elsewhere, spin fluctuations, resonating valence bonds, gauge theories, blocked single electron interlayer hopping, stripes, mid-infrared scenarios, polarons, bipolarons, spin polarons, spin bipolarons, preformed Bose-Einstein pairs, spin bags, one-band Hubbard models, three-band Hubbard models, t-J models, t+U models, phonons, magnons, plasmons, anyons, Hidden Fermi liquids, Marginal Fermi liquids, Nearly Antiferromagnetic Fermi liquids, Gossamer Superconductivity, the Quantum Protectorate, etc.), the inventor believes these ideas have lacked the microscopic detail necessary to guide experimental materials design, and in some instances, may have even led materials scientists down the wrong path.

As shown above (see FIG. 19), freezing dumbbells in cuprates leads to room-temperature Tc (see FIG. 19). However, the critical current density, Jc, is approximately two orders of magnitude smaller than the theoretical maximum, Jc~$10^{-2}$Jc,max, where Jc,max is the depairing limit for Cooper pairs. Jc is small because the conducting pathway in the $CuO_2$ planes is extremely tenuous (see the discussions in the captions of FIGS. 4 and 10). For practical engineering, Jc should be at least ~$10^{-1}$Jc,max.

In cuprates, Tc can be raised to room-temperature by freezing dumbbells while maintaining the random metallic footprint found at optimal doping. By fabricating wires (a wire is defined as a continuous 1D metallic pathway through the crystal), Tc remains large while Jc increases to at least ~$10^{-1}$Jc,max.

The results presented herein lead to the following approaches for achieving higher Tc and Jc. Unless explicitly stated, the points below apply to any type of material (cuprate or non-cuprate).

1. The Material should be Inhomogeneous

The material should have a metallic region and an insulating region. The insulating region does not have to be magnetic. However, the inventor believes the antiferromagnetic insulating region helps maintain the sharp metal-insulator boundary seen in cuprates. An ordinary insulator or a semiconductor with a small number of mobile carriers is sufficient to obtain a longer ranged electron-phonon coupling at the interface because there is less electron screening in the semiconducting (or insulating) region compared to the metallic region. Thus, atomic-scale metal-insulator inhomogeneity in a 3D material leads to a high-Tc 3D S-wave pairing wavefunction. Moreover, a 3D material is more stable against defects and grain boundaries.

2. Ratio of Metallic Unit Cells

The ratio of the number of metallic unit cells on the interface (adjacent to at least one insulating unit cell) to the total number of metallic unit cells must be larger than 20%. The terms interface and surface are used interchangeably below. The number of metallic unit cells on the interface (or surface) must be a large fraction of the total number of metallic unit cells in order for the enhanced electron-phonon pairing at the interface to have an appreciable effect on Tc. From the calculations in FIG. 16, 50% of optimal Tc is obtained when the ratio is ≈50%, and 25% of optimal Tc occurs when the ratio is ≈35%. Below a surface metal unit cells to total metal unit cells ratio of 20%, Tc falls off exponentially, and therefore Tc is too low to be useful.

3. Avoid Small Metallic Clusters

Metallic clusters that are smaller than approximately the coherence length do not contribute to Tc due to thermal fluctuations. The surface metal unit cells to total metal unit cells ratio described above should only include surface metal unit cells in extended metallic clusters.

In cuprates, high Tc can be obtained at very low doping if all the dopants leading to isolated plaquettes and small plaquette clusters are arranged such that a single contiguous metallic cluster is formed. While the Tc may be high, Jc will be low if the size of the metallic region is a small fraction of the total volume of the crystal.

Inhomogeneous materials formed at eutectic points have a surface metal unit cells to total metal unit cells ratio of ~$10^{-3}$ or less if the sizes of the metallic and insulating regions are on the order of microns. Standard materials fabrication methods do not lead to sufficient surface atomic sites for high Tc. Inhomogeneity on the atomic-scale is necessary.

4. Superconducting Wires Lead to a Small Increase of Tc and a Large Increase of Jc It would appear that parallel 1D metallic wires that are one lattice constant wide (equal to one plaquette width in cuprates) would lead to the maximum surface unit cells to total metal unit cells ratio of 100%, and thereby a large Tc increase. It was surprising and unexpected to discover that at optimal doping of x=0.16, the surface metal unit cells to total metal unit cells ratio is 91% in cuprates. Increasing the ratio to 100% increases Tc by only ≈5% because at higher Tc magnitudes, Tc no longer increases exponentially with the magnitude of the electron-phonon coupling, $\lambda$ (defined in Appendix G). Instead, Tc scales [49] as Tc~$\sqrt{\lambda}$. A 10% increase in the surface to total metal unit cells ratio increases $\lambda$ by 10%, leading to a 5% increase in Tc. Hence, there is negligible Tc to be gained by fabricating wires.

While metallic wires lead to a tiny increase in Tc, metallic wires increase Jc dramatically (up to a factor of ~100) by eliminating the tortured conduction pathways shown in FIG. 4. For cuprates, optimal Tc doping at x=0.16 is barely above the 2D percolation threshold of x≈0.15 doping. Hence, the conducting pathways in a single $CuO_2$ plane are tenuous at optimal doping.

Current materials fabrication methods for cuprates have optimized the Tc at the expense of Jc. This point evidences that despite all the proposals in over 200,000 refereed publications [3] there has been little guidance to the materials synthesis community on what is relevant at the atomic level for optimizing Tc and Jc.

Parallel wires that are a few lattice constants in width are had superconductors because 1D superconductor-normal state thermal fluctuations lead to large resistances below the nominal Tc. However, by fabricating two (or more) sets of parallel wires that cross each other, the effect of resistive thermal fluctuations in a single wire are suppressed. FIGS. 21-21F illustrate perpendicularly crossed wires in 2D. In FIGS. 21A-21C, the added dopant (solid (red) square 2100) that overlaps two plaquettes (larger blue squares 2102 with darker outline) does not have a red square boundary (1802 and 1000d) drawn for reasons of clarity only. The same pattern or a different pattern can be used in adjacent layers normal to the 2D wires. Crossing wires in 3D (two or more sets of parallel wires spanning the whole crystal) also leads to high Tc and Jc. Crossed metallic wires with varying aspect ratios and widths provide many opportunities for optimizing Tc and Jc for specific applications. For example, wires that are four metallic atoms wide (equal to two adjacent plaquettes in cuprates), would have ≈½ the surface to total metal ratio of metallic wires two atoms wide (or one plaquette in cuprates), leading to an ≈50% reduction in Tc compared to wires that are two metallic atoms wide. However, Jc increases by a factor of two.

Generally, it is most favorable to fabricate the narrowest wires that are spaced closely together because both Tc and Jc will be large. In addition, interfacial phonon modes will couple to both the closest wire and the next-nearest neighboring wire, leading to further increase in Tc. For cuprates, the narrowest wire is one plaquette width (see FIG. 2). Other materials will have a different minimum width scale for wires.

5. Dopants in one or more examples, dopants are added to an insulating parent compound that leads to metallic regions. However, a metallic parent compound can also be doped to create insulating regions. In cuprates, the parent compound is insulating and doping creates metallic regions.

6. Metallic and Insulating Regions Provide New Opportunities for Pinning Magnetic Flux.

Strong pinning of magnetic flux lines in superconductors is necessary to obtain large critical current densities, Jc. Insulating "pockets" surrounded by metallic region are energetically favorable for magnetic flux to penetrate. The flux can be strongly bound inside these insulating regions by adding further pinning centers to the insulating region. Examples of insulating pockets are shown in FIGS. 21A-21F.

7. Dumbell Freezing in Cuprates

In cuprates, it is desirable to freeze the fluctuating dumbbells in non-overlapping plaquettes while maintaining a metallic footprint with a large surface metallic unit cells to total metallic unit cells ratio. The ratio of the isotropic S-wave pairing wavefunction Tc to the corresponding D-wave Tc is ≈2.8-4 (see FIG. 19). In cuprates, fluctuating dumbbells in non-overlapping plaquettes can be frozen by breaking the symmetry inside each plaquette by an atomic substitution into the $CuO_2$ plane, atomic substitution out of the $CuO_2$ plane (such as the apical O atom sites), or interstitial atoms, as shown in FIGS. 22A-22B.

III. Experimental Methods

There are three materials issues with crowding dopants:

1. $T_c$ does not increase with crowding until the D-wave gap symmetry changes to S-wave at ~20% crowding. Thus, $T_c$ is not useful as a metric for sample characterization.

2. Dopants are charged, and hence repel each other.

3. The optimal $T_c$ metallic footprint at 0.16 holes per $CuO_2$ plane (the shaded (yellow) overlay 2300 in FIG. 23) must be retained.

There are two cuprates materials where the dopant crowding idea can be tested:

$La_{2-x}Sr_xCuO_4$:

As illustrated herein, the $T_c$ of optimally doped $La_{2-x}Sr_xCuO_4$ increases from ~40 K with no dopant crowding (f=0.0 in FIG. 23) to $T_c$~160 K with 100% crowding (f=1.0). This material does not lead to room-temperature $T_c$. However, the crowding method described below is simple.

The ionic charges of the La and Sr atoms in $La_{2-x}Sr_xCuO_4$ are +3 and +2 (or −1 relative to $La^{+3}$), respectively. The most direct way to crowd dopants is to add atoms with a +1 charge relative to $La^{-3}$ (a +4 oxidation state) because they favor residing in-between the $Se^{+2}$ atoms due to charge attraction. At first glance, it appears this approach is counter-productive because a +4 atom adds an electron, and thereby lowers the net doping and $T_c$. However, the added electron fills a hole in the out-of-plane fluctuating dumbbells rather than doping the planar $CuO_2$ metallic band. The net result is our desired crowding. Example crowding dopants include $C^{+4}$, $Si^{+4}$, $Ge^{+4}$, $Sn^{+4}$, $Ti^{+4}$, $Ze^{+4}$, $Hf^{+4}$, and $Pt^{+4}$. These dopants are smaller than $La^{+3}$, and hence will "fit" in-between the two Sr atoms.

$YBa_2Cu_3O_{6+x}$:

FIG. 23 shows $T_c$ for YBCO as a function of crowding. $T_c$ reaches ~390K. Since Oxygen is added to the chains instead of atomic substitution as in LSCO, the LSCO crowding method above does not apply to YBCO. In one fabrication method, O atoms may be removed from the chains (lowering x) and substituting Ca atoms for Y in order to bring the material back to optimal doping. This substitution has already been shown to work experimentally. Hence, Ca becomes the equivalent of Sr in LSCO. At this point, the crowding method for LSCO can be used for (YCa)CuO.

The lack of any change in $T_c$ for dopant crowding less than 20% and the counter-intuitive suggestion above of electron doping the material are the reasons the materials community did not "accidentally" find this room-temperature mechanism, despite intense effort over 31 years.

In one or more examples, the room-temperature Seebeck coefficient (thermopower) of new material samples can be tested because it is a direct measure of the size of the metallic regions (yellow overlay in FIG. 23), and it can be done cheaply in a few minutes. The goal is to add +4 dopants beyond optimal doping without changing the Seebeck coefficient. This approach will lead the materials scientists up the red dotted curve in FIG. 23, and thereby into the solid red region where $T_c$ is large.

IV. Process Steps

FIG. 24 is a flowchart illustrating a method of fabricating a superconducting composition/state of matter 1000 (referring also to FIGS. 10C, 18B, and 19).

Block 2400 represents combining a first region 1002a or material and a second region 1002b or material to form a composition of matter 1000.

In one or more examples, the first region 1002a or material and the second region 1002b or material each comprise unit cells 1004a, 100413, respectively, of a solid 1000c (e.g., crystalline or amorphous lattice). The second region 1002b extends through the solid (e.g., crystalline or amorphous lattice) and a subset of the second region 1002b are surface metal unit cells 1004b that are adjacent to at least one unit cell 1004a from the first region 1002a. The ratio of the number of the surface metal unit cells 1004b to the total number of unit cells 1004b, 906, 902 in the second region 1002b is at least 20 percent (e.g., in a range of 20%-100%).

The first region 1002a or material comprises an electrical insulator or semiconductor. Examples of insulator include an antiferromagnetic insulator or a non-magnetic insulator. The second region or material comprises a metallic electrical conductor.

Examples of the composition of matter 1001) include the first region or material 1002a comprising at least one compound selected from the metal-monoxides, MgO, CaO, SrO, BaO, MnO, FeO, CoO, NiO, CdO, EuO, PrO, and UO, combined with the second region or material 1002b comprising at least one compound selected from TiO, VO, NbO, NdO, and SmO.

Further examples of the composition of matter 1000 include the first region 1002a or material comprising at least one compound selected from $V_2O_3$ with up to 20% of the V atoms replaced by Cr atoms, combined with the second region 1002b comprised of $(V_xTi_{1-x})_2O_3$ where x is greater than or equal to zero or less than or equal to one.

Yet further examples of the composition 1000 include the first region 1002a comprised of $Al_2O_3$, and the second region 1002b is formed by replacing the Al atoms in the first region with Ti, V, or Cr atoms.

In yet further examples, the second region 1002b is formed by replacing one type of atom in the first region 1002a by another type of atom of a different chemical valence.

In yet further examples, the second region 1002b is formed by adding a type of atom to a subset of the unit cells 1004a of the first region 1002a, the type of atom of such chemical valence that (when the type of atom is added to the unit cells 1004a) the type of atom acts as an electrical donor or acceptor.

In one or more examples, the second region 1002b is formed by adding interstitial atoms in said first region 1002a.

In yet further examples, the first region 1002a is formed by replacing one type of atom in the second region 1002b by another type of atom of a different chemical valence.

In yet further examples, the first region 1002a is formed by adding a type of atom to a subset of the unit cells 1004b of the second region 1002b, the type of atom of such chemical valence that (when the type of atoms is added to the unit cells) the type of atom acts as an electrical donor or acceptor.

In yet further examples, the first region 1002a is formed by adding interstitial atoms in the second region 1002b.

In yet further examples, the combining comprises combining two distinct atoms (first 1800 and second atoms 1802). The first atom 1800 (e.g., Sr) has a chemical valence such that when the first atom 1800 is added to the material (e.g., cuprate), the first atom 1800 acts as an electrical acceptor. The second atom 1802 (e.g., Ti) has a chemical valence such that, when the second atom is added to the material (e.g., cuprate), the second atom 1802 acts as an electrical donor, and 20% or at least 20% (e.g., 20%-100%) of said second atoms 1802 reside inside the unit cell 1804 between two of said first atoms 1800 that are a distance of two unit cells 1804, 1000d from each other. In on one or more examples, the second region 1002 includes the two distinct atoms (first 1800 and second atoms 1802) and the superconductor is from the hole-doped cuprate class.

In yet further examples, the combining comprises forming $YBa_2Cu_3O_{6+x}$ where at least 5% of the Y atoms are replaced by +2 oxidation state atoms, Mg, Ca, Sr, Zn, Cd, Cu, Ni, or Co, at least 2% of the Y atoms are replaced by +4 oxidation state atoms, Ti, Zr, C, Si, Ge, Sn, or Pb.

In yet further examples, the combining comprises combining two distinct atoms (first and second atoms) having such chemical valence that (when added to the cuprate) the first atom acts as an electrical donor, the second atom acts as an electrical acceptor, and 20% or at least 20% (e.g., 20%-100%) of said second atoms reside inside the unit cell betty con two of the first atoms that are a distance of two unit cells from each other. In on one or more examples, the second region includes the two distinct atoms (first and second atoms) and the superconductor is from the electron-doped cuprate class.

In yet further examples, the second region 1002a is comprised of approximately linear subregions 1010, as illustrated in FIG. 1.8B. The approximately linear subregions 1010 of the second region 1002b can surround regions of a first kind or first region 1002a. Some of the surrounded regions of the first kind/region 1002a may have atomic substitutions, grain boundaries, or interstitial atoms.

In one or more examples, the components are provided in powder form and ground together in a pestle and mortar.

Block 2402 represents the step of doping the composition formed in Block 2400. Examples of doping include first n-type doping the composition then p-type doping the composition. Exemplary ranges of n-type doping include a doping concentration in a range from 5% up to 80% (e.g., 5% up to 20%) n-type dopants per unit cell. Exemplary ranges of p-type doping include a doping concentration in a range from 5% up to 80% (e.g., 5% up to 20%) p-type dopants per unit cell. In one or more examples where the composition comprises a cuprate, the n-type doping and p-type doping are such that the dopant concentration x is in a range of 0.13-0.19. Examples of dopants include, but are not limited to, Mg, Ca, Sr, Zn, Cd, Cu, Ni, Co, Ti, Zr, Hf, C, Si, Ge, Sn, Pb.

In one or more examples, the dopants are provided in powder form and mixed together (e.g., ground together in a pestle and mortar) with the components of Block 2400.

Block 2404 represents the optional step of annealing the doped composite formed in Block 2402.

Block 2406 represents the optional step of measuring the insulator/semiconductor and metal content in the composition. In one or more examples, the step comprises measuring a thermopower of the composite, wherein the thermopower quantifies the amount of metal and insulator/semiconductor in the composition. The measurement enables identification of the fraction of overlapped plaquettes as a function of the structure, doping, and composition of the first region and the second regions, so that compositions mapping onto the red curve 2302 in FIG. 23 can be fabricated. Desired compositions are those measured with a ratio of the number of the surface metal unit cells to the total number of unit cells in the second region is at least 20 percent (e.g., in a range of 20-100%).

Block 2408 represents repeating steps 2400-2404 with modified compositions if the measurement in Block 2406 indicates that the fraction of overlapped plaquettes, f, does not lie on the S-wave curve in FIG. 23 so as to obtain the desired Tc.

Block 2410 illustrates the end result, a superconducting composition of matter having a Tc in a range of 100-400 K, wherein a ratio of the number of the surface metal unit cells to the total number of unit cells in the second region is at least 20 percent (e.g., in a range of 20-100%). In one or more examples, both the metallic content of the superconductor and the surface area of the metallic regions overlapping with the insulator/semiconductor regions are maximized.

Superconducting compositions of matter according to embodiments of the present invention may also be designed by computationally solving equations G43-G45 in the computational methods section for any combination of material(s) using the appropriate parameters for those materials.

V. Computational Methods and Approximations a. Estimate of the Magnitude of the Electron Phonon Coupling It is known to be qualitatively current that $\hbar\omega_D/E_F \approx \sqrt{m/M}$ where $\hbar\omega_D$ is the Debye energy, $E_F$ is the Fermi energy, m is the electron mass, and M is the nuclear mass. One can quickly see that the form of the above expression is correct using $\omega_D \sim \sqrt{K/M}$ where K is the spring constant and $K \sim E_F k_P^2 \sim m E_F^2/\hbar^2$ due to metallic electron screening.

The electron-phonon coupling, g, is of the form $g \sim \sqrt{\hbar/2M\omega_D} \nabla V$, where V is the nuclear potential energy. Substituting $\nabla V \sim k_P E_F$, leads to $g^2 \sim (\hbar/2M\omega_D)k_P^2 E_F^2 \sim (m/M)E_F^2/(\hbar\omega_D) \sim (\hbar\omega_D)E_F$. Hence, $g \approx \sqrt{\hbar\omega_D E_F}$.

Another derivation is dimensional. The coupling, g, has dimensions of energy and there are only two relevant energy scales, $\hbar\omega_D$ and $E_F$. Thus there are three possibilities for g: the mean, the geometric mean, and the harmonic mean of $\hbar\omega$ and $E_F$. Since $\hbar\omega_D \ll E_F$, the mean is $\approx E_F$, and the harmonic mean is $\approx \hbar\omega_D$. Neither of these two means makes intuitive sense because we know metallic electrons strongly screen the nuclear-nuclear potential. The only sensible choice is the geometric mean, $g \sim \sqrt{\hbar\omega_D E_F}$.

b. Fluctuation Tc: Plaquette Clusters Smaller than the Coherence Length

There are superconducting fluctuations above Tc at low dopings due to the fluctuating magenta plaquette clusters in FIGS. 8, 9A-9D, and 10A-10D. These plaquette clusters have superconducting pairing that does not contribute to the observed Tc because the clusters are smaller than the coherence length. Including these clusters into the Tc computation leads to an estimate of the temperature range where plaquette cluster superconducting fluctuations occur above Tc. The resulting "fluctuation Tc domes" are plotted in FIG. 26. Of course, there exist superconducting fluctuations above Tc from the plaquette clusters that are larger than the coherence length (yellow clusters 904 in FIGS. 8, 9A-9D, and 10A-10D). The fluctuation Tc from the larger yellow clusters is not included in FIG. 26.

Parameters Used in the $T_c$ Computations

TABLE II

The planar Cu $d_{x^2-y^2}$ and O $p_\sigma$ band structure used in all $T_c$ computations. We use effective single band parameters derived from the angle-resolved photoemission (ARPES) Fermi surface for single layer Bi2201.[17] The 2D tight-binding band structure is $\epsilon_k = -2t[\cos(k_x a) + \cos(k_y a)] - 4t' \cos(k_x a)\cos(k_y a) - 2t''[\cos(2k_x a) + \cos(2k_y a)]$, where a is the planar Cu—Cu lattice size and the 2D momentum is $k = (k_x, k_y)$. The ratio $t''/t' = -\frac{1}{2}$ is assumed.[17] The variable n in the table is the number of metallic electrons per metallic Cu. At optimal doping, the number of holes per metallic Cu in the CuO$_2$ plane is $x = 0.16$, leading to $n = 1.0 - x = 0.84$. The optimal doping Fermi level is used for all dopings in order to keep the number of parameters to a minimum. For the multi-layer $T_c$ calculations in FIG. 17, we assume the 2D band structure $\epsilon_k$ above. The 2D k states in adjacent layers, l and $l \pm 1$, are coupled by a momentum dependent matrix element equal to $\langle k, l \pm 1|H_{inter}|k, l\rangle = -\alpha t_z(\frac{1}{4})(\cos(k_x a) - \cos(k_y a))^2$, where $\alpha$ is the product of the fraction of metallic sites in layers l and $l \pm 1$, Since interlayer hopping of an electron between Cu sites on different layers can only occur if the two Cu sites are metallic, $\alpha$ is the probability of two adjacent Cu sites in different layers being metallic. The dopings of the individual layers in the multi-layer $T_c$ calculations are all less than the threshold for plaquette overlap at $x = 0.187$. Hence, each plaquette covers 4 Cu sites. For example, between layers doped at $x = 0.16$ and $x = 0.11$, $\alpha = 4(0.16) \times 4(0.11) = 0.2816$ leading to $\alpha t_z \approx 0.023$ eV.

| n | t (eV) | t' (eV) | $t_z$ (eV) |
|---|---|---|---|
| 0.84 | 0.25 | −0.05625 | 0.08 |

TABLE III

Parameters that remain the same for every $T_c$ calculation, They are the mass-enhancement parameter derived from the high-temperature linear slope of the resistivity, $\lambda_{tr}$, the Debye energy, $\hbar\omega_D$, the minimum energy used in the low-temperature linear resistivity, $\hbar\omega_{min}$, the energy cutoff for Eiashberg sums, $\hbar\omega_c$, and the energy of the O atom phonon modes, $\hbar\omega_{ph}$.

| $\lambda_{tr}$ (dimensionless) | $\hbar\omega_D$ (Kelvin) | $\hbar\omega_{min}$ (Kelvin) | $\hbar\omega_c$ (eV) | $\hbar\omega_{ph}$ (eV) |
|---|---|---|---|---|
| 0.5 | 300 | 1.0 | 0.3 | 0.06 |

TABLE IV

Parameters for the $T_c$ curves in FIGS. 16, 17, and 26. The variable, $N_{min}$, is the number of metallic Cu sites inside the smallest plaquette cluster that is larger than the coherence length, and thereby contributes to $T_c$. The edge, convex, and concave couplings are chosen to be equal for the next layer couplings. All units are eV.

| | | | $\delta\epsilon$ | | | $\delta t$ | | | |
|---|---|---|---|---|---|---|---|---|---|
| Figure | Curve Color | $N_{min}$ | Edge | Convex | Concave | Edge | Convex | Concave | $\delta\epsilon_{NL}$ | $\delta t_{NL}$ |
| 16 | Black | 20 | 0.150 | 0.150 | 0.075 | 0.240 | 0.240 | 0.120 | | |
| 16 | Magenta | 20 | 0.150 | 0.150 | 0.075 | 0.130 | 0.130 | 0.065 | | |
| 16 | Red | 100 | 0.000 | 0.000 | 0.000 | 0.132 | 0.132 | 0.000 | | |
| 26 | Blue | 8 | 0.150 | 0.150 | 0.075 | 0.240 | 0.240 | 0.120 | | |
| 26 | Green | 12 | 0.150 | 0.150 | 0.075 | 0.240 | 0.240 | 0.120 | | |
| 26 | Red | 16 | 0.150 | 0.150 | 0.075 | 0.240 | 0.240 | 0.120 | | |
| 26 | Black | 20 | 0.150 | 0.150 | 0.075 | 0.240 | 0.240 | 0.120 | | |

TABLE IV-continued

Parameters for the $T_c$ curves in FIGS. 16, 17, and 26. The variable, $N_{min}$, is the number of metallic Cu sites inside the smallest plaquette cluster that is larger than the coherence length, and thereby contributes to $T_c$. The edge, convex, and concave couplings are chosen to be equal for the next layer couplings. All units are eV.

| Figure | Curve Color | $N_{min}$ | δε Edge | δε Convex | δε Concave | δt Edge | δt Convex | δt Concave | $δε_{NL}$ | $δt_{NL}$ |
|---|---|---|---|---|---|---|---|---|---|---|
| 17 | Black | 20 | 0.150 | 0.150 | 0.075 | 0.240 | 0.240 | 0.120 | 0.0 | 0.2 |
| 17 | Blue | 20 | 0.050 | 0.000 | 0.000 | 0.130 | 0.130 | 0.065 | 0.05 | 0.13 |

TABLE V

Doping of each $CuO_2$ layer in the multi-layer $T_c$ calculations. The outermost layers are always at optimal doping (x = 0.16). The adjacent layers are at x = 0.11 doping. The innermost layers are all at x = 0.09 doping. These dopings are obtained from Cu Knight shift measurements.[2]

| Layers | Hole Doping per $CuO_2$ Layer | | | | | | | | | |
|---|---|---|---|---|---|---|---|---|---|---|
| 1 | 0.16 | | | | | | | | | |
| 2 | 0.16 | 0.16 | | | | | | | | |
| 3 | 0.16 | 0.11 | 0.16 | | | | | | | |
| 4 | 0.16 | 0.11 | 0.11 | 0.16 | | | | | | |
| 5 | 0.16 | 0.11 | 0.09 | 0.11 | 0.16 | | | | | |
| 6 | 0.16 | 0.11 | 0.09 | 0.09 | 0.11 | 0.16 | | | | |
| 7 | 0.16 | 0.11 | 0.09 | 0.09 | 0.09 | 0.11 | 0.16 | | | |
| 8 | 0.16 | 0.11 | 0.09 | 0.09 | 0.09 | 0.09 | 0.11 | 0.16 | | |
| 9 | 0.16 | 0.11 | 0.09 | 0.09 | 0.09 | 0.09 | 0.09 | 0.11 | 0.16 | |
| 10 | 0.16 | 0.11 | 0.09 | 0.09 | 0.09 | 0.09 | 0.09 | 0.09 | 0.11 | 0.16 |

Description of the Eliashberg $T_c$ Calculations

1. The Eliashberg Equations

The attractive electron-electron pairing mediated by phonons is not instantaneous in time due to the non-zero frequency of the phonon modes (phonon retardation). In addition, electrons are scattered by phonons leading to electron wavefunction renormalization ("lifetime effects") that decrease $T_c$. Any credible $T_c$ prediction must incorporate both of these effects. All $T_c$ calculations in this paper solve the Eliashberg equations for the superconducting pairing wavefunction (also called the gap function). It includes both the pairing retardation and the electron lifetime.[16,29,59]

The Eliashberg equations are non-linear equations for the superconducting gap function, $\Delta(k, \omega, T)$, and the wave function renormalization, $Z(k, \omega, T)$, as a function of momentum k, frequency $\omega$, and temperature T. Usually, the T dependence of $\Delta$ and Z is assumed, and they are written as $\Delta(k, \omega)$ and $Z(k, \omega)$, respectively. We follow this convention here. Both $\Delta(k, \omega)$ and $Z(k, \omega)$ are a complex numbers. In this Appendix only, we will absorb Boltzmann's constant, $k_B$, into T. Thus T has units of energy.

Both $\Delta$ and Z are frequency dependent because of the non-instantaneous nature of the superconducting electron-electron pairing. If the pairing via phonons was instantaneous in time, then there would be no frequency dependence to $\Delta$ and Z. The simpler BCS[29] gap equation assumes an instantaneous pairing interaction ($\Delta$ is independent of $\omega$) and no wavefunction renormalization (Z=1).

The Eliashberg equations may be solved in momentum and frequency space (k, $\omega$), or in momentum and discrete imaginary frequency space, (k, $i\omega_n$), where n is an integer and $\omega_n=(2n+1)\pi T$. In the imaginary frequency space representation, the temperature dependence and the retardation of the phonon induced pairing are both absorbed into the imaginary frequency dependence, $i\omega_n$. In theory, both $\Delta(k, \omega)$ and $Z(k, \omega)$ can be obtained by analytic continuation of their $(k, i\omega_n)$ counterparts. In practice, the analytic continuation is fraught with numerical difficulties.[60,63] However, the symmetry of the gap can be extracted from either the real or imaginary frequency representations of $\Delta$.

In the pioneering work of Schrieffer, Scalapino, and Wilkins,[29,34,35,59] the goal was to obtain the isotropic (in k-space) gap function at zero temperature, $\Delta(\omega)$, as a function of $\omega$ in order to compute the superconducting tunneling of lead ($T_c$=7.2 K). Hence, they solved the full non-linear Eliashberg equations in frequency space.

Above $T_c$, $\Delta(k, \omega)$ is zero. For $T \approx T_c$, $\Delta$ is small. Since our interest in this paper is on the magnitude of $T_c$ and the symmetry of the superconducting gap, we can linearize the gap, $\Delta$, in the Eliashberg equations for temperatures, T, close to $T_c$. The result is a temperature dependent real symmetric matrix eigenvalue equation with $\Delta(k, \omega)$ as the eigenvector. The eigenvalues are dimensionless and the largest eigenvalue monotonically increases as T decreases. For $T>T_c$, the largest eigenvalue of the real symmetric matrix is less than 1. At $T~T_c$, the largest eigenvalue equals 1, signifying the onset of superconductivity.

The non-linear Eliashberg equations (or the linearized version) are easier to solve in imaginary frequency space.[16] Hence, we solve the linearized Eliashberg equations in imaginary frequency space to obtain $T_c$.

We use the linearized Eliashberg equations as derived in the excellent chapter by Allen and Mitrovic.[16] Prior Eliashberg formulations assume translational symmetry (momentum k is a good quantum number for the metallic states). Our metallic wavefunctions are not k states because they are only non-zero in the percolating metallic region. We write the wavefunction and energy for the state with index l as $\psi_l$ and $\epsilon_l$, respectively. Since $\psi_l$ is only delocalized over the metallic region and is normalized, $\psi_l \sim 1/\sqrt{N_M}$, where $N_M$ is the total renumber of metallic Cu sites. Rather than Cooper pairing occurring between $k\uparrow$ and its time-reversed partner, $-k\downarrow$, a Cooper pair here is comprised of $(\psi_l\uparrow, \overline{\psi_l}\downarrow)$, where $\overline{\psi_l}$ is the complex conjugate of $\psi_l$.

The linearized Eliashberg equations for $\Delta(l, i\omega_n)$ and $Z(l, i\omega_n)$ are obtained from the k-vector equations[16] simply by replacing k with the index l everywhere $$Z(l, i\omega_n) = 1 + \frac{\pi T}{|\omega_n|} \sum_{l'n'}^{|\omega_{n'}|<\omega_c} \left[\frac{\delta(\epsilon_{l'} - \epsilon_F)}{N(0)}\right] \lambda(l, l', \omega_n - \omega_{n'}) s_n s_{n'}, \quad (G1)$$

$$Z(l, i\omega_n)\Delta(l, i\omega_n) = \pi T \times \quad (G2)$$

$$\sum_{l'n'}^{|\omega_{n'}|<\omega_c} \frac{1}{|\omega_{n'}|}\left[\frac{\delta(\epsilon_{l'} - \epsilon_F)}{N(0)}\right][\lambda(l, l', \omega_n - \omega_{n'}) - \mu^*(\omega_c)]\Delta(l', i\omega_{n'}),$$

where $\epsilon_F$ is the Fermi energy, $N(0)$ is the total metallic density of states per spin per energy, $s_n = \omega_n/|\omega_n| = \text{sgn}(\omega_n)$ is the sign of $\omega_n$, $\omega_c$ is the cutoff energy for the frequency sums, $\lambda((l, l', \omega_n)$ is the dimensionless phonon pairing strength (defined below), and $\mu^*(\omega_c)$ is the dimensionless Morel-Anderson Coulomb pseudopotential at cutoff energy $\omega_c$. It is a real number. The wavefunction renormalization, $Z(l, i\omega_n)$, is dimensionless. In the non-linear linear Eliashberg equations, $\Delta(l, i\omega_n)$ has units of energy. In the linearized equations above, $\Delta(l, i\omega_n)$ is an eigenvector and is arbitrary up to a constant factor.

The "electron-phonon spectral function" $\alpha^2 F(l, l', \Omega)$ is defined $$\alpha^2 F(l, l', \Omega) = N(0) \sum_\sigma |<l|H_{ep}^\sigma|l'>|^2 \delta(\omega_\sigma - \Omega), \quad (G3)$$

and the phonon pairing strength $\lambda(l, l', \omega_n)$ is defined $$\lambda(l, l', \omega_n) = \int_0^{+\infty} d\Omega \alpha^2 F(l, l', \Omega)\left(\frac{2\Omega}{\omega_n^2 + \Omega^2}\right) \quad (G4)$$

$$= N(0) \sum_\sigma |<l|H_{ep}^\sigma|l'>|^2 \left(\frac{2\omega_\sigma}{\omega_n^2 + \omega_\sigma^2}\right), \quad (G5)$$

where $<l|H_{ep}^\sigma|l'>$ is the matrix element (units of energy) between initial and final states l' and l, respectively of the electron-phonon coupling, and $H_{ep}^\sigma$ is the electron-phonon coupling for the phonon mode $\sigma$ with energy $\omega_\sigma$. Roth $\alpha^2 F(l, l', \Omega)$ and $\lambda(l, l', \omega_n)$ are real positive numbers. Hence, $Z(l, i\omega_n)$ is a real positive number. From G2, the gap $\Delta(l, i\omega_n)$ can always be chosen to be real. Since $\lambda(l, l', \omega_n) = \lambda(l, l', -\omega_n)$ from equation G4, $$Z(l, -i\omega_n) = Z(l, -i\omega_n) = \text{Real Number}, \quad (G6)$$

$$\Delta(l, -i\omega_n) = \Delta(l, -i\omega_n) = \text{Real Number}. \quad (G7)$$

$\alpha^2 F(l, l', \Omega)$ and $\lambda(l, l', \omega_n)$ are dimensionless because $(eV)^{-1} (eV)^2 (eV)^{-1} \sim 1$. Physically, they should be independent of the number of metallic Cu sites, $N_M$, as $N_M$ becomes infinite. The independence with respect to $N_M$ is shown below.

The electron-phonon Hamiltonian for phonon mode $\sigma$, $H_{ep}^\sigma$, is $$H_{ep}^\sigma = \left(\frac{\hbar}{2M\omega_\sigma}\right)^{\frac{1}{2}} \nabla V(a_\sigma + a_\sigma^\dagger), \quad (G8)$$

where M is the nuclear mass. $a_\sigma$ and $a_\sigma^\dagger$ destroy and create $\sigma$ phonon modes, respectively. V is the potential energy of the electron. For localized phonon modes, $\nabla V$ is independent of the number of metallic sites, $N_M$. The l and l' metallic states each scale as $1/\sqrt{N_M}$, leading to $<l|H_{ep}^\sigma|l'> \sim 1/N_M$. Since the number of localized phonon modes scales as $N_M$, the $N_M$ scaling of the sum $\Sigma_\sigma|<l|H_{ep}^\sigma|l'>|^2$ is $\sim N_M (1/N_M)^2 \sim 1/N_M$. Hence, we have shown that $\alpha^2 F(l, l', \Omega)$ and $\lambda(l, l', \omega_n)$ are dimensionless and independent of $N_M$ because the density of states per spin, $N(0)$, is proportional to $N_M$. In fact, $\alpha^2 F$ and $\lambda$ are independent of $N_M$ even when the phonon modes $\sigma$ are delocalized. In this case, $\nabla V \sim 1/\sqrt{N_M}$. The electron-phonon matrix element $<l|H_{ep}^\sigma|l'>$ is now summed over the crystal, and thereby picks up a factor of $N_M$. Hence, $<l|H_{ep}^\sigma|l'> \sim N_M \times \sqrt{1/N_M} \times \sqrt{1/N_M} \times \sqrt{1/N_M} \sim 1/\sqrt{N_M}$. For delocalized phonons, the sarin over phonon modes $\sigma$ in $\Sigma_\sigma|<l|H_{ep}^\sigma|l'>|^2$ does not add another factor of $N_M$. The claim is obvious when l and l' are momentum states k and k' because the only phonon mode that connects these two states has momentum $q = k - k'$. Therefore, $\alpha^2 F(l, l', \Omega)$ and $\lambda(l, l', \omega_n)$ are always dimensionless and independent of $N_M$.

The atomic-scale inhomogeneity of cuprates implies translation is not a perfect symmetry of the crystal. However, the dopants are distributed randomly, and therefore on average k becomes a good quantum number. Hence, we may work with Green's functions in k space and approximate the Cooper pairing to occur between $(k\uparrow, -k\downarrow)$ states. The approximation is identical to the very successful Virtual. Crystal Approximation (VGA) and the Coherent Potential Approximation (CPA) for random alloys.[64]

In the VGA and CPA, the Green's function between two distinct k states, k and k' is zero $$G(k, k', i\omega_n) \approx 0, \text{ if } k \neq k'. \quad (G9)$$

The fact that k is not a good quantum number of the crystal is incorporated by including a self-energy correction, $\Sigma(k, i\omega_n)$ at zeroth order into the metallic Green's function $$G(k, i\omega_n) = \frac{1}{i\omega_n - \epsilon_{bare}(k) - \Sigma(k, i\omega_n)}. \quad (G10)$$

Here, $\epsilon_{base}(k)$ is the bare electron energy. $\Sigma(k, i\omega_n)$ can be written as the sum of two terms, $\Sigma(k, i\omega_n) = \Sigma_0(k, i\omega_n) + i\omega_n \Sigma_1 (k, i\omega_n)$. Both $\Sigma_0$ and $\Sigma_1$ are even powers of $\omega_n$, $\Sigma_i(k, -i\omega_n) = \Sigma_i(k, i\omega_n)$, for $i = 1, 2$. $\Sigma_0$ adds a shift to the bare electron energy, $\epsilon_{base}(k)$, and a lifetime broadening to the electronic state. $\Sigma_1$ leads to wavefunction renormalization of the bare electron state.

The shift of $\epsilon_{bare}(k)$ clue to $\Sigma_0(k, i\omega_n)$ leads to the observed angle-resolved photoemission (ARPES) band structure in cuprates,[17] $\epsilon_k$, and its lifetime broadening. The lifetime broadening integrates out of the Eliashberg equations because the integral of a Lorentzian across the Fermi energy is independent of the width of the Lorentzian.[16] Hence, we may use the ARPES band structure, $\epsilon_k$, in the Eliashberg equations and absorb $\Sigma_1(k, i\omega_n)$ into $Z(k, i\omega_n)$ in the Eliashberg equations.

Hence, we are right back to the standard Eliashberg eduations[16,29,34,35,59]

$$Z(k, i\omega_n) = 1 + \frac{\pi T}{|\omega_n|} \sum_{k'n'}^{|\omega_{n'}|<\omega_c} \left[\frac{\delta(\epsilon_{k'} - \epsilon_F)}{N(0)}\right] \lambda(k, k', \omega_n - \omega_{n'}) s_n s_{n'}, \quad (G11)$$

$$Z(k, i\omega_n)\Delta(k, i\omega_n) =$$

$$\pi T \times \sum_{k'n'}^{|\omega_{n'}|<\omega_c} \frac{1}{|\omega_{n'}|} \left[\frac{\delta(\epsilon_{k'} - \epsilon_F)}{N(0)}\right] [\lambda(k, k', \omega_n - \omega_{n'}) - \mu^*(\omega_c)]$$

$$\Delta(k', i\omega_{n'}),$$

$$Z(k, -i\omega_n) = Z(k, i\omega_n) = \text{Real Number}, \quad (G12)$$

$$\Delta(k, -i\omega_n) = \Delta(k, i\omega_n) = \text{Real Number}. \quad (G13)$$

The Eliashberg equations above are completely general for a single band crossing the Fermi level. The only inputs into the equations are the Fermi surface, Fermi velocity (in order to obtain the local density of states), the dimensionless electron-phonon pairing, $\lambda(k, k', \omega_n)$, and the dimensionless Morel-Anderson Coulomb pseudopotential at the cutoff energy (typically, chosen to be five times larger than the highest phonon mode, $\omega_c = 5\omega_{ph}$), $\mu^*(\omega_c)$. We apply the standard methods[16] to map the above equations into a matrix equation for the highest eigenvalue as a function of T. The highest eigenvalue monotonically increases at T decreases. When the highest eigenvalue crosses 1, $T_c$ is found.

Equations G11, G12, G13 need to be modified when more than one band crosses the Fermi level. Phonons can scatter electron pairs from one band to another in addition to scattering within a single band. The modification to the single Fermi surface Eliashberg equations above require changing the k and k' labels to bk and b'k' where b and b' refer to the band index. k and k' remain vectors in 2D so long as we assume the coupling of $CuO_2$ layers in different unit cells is weak. The number of bands is equal to the number of $CuO_2$ layers per unit cell, L. We derive the electron-phonon pairing $\lambda$ for a single layer caprate in sections G2 and G3. In section G4 we derive the multi-layer $\lambda$.

The total electron-phonon spectral function is the sum of four terms $$\alpha^2 F = \alpha^2 F_1 + \alpha^2 F_2 + \alpha^2 F_{surf} + \alpha^2 F_3, \quad (G14)$$

where $\alpha^2 F_1$ and $\alpha^2 F_2$ are the spectral functions from phonons that contribute to the resistivity. $\alpha^2 F_1$ is due to the phonons that lead to the low-temperature linear term in the resistivity, and $\alpha^2 F_2$ is due to the phonons that lead to the low-temperature $T^2$ resistivity term.[65] $\alpha^2 F_{surf}$ is the component due to the planar O atom at the surface between the metal and insulating regions. It is the O atom phonon shown in FIG. 12a. $\alpha^2 F_1$ is the contribution from the planar O atom adjacent to the metal-insulator surface on the insulating AF side. It is shown in FIG. 12b. Since the energy of these two O phonons modes is ≈60 meV,[18] their contribution to the resistivity is very small.

Sections G2 and G3 in this Appendix derive the four $\alpha^2 F$ terms above in order to obtain the total phonon pairing, $\lambda = \lambda_1 + \lambda_2 + \lambda_{surf} + \lambda_1$, that is used in the Eliashberg equations G11, G12, and G13 for $T_c$.

2. Contribution to $\lambda$ from the Interface O Atom Phonons

The Hamiltonian for FIG. 26 is $$H_{surf}(R) = \delta\epsilon_L c_L^\dagger c_L + \delta\epsilon_R c_R^\dagger c_R - \delta t(c_L^\dagger c_R + c_R^\dagger c_L), \quad (G15)$$

where $c_L^\dagger$ and $c_L$ create and destroy an electron at the L Cu site. $c_R^\dagger$ and $C_R$ are defined similarly. Since there is no electron spin coupling to the O atom phonon mode, the electron spin index is dropped in equation G15.

The k state $\phi(k)$ is defined as $$\phi(k) = N_M^{-\frac{1}{2}} \sum_R e^{ik\cdot R} \phi(R), \quad (G16)$$

where $\phi(R)$ is the localized effective Cu $d_{x^2-y^2}$ orbital at position R, and $N_M$ is the number of metallic Cu sites. The matrix element between k' and k is $$\langle\phi(k')|H_{surf}(R)|\phi(k)\rangle = N_M^{-1} \quad (G17)$$

$$e^{-i(k'-k)(R+\frac{1}{2}a)}\left[\delta\epsilon_L e^{\frac{1}{2}(k'-k)a} + \delta\epsilon_R e^{-\frac{1}{2}(k'-k)a} - 2\delta t\cos\frac{1}{2}(k'+k)a\right]$$

The modulus squared is $$|\langle\phi(k')|H_{surf}(R)|\phi(k)\rangle|^2 = \quad (G18)$$

$$N_M^{-2}\left\{\left[(\delta\epsilon_L + \delta\epsilon_R)\cos\frac{1}{2}(k'+k)a - 2\delta t\cos\frac{1}{2}(k'+k)a\right]^2 + (\delta\epsilon_L + \delta\epsilon_R)^2\sin^2\frac{1}{2}(k'-k)a\right\}$$

Define the two functions of k and k', $J_{surf}^{(x)}(k, k')$ and $J_{surf}^{(y)}(k, k')$ as $$J_{surf}^{(x)}(k, k') = \langle(\delta\epsilon_L + \delta\epsilon_R)^2\rangle_x \cos^2\frac{1}{2}(k_x' - k_x)a - \quad (G19)$$

$$2\langle\delta t(\delta\epsilon_L + \delta\epsilon_R)\rangle_x \cos\frac{1}{2}(k_x' - k_x)a\cos\frac{1}{2}(k_x' - k_x)a +$$

$$\langle\delta t^2\rangle_x \cdot 4\cos^2\frac{1}{2}(k_x' - k_x)a + \langle(\delta\epsilon_L - \delta\epsilon_R)^2\rangle_x \sin^2\frac{1}{2}(k_x' - k_x)a,$$

$$J_{surf}^{(y)}(k, k') = \langle(\delta\epsilon_L + \delta\epsilon_R)^2\rangle_y \cos^2\frac{1}{2}(k_y' - k_y)a - \quad (G20)$$

$$2\langle\delta t(\delta\epsilon_L + \delta\epsilon_R)\rangle_y \cos\frac{1}{2}(k_y' - k_y)a\cos\frac{1}{2}(k_y' - k_y)a +$$

$$\langle\delta t^2\rangle_y \cdot 4\cos^2\frac{1}{2}(k_y' - k_y)a + \langle(\delta\epsilon_L - \delta\epsilon_R)^2\rangle_y \sin^2\frac{1}{2}(k_y' - k_y)a,$$

where $\langle F(R_o)\rangle_x$ is the average of the function $F(R_o)$ defined for each planar surface O on the x-axis with position $R_o$ as shown in FIG. 26.

$$\langle F(R_\sigma)\rangle = \frac{1}{N_M}\sum_{R_\sigma} F(R_\sigma). \quad (G21)$$

Similarly, $\langle F(R_o)\rangle_y$ is the average of $F(R_o)$ over the y-axis surface O atoms. The expression in equation G20 for $J_{surf}^{(y)}$ is identical to the expression for $J_{surf}^{(x)}$ in equation G19 with x replaced by y.

From the k-space versions of equations G3 and G4

$$\lambda_{surf}(k, k', \omega_n) = \left(\frac{N(0)}{N_M}\right)\left[J_{surf}^{(x)}(k, k') + J_{surf}^{(y)}(k, k')\right]\left(\frac{2\omega_{ph}}{\omega_n^2 + \omega_{ph}^2}\right). \quad (G22)$$

b. O Atom Mode Perpendicular to Surface

The Hamiltonian for FIG. 27 is $$H_\perp(R) = \delta\epsilon c_R^\dagger c_R = \delta t(-)(c_{R-a}^\dagger c_R + c_R^\dagger c_{R-a}) - \delta t(+)(c_{R+a}^\dagger c_R + c_R^\dagger c_{R+a}), \quad (G23)$$

where $c_R^\dagger$ and $c_R$ create and destroy an electron at the R Cu site. $c_{R\pm a}^\dagger$ and $c_{R\pm a}$ are defined similarly. Since there is no electron spin coupling to the O atom phonon mode, the electron spin index is dropped in equation G23.

The matrix element between k' and k is $$\langle \phi(k')|H_\perp(R)|\phi(k)\rangle = \quad (G24)$$
$$N_M^{-1} e^{-i(k'-k)R}\left[\delta\epsilon - \delta t(+)\left(e^{-ik'a} + e^{ika}\right) - \delta t(-)\left(e^{ik'a} + e^{-ika}\right)\right]$$

The modulus squared is $$|\langle \phi(k') | H_\perp(R)|\phi(k)\rangle|^2 = \quad (G25)$$
$$N_M^{-2}\{\{\delta\epsilon - [\delta t(+) + \delta t(-)][\cos(k'a) + \cos(ka)]\}^2 +$$
$$[\delta t(+) - \delta t(-)]^2[\sin(k'a) - \sin(ka)]^2\}$$

Define the two functions of k and k', $J_\perp^{(x)}(k, k')$ and $J_\perp^{(y)}(k, k')$ as $$J_\perp^{(x)}(k, k') = \langle\delta\epsilon^2\rangle_x - 2\langle\delta\epsilon[\delta t(+) + \delta t(-)]\rangle_x(\cos k_x'a + \cos k_x a) + \quad (G26)$$
$$\langle[\delta t(+) + \delta t(-)]\rangle_x(\cos k_x'a + \cos k_x a)^2 +$$
$$\langle[\delta t(+) - \delta t(-)]\rangle_x(\sin k_x'a - \sin k_x a)^2,$$

$$J_\perp^{(y)}(k, k') = \langle\delta\epsilon^2\rangle_y - 2\langle\delta\epsilon[\delta t(+) + \delta t(-)]\rangle_y(\cos k_y'a + \cos k_y a) + \quad (G27)$$
$$\langle[\delta t(+) + \delta t(-)]\rangle_y(\cos k_y'a + \cos k_y a)^2 +$$
$$\langle[\delta t(+) - \delta t(-)]\rangle_y(\sin k_y'a - \sin k_y a)^2,$$

where $\langle F(R_\sigma)\rangle_x$ is the average, defined in equation G21, of the function $F(R_\sigma)$ for each x-axis O phonon mode with position $R_\sigma$ as shown in FIG. 27. Similarly, $\langle F(R_\sigma)\rangle_y$ is the average of $F(R_\sigma)$ over the y-axis O atoms. The expression in equation G27 for $J^{(y)}$ is identical to the expression for $J_\perp^{(x)}$ in equation G26 with x replaced by y.

From the k-space versions of equations G3 and G4

$$\lambda_\perp(k, k', \omega_n) = \left(\frac{N(0)}{N_M}\right)[J_\perp^{(x)}(k, k') + J_\perp^{(y)}(k, k')]\left(\frac{2\omega_{ph}}{\omega_n^2 + \omega_{ph}^2}\right). \quad (G28)$$

3. Contribution to λ from the Phonons Responsible for the Resistivity

The low-temperature resistivity of $La_{2-x}Sr_xCuO_4$ is the sum of two terms.[65] One term is linear in T and the other is proportional to $T^2$. At high temperatures, both terms become linear in T. Previously, we showed[13] that the doping evolution of these two terms can be explained by phonon scattering and simple counting of the number of metallic sites and the number of overlapped plaquettes, as a function of doping. The contribution of these phonons on $T_c$ must be included in our Eliashberg calculation.

The power law dependence of the two terms in the resistivity restricts the form of their electron-phonon spectral functions, $\alpha^2F_1$ and $\alpha^2F_2$ for the linear and $T^2$ contributions, respectively. From Fermi's Golden Rule, the electron scattering rate is $$\frac{1}{\tau(k)} = \frac{2\pi}{\hbar}\sum_{k'} 2\int_0^{+\infty} d\Omega \alpha^2 F(k, k', \Omega)n_B(\Omega), \quad (G29)$$

where $n_B(\Omega)$ is the Bose-Einstein distribution $n_B(\omega) = 1/[\exp(\omega/T)-1]$. The factor of two in front of the integral comes from the absorption and emission of phonons. $\alpha^2F$ is zero for $\Omega$ greater than the highest phonon energy.

At high temperatures, $n_B(\Omega) \approx T/\Omega$ leading to $\hbar/\tau(k) \approx 2\pi\lambda_k T$, where $$\lambda_k = 2\int_0^{+\infty} d\Omega \frac{\alpha^2 F(k, \Omega)}{\Omega}, \quad (G30)$$

and $\alpha^2F(k, \Omega) = \Sigma_{k'} \alpha^2F(k, k', \Omega)$. $\lambda_k$ is called the mass-enhancement factor.[16] The slope of the high-temperature scattering rate can be obtained from the resistivity. Hence, the mass-enhancement can be computed from experiment.

At low-temperatures, the Bose-Einstein distribution cuts the integral in the scattering rate off at $\Omega \sim T$. If $\alpha^2F \sim \Omega^n$, then $$\frac{1}{\tau(k)} \sim \int_0^T d\Omega \frac{\alpha^2 F(k, \Omega)}{\Omega}(T) \sim T^{n+1}. \quad (G31)$$

The low-temperature $T^2$ scattering rate is known to be isotropic in k-space,[66] and thereby it must scale as $\sim\Omega$ from equation G31. From the low-temperature resistivity experiments[65], we showed, the $T^2$ resistivity term was proportional to $(1-N_{4M}/N_{Tot})$, where $N_{Tot}$ is the total number of Cu sites (metallic plus insulating AF sites) and $N_{4M}$ is the number of metallic Cu sites that are in non-overlapping plaquettes. Therefore, $\alpha^2F_2(k, k', \Omega)$ is of the form $$\alpha^2 F_2(k, k', \Omega) = C_2\left(\frac{\Omega}{\omega_D}\right)\left(1 - \frac{N_{4M}}{N_{Tot}}\right), \quad (G32)$$

where $C_2$ is a constant to be determined. $\omega_D$ is the Debye energy. $\alpha^2F_2 = 0$, for $\Omega > \omega_D$.

The low-temperature T scattering rate is zero along the diagonals, $k_x = \pm k_y$, and large at $k=(0, \pm\pi), (\pm\pi, 0)$.[66] $\alpha^2F_1$ is independent of $\Omega$ from equation G31. The scattering rate in equation G31 logarithmically diverges for small $\Omega$. Hence, it must be cutoff at some minimum, $\omega_{min}$. For temperatures below $\omega_{min}$, the scattering rate cannot be linear in T. Previously, we showed that $\omega_{min} \approx 1$ K.[13] In this paper, we fix $\omega_{min} = 1$ K. See Appendix F.

The spectral function, $\alpha^2F_1(k, k', \Omega)$, is of the form $$\alpha^2 F_1(k, k', \Omega) = C_1\left(\frac{N_{4M}}{N_{Tot}}\right)D(k)D(k'), \text{ for } \omega_{min} < \Omega < \omega_D, \quad (G33)$$

where $C_1$ is a constant, and $\alpha^2F_1 = 0$ outside of the range $\omega_{min} < \Omega < \omega_D$.

The anisotropy factor, D(k), is $$D(k) = \frac{(\cos(k_x a) - \cos(k_y a))^2}{\langle(\cos(k_x a) - \cos(k_y a))^2\rangle} \tag{G34}$$

where the denominator is the average over the Fermi surface of the numerator.

The average of a function, $f(k)$, over the Fermi surface is defined as $$\langle f(k) \rangle = \frac{\sum_{k'}\left[\frac{\delta(\epsilon_{k'} - \epsilon_F)}{N(0)}\right]f(k')}{\sum_{k'}\left[\frac{\delta(\epsilon_{k'} - \epsilon_F)}{N(0)}\right]}. \tag{G35}$$

Thus $\langle D(k)\rangle = 1$.

The constants $C_1$ and $C_2$ can be determined as follows. The average around the Fermi surface of the scattering rate at high-temperatures is $1/\tau = 2\pi\lambda_{tr} T$. From resistivity measurements,[67] $\lambda_{tr} \approx 0.5$. A fraction $(N_{4M}/N_{Tot})\lambda_{tr}$ of $\lambda_{tr}$ comes from $\langle\alpha^2 F_1\rangle$ and the fraction $(1-N_{4M}/N_{Tot})\lambda_{tr}$ comes from $\langle\alpha^2 F_2\rangle$ leading to $$\lambda_{tr}\left(1 - \frac{N_{4M}}{N_{Tot}}\right) = 2\int_0^{+\infty} d\Omega \frac{\langle\alpha^2 F_2(k, k', \Omega)\rangle}{\Omega}, \tag{G36}$$

$$\lambda_{tr} = 2C_2 \int_0^{\omega_D} \frac{d\Omega}{\omega_D},$$

$$\lambda_{tr} = 2C_2,$$

$$\lambda_{tr}\left(\frac{N_{4M}}{N_{Tot}}\right) = 2\int_{\omega_{min}}^{\omega_D} d\Omega \frac{\langle\alpha^2 F_1(k, k', \Omega)\rangle}{\Omega}, \tag{G37}$$

$$\lambda_{tr} = 2C_1 \int_{\omega_{min}}^{\omega_D} \frac{d\Omega}{\Omega},$$

$$\lambda_{tr} = C_1\left[2\ln\left(\frac{\omega_D}{\omega_{min}}\right)\right].$$

Substituting $C_1$ and $C_2$ in terms of $\lambda_{tr}$ back into $\alpha^2 R_1$ and $\alpha^2 F_2$ yields $$\alpha^2 F_1(k, k', \Omega) = \lambda_{tr}\left[\ln\left(\frac{\omega_D}{\omega_{min}}\right)^2\right]^{-1} D(k)D(k')\left(\frac{N_{4M}}{N_{Tot}}\right), \tag{G38}$$

$$\omega_{min} < \Omega < \omega_D,$$

and $$\alpha^2 F_2(k, k', \Omega) = \frac{1}{2}\lambda_{tr}\left(\frac{\Omega}{\omega_D}\right)\left(1 - \frac{N_{4M}}{N_{Tot}}\right), 0 < \Omega < \omega_D. \tag{G39}$$

$\alpha^2 F_1 = 0$ outside of the range $\omega_{min} < \Omega < \omega_D$ and $\alpha^2 F_2 = 0$ for $\Omega > \omega_D$.

We solve for $\lambda_i(k, k', \omega_n)$ for $i=1, 2$ using the k-space version of equation G4

$$\lambda_i(k, k', \omega_n) = \int_0^{+\infty} d\Omega \alpha^2 F_i(k, k', \Omega)\left(\frac{2\Omega}{\omega_n^2 + \Omega^2}\right), \tag{G40}$$

treading to $$\lambda_1(k, k', \omega_n) = \left(\frac{N_{4M}}{N_{Tot}}\right)\lambda_{tr} D(k)D(k')\left[\frac{\ln\left(\frac{\omega_n^2 + \omega_D^2}{\omega_n^2 + \omega_{min}^2}\right)}{\ln\left(\frac{\omega_D^2}{\omega_{min}^2}\right)}\right] \tag{G41}$$

and $$\lambda_2(k, k', \omega_n) = \left(1 - \frac{N_{4M}}{N_{Tot}}\right)\lambda_{tr}\left[1 - \frac{|\omega_n|}{\omega_D}\tan^{-1}\left(\frac{\omega_D}{|\omega_n|}\right)\right] \tag{G42}$$

4. Generalization of the Eliashberg Equations for Multi-Layer Cuprates

The Eliashberg equations G11, G12, and G13 for a single $CuO_2$ layer per unit cell are generalized to multi-layer cuprates by changing k and k' to bk and b'k', respectively, in the single layer Eliashberg equations.

$$Z(bk, i\omega_n) = \tag{G43}$$

$$1 + \frac{\pi T}{|\omega_n|}\sum_{b'k'n'}^{|\omega_{n'}|<\omega_c}\left[\frac{\delta(\epsilon_{b'k'} - \epsilon_F)}{N(0)}\right]\lambda(bk, b'k', \omega_n - \omega_{n'})s_n s_{n'},$$

$$Z(bk, i\omega_n)\Delta(bk, i\omega_n) =$$

$$\pi T \times \sum_{b'k'n'}^{|\omega_{n'}|<\omega_c}\frac{1}{|\omega_{n'}|}\left[\frac{\delta(\epsilon_{b'k'} - \epsilon_F)}{N(0)}\right][\lambda(bk, b'k', \omega_n - \omega_{n'}) - \mu^*(\omega_c)]$$

$$\Delta(b'k', i\omega_{n'}),$$

$$Z(bk, -i\omega_n) = Z(bk, i\omega_n) = \text{Real Number}, \tag{G44}$$

$$\Delta(bk, -i\omega_n) = \Delta(bk, i\omega_n) = \text{Real Number}, \tag{G45}$$

where b and b' are band indices. They vary from 1 to L, where L is the number of $CuO_2$ layers per unit cell. A unit cell contains L Cu atoms, one in each layer. The k vector is a 2D vector. N(0) is the total density of states per spin $$N(0) = \sum_{b'k'}\delta(\epsilon_{b'k'} - \epsilon_F). \tag{G46}$$

There is a Bloch k state for each layer, l, given by $\phi(lk)$. The band eigenfunctions are $$\psi(bk) = \sum_l A_{bl}(k)\phi(lk). \tag{G47}$$

The coefficients $A_{bl}(k)$, are real since the inter-layer hopping matrix elements are real. The matrix element for hopping between adjacent layers is $$\langle\phi(l\pm1k')|H_{inter}|\phi(lk)\rangle = -t(l\pm1,l,k)\delta_{k'k} \tag{G48}$$

where $$t(l\pm1,l,k) = \alpha t_z(\tfrac{1}{4})[\cos(k_x a) - \cos(k_y a)]^2, \tag{G49}$$

and $\alpha$ is the product of the fraction of metallic sites in layers l and l±1. See Appendix F Table II.

The eigenvectors ψ(bk) of equations G47 and G48 are independent of the magnitude of t(l±1, l, k). Thus $A_{bl}(k)$ is independent of k, $$A_{bl}(k) = A_{bl}. \tag{G50}$$

The eigenstates, ψ(bk), are normalized leading to $$\sum_b A_{bl'} A_{bl} = \delta_{ll'}, \tag{G51}$$

$$\sum_l A_{b'l} A_{bl} = \delta_{b'b}. \tag{G52}$$

The electron-phonon spectral function $\alpha^2 F_2$(bk, b'k', Ω) is $$\alpha^2 F_2(bk, b'k', \Omega) = \frac{1}{2}\lambda_{tr}\left(\frac{\Omega}{\omega_D}\right)(1 - n_{4M}), 0 < \Omega < \omega_D, \tag{G53}$$

where $$n_{4M}(l) = \frac{N_{4M}(l)}{N_{xy}}, \tag{G54}$$

$$n_{4M} = \frac{1}{L}\sum_l n_{4M}(l). \tag{G55}$$

$N_{4M}(l)$ is the number of metallic Cu sites in layer l that are in non-overlapping plaquettes, L is the total number of $CuO_2$ layers per unit cell, and $N_{xy}$ is the total number of Cu sites (metallic plus insulating AF) in a single $CuO_2$ layer. Hence. $LN_{xy}$ is the total number of Cu sites in the crystal and $n_{4M}$ is the total fraction of metallic Cu sites over all the $CuO_2$ layers. $\alpha^2 F_2 = 0$ for $\Omega > \omega_D$.

For the electron-phonon spectral function, $\alpha^2 F_1$ that leads to the low-temperature linear resistivity, define the anisotropy factor, D(bk) as $$D(bk) = \frac{(\cos(k_x a) - \cos(k_y a))^2}{\langle(\cos(k_x a) - \cos(k_y a))^2\rangle} \tag{G56}$$

where the denominator is the average over all the L Fermi surfaces of the numerator.

The average of a function, $f(bk)$, over all the Fermi surfaces is defined as $$\langle f(bk) \rangle = \frac{\sum_{b'k'}\left[\frac{\delta(\epsilon_{b'k'} - \epsilon_F)}{N(0)}\right] f(b'k')}{\sum_{b'k'}\left[\frac{\delta(\epsilon_{b'k'} - \epsilon_F)}{N(0)}\right]}. \tag{G57}$$

The phonon modes in $\alpha^2 F_1$ are 2D. Hence, the form of the spectral function between layers l and l' is of the form, $$\alpha^2 F_1(lk, l'k', \Omega) = \delta_{ll'}\left[\ln\left(\frac{\omega_D^2}{\omega_{min}^2}\right)\right]^{-1} n_{4M}(l)D(k)D(k'). \tag{G58}$$

Expanding the eigenstates ψ(bk) in terms of φ(lk) from equation G47 leads to $$\alpha^2 F_1(bk, b'k', \Omega) = \tag{G59}$$
$$\left\{\sum_l |A_{bl}|^2 |A_{b'l'}|^2 n_{4M}(l)\right\}\lambda_{tr}\left[\ln\left(\frac{\omega_D^2}{\omega_{min}^2}\right)\right]^{-1} D(bk)D(b'k'),$$

where $\omega_{min} < \Omega < \omega_D$. $\alpha^2 F_1 = 0$, for $\Omega < \omega_{min}$ or $\Omega > \omega_D$. Hence, $$\lambda_1(bk, b'k', \omega_n) = \tag{G60}$$
$$\left\{\sum_l |A_{bl}|^2 |A_{b'l'}|^2 n_{4M}(l)\right\}\lambda_{tr} D(bk)D(b'k') \left[\frac{\ln\left(\frac{\omega_n^2 + \omega_D^2}{\omega_n^2 + \omega_{min}^2}\right)}{\ln\left(\frac{\omega_D^2}{\omega_{min}^2}\right)}\right]$$

and $$\lambda_2(bk, b', k', \omega_n) = (1 - n_{4M})\lambda_{tr}\left[1 - \frac{|\omega_n|}{\omega_D}\tan^{-1}\left(\frac{\omega_D}{|\omega_n|}\right)\right] \tag{G61}$$

The multi-layer expressions for $\lambda_{surf}$(bk, b'k', $\omega_n$) and $\lambda_\perp$(bk, b'k', $\omega_n$) are similar to their single-layer counterparts with a modified definition for the averaging in their respective $J^{(x)}$ and $J^{(y)}$ functions.

$$J_{surf}^{(x)}(bk, b'k') = \langle(\delta\epsilon_L + \delta\epsilon_R)^2\rangle_x \cos^2\frac{1}{2}(k'_x - k_x)a - \tag{G62}$$
$$2\langle\delta t(\delta\epsilon_L + \delta\epsilon_R)\rangle_x \cos\frac{1}{2}(k'_x - k_x)a\cos\frac{1}{2}(k'_x + k_x)a +$$
$$\langle\delta t^2\rangle_x \cdot 4\cos^2\frac{1}{2}(k'_x + k_x)a + \langle(\delta\epsilon_L - \delta\epsilon_R)^2\rangle_x \sin^2\frac{1}{2}(k'_x - k_x)a,$$

$$J_{surf}^{(y)}(bk, b'k') = \langle(\delta\epsilon_L + \delta\epsilon_R)^2\rangle_y \cos^2\frac{1}{2}(k'_y - k_y)a - \tag{G63}$$
$$2\langle\delta t(\delta\epsilon_L + \delta\epsilon_R)\rangle_y \cos\frac{1}{2}(k'_y - k_y)a\cos\frac{1}{2}(k'_y + k_y)a +$$
$$\langle\delta t^2\rangle_y \cdot 4\cos^2\frac{1}{2}(k'_y + k_y)a + \langle(\delta\epsilon_L - \delta\epsilon_R)^2\rangle_y \sin^2\frac{1}{2}(k'_y - k_y)a,$$

where $\langle F(R_o)\rangle_x$ is the multi-layer average of the function $F(R_o)$ defined for each planar surface O on the x-axis with position $R_o$ as shown in FIG. 27, $$\langle F(R_\sigma)\rangle = \sum_l |A_{bl}|^2 |A_{b'l}|^2 \langle F_l(R_\sigma)\rangle, \tag{G64}$$

and $\langle F_l(R_o)\rangle$, is the average over layer l, as defined in equation G21. Similarly for $\langle F(R_o)\rangle_y$. The expression in equation G63 for $J_{surf}^{(y)}$ is identical to the expression for $J_{surf}^{(x)}$ in equation G62 with x replaced by y.

Hence, $\lambda_{surf}$(bk, b'k', $\omega_n$) is $$\lambda_{surf}(k, k', \omega_n) = \left(\frac{N(0)}{N_M}\right)\left[J_{surf}^{(x)}(k, k') + J_{surf}^{(y)}(k, k')\right]\left(\frac{2\omega_{ph}}{\omega_n^2 + \omega_{ph}^2}\right), \tag{G65}$$

where $N_M$ is the total number of metallic Cu sites, $N_M = \Sigma_l N_{lM}$, and $N_{lM}$ is the total number of metallic Cu sites in layer l.

For $\lambda_\perp(bk, b'k', \omega_n)$, the corresponding $J_\perp^{(x)}$ and $J_\perp^{(y)}$ functions are $$J_\perp^{(x)}(bk, b'k') = \langle\delta\epsilon^2\rangle_x - 2\langle\delta\epsilon[\delta t(+) + \delta t(-)]\rangle_x(\cos k'_x a + \cos k_x a) + \quad (G66)$$
$$\langle[\delta t(+) + \delta t(-)]\rangle_x(\cos k'_x a + \cos k_x a)^2 +$$
$$\langle[\delta t(+) - \delta t(-)]\rangle_x(\sin k'_x a - \sin k_x a)^2,$$

$$J_\perp^{(y)}(bk, b'k') = \langle\delta\epsilon^2\rangle_y - 2\langle\delta\epsilon[\delta t(+) + \delta t(-)]\rangle_y(\cos k'_y a + \cos k_y a) + \quad (G67)$$
$$\langle[\delta t(+) + \delta t(-)]\rangle_y(\cos k'_y a + \cos k_y a)^2 +$$
$$\langle[\delta t(+) - \delta t(-)]\rangle_y(\sin k'_y a - \sin k_y a)^2.$$

All averages in equations G66 and G67 are defined in equation G64.

Hence, $\lambda_\perp(bk, b'k', \omega_n)$ is $$\lambda_\perp(bk, b'k', \omega_n) = \quad (G68)$$
$$\left(\frac{N(0)}{N_M}\right)[J_\perp^{(x)}(bk, b'k') + J_\perp^{(y)}(bk, b'k')]\left(\frac{2\omega_{ph}}{\omega_n^2 + \omega_{ph}^2}\right).$$

5. Computational Details

The band structure, $\epsilon_k$, and all the parameters used the solve the Eliashberg equations for $T_c$ are described in Appendix F. Here, we discuss the computational issues necessary to obtain an accurate $T_c$.

The two planar interface O atom phonon modes in FIG. 12 require averaging products of pairs of parameters ($\delta\epsilon_L$, $\delta\epsilon_R$, and $\delta t$ for $\lambda_{surf}$ and $\delta\epsilon$ and $\delta t(\pm)$ for $\lambda_\perp$) over the lattice as seen in equations G19, G20, G26, G27, G62, G63, G66, and 067. These parameters vary depending on the environment of the Cu atoms, as shown in FIG. 12.

For each doping value, we generate a 2000×2000 lattice of doped plaquettes. All O atoms that contribute to $\lambda_{surf}$ and $\lambda_\perp$ are identified along with the nature of the corresponding Cu sites (edge, convex, or concave, as shown in FIG. 12). All the product averages are computed. Ensembles of 2000×2000 lattices can be generated to obtain more accurate product averages. We found that a single 2000×2000 doped lattice is large enough to obtain all the products to an accuracy of less than 1%.

All four electron-phonon pairing functions, $\lambda_1$, $\lambda_2$, $\lambda_{surf}$, and $\lambda_\perp$ can be written in the following product form $\lambda(k, k', \omega_n) = \lambda'(k, k')F(\omega_n)$. The product separation, $\lambda = \lambda'F$, leads to a large reduction in the storage requirements because $\lambda'$ and $F$ can be computed once and saved, and the product computed on the fly.

We discretize the Fermi surface by choosing 10 uniformly spaced (in angle) k-points in the 45° wedge bounded by the vectors along the x-axis, ($\pi$, 0), and the diagonal, ($\pi$, $\pi$), leading to a total of 80 k-points over the full Fermi surface. Increasing the number of k-points further led to <0.1 K change in the calculated $T_c$.

Fermi surface weights, $W_{bk}$, are computed at each bk-point using the Fermi velocity evaluated from the band structure, $\epsilon_k$. By rescaling the gap function, $\Delta(bk, \omega_n)$, $$\Delta'(bk, \omega_n) = \left[\frac{W_{bk}}{|2n+1|}\right]^{\frac{1}{2}}\Delta(bk, \omega_n) \quad (G69)$$

the Eliashberg equations can be turned into an eigenvalue equation with a real symmetric matrix.[16] Since $T_c$ occurs when the largest eigenvalue reaches one, we can perform a Lanczos projection. We compute $T_c$ by bracketing. All the $T_c$ values found in tins paper are accurate to ±0.3K. For approximate timings, a full $T_c$-dome is computed on a small workstation in ≈5-10 minutes.

Advantages and Improvements

Presented herein is a method of fabricating high temperature superconductors. The validity of the method is illustrated using a microscopic theory of cuprate superconductivity based on the results of the chemist's ab initio hybrid density functional methods (DFT). Hybrid DFT finds a localized out-of-the-$CuO_2$ hole is formed around a negatively charged dopant. The doped hole resides in a four-Cu-site plaquette. The out-of-plane hole destroys the antiferromagnetism inside the plaquette and creates a tiny piece of metal there. Hence, the crystal is inhomogeneous on the atomic-scale with metallic and insulating regions.

In contrast, the physicist's DFT methods (LDA and PBE) find a delocalized hole residing in the $CuO_2$ planes as a consequence of doping. As discussed herein, the chemist's result is to be trusted over the physicist's result because it corrects the spurious self-Coulomb repulsion of the electrons found in the physicist's density functionals.

Due to dopant-dopant Coulomb repulsion, doped plaquettes do not overlap unless the doping is sufficiently high that overlap cannot be avoided. Non-overlapping plaquettes have a dynamic Jahn-Teller distortion of the out-of-the-plane hole (called a "fluctuating dumbbell"). The dumbbells inside an overlapped plaquette become static Jahn-Teller distortions, or "frozen".

The above model explains a vast swath of normal state phenomenology using simple counting of the sizes of the metallic region, the insulating AF region, and the number of fluctuating and frozen dumbbells. As illustrated herein, superconducting pairing arises from planar Oxygen atoms near the interface between the metallic and insulating regions. These planar O atom phonon modes explain the large Tc~100 K, the Tc-dome as a function of doping, the changes in Tc as a function of the number of $CuO_2$ layers per unit cell, the lack of a Tc isotope effect at optimal doping, and the D-wave superconducting pairing wavefunction (or superconducting gap symmetry).

Generally, with phonon superconducting pairing, an isotropic S-wave pairing wavefunction is favored over a D-wave pairing wavefunction. However, the present disclosure shows that the fluctuating dumbbells drastically raise the Cooper pair Coulomb repulsion, leading to the observed D-wave pairing wavefunction. By overlapping the plaquettes and freezing the dumbbells, the S-wave pairing wavefunction becomes favored over the D-wave pairing wavefunction. The present disclosure shows that the S-wave Tc is in the range of ≈280-390 K when the D-wave Tc≈100 K.

REFERENCES

The following references are incorporated by reference herein.

1 Schilling, A., Cantoni, M., Guo, J. D. & Ott, H. R. Superconductivity above 130 k in the Hg—Ba—Ca—Cu-o system. *Nature* 363, 56-58 (1993).
2 Mukuda, Shimizu, S., Ivo, A. & Kitaoka, Y. High-tc superconductivity and antiferromagnetism in multilayered copper oxides—a new paradigm of superconducting mechanism. *Journal of the Physical Society of Japan* 81, 011008 (2012).
3 Mann, A. Still in suspense. *Nature* 475, 280-282 (2011).

4 Perdew, J. P., Burke, K. & Emzerhof, M. Generalized gradient approximation made simple. *Phys. Rev. Lett.* 77, 3865-3868 (1996). URL http://link.aps.org/doi/10.1103/PhysRevLett.77.3865.

5 Yu, J. J., Freeman, A. J. & Xu, J. Ft Electronically driven instabilities and superconductivity in the layered $La_{2-x}Ba_xCuO_4$ perovskites. *Physical Review Letters* 58, 1035-1037 (1987).

6 Mattheiss, L. F. Electronic band properties and superconductivity in la2-yxycuo4. *Physical Review Letters* 58, 1028-1030 (1987).

7 Pickett, W. E. Electronic-structure of the high-temperature oxide superconductors. *Reviews of Modern Physics* 61, 433-512 (1989).

8 Perdew, J. P. & Zunger, A. Self-interaction correction to density-functional approximations for many-electron systems. *Physical Review B* 23, 5048-5079 (1981).

9 Perry, J. K., Tahir-Kheli, J. & Goddard, W. A. Antiferromagnelic band structure of la2cuo4: Becke-3-lee-yang-parr calculations. *Physical Review B* 63, 144510 (2001).

10 Perry, J. K. Tahir-Kheli, J. & Goddard, W. A. Ab initio evidence for the formation of impurity d3z2-r2 holes in doped la2-xsrxcuo4. *Physical Review B* 65, 144501 (2002).

11 Tahir-Kheli, J. & Goddard, W. A. Origin of the pseudogap in high-temperature cuprate superconductors. *Journal of Physical Chemistry Letters* 2, 2326-2330 (2011).

12 Tahir-Kheli, J. Understanding superconductivity in cuprates. Caltech YouTube Channel (2015). URL https://www.youtube.com/watch?v=Dq2uIzS U9k.

13 Tahir-Kheli, J. Resistance of high-temperature cuprate superconductors. *New Journal of Physics* 15, 073020 (2013).

14 Tahir-Kheli, J. &. Goddard, W. A. Universal properties of cuprate superconductors: Tc phase diagram, room-temperature thermopower, neutron spin resonance, and stm incommensurability explained in terms of chiral plaquette pairing. *Journal of Physical Chemistry Letters* 1, 1290-1295 (2010).

15 Proust, C., Vignolle, B., Levallois, J., Adachi, S. & Hussey, N. E. Fermi liquid behavior of the in-plane resistivity in the pseudogap state of yba2cu4o8. *Proceedings of the National Academy of Sciences* 113, 13654-13659 (2016). URL http://www.pnas.org/content/113/48/13654.abstract. http://www.pnas.org/content/113/48/13654.full.pdf.

16 Allen, P. B. & Mitrovic, B. Theory of superconducting tc. In Ehrenreich, H., Seitz, F. &. Turnbull, D. (eds.) *Solid State Physics, Advances in Research and Applications*, vol. 37, 1-92 (Academic Press, New York, 1982).

17 Hashimoto, M. et al. Doping evolution of the electronic structure in the single-layer cuprate bi2sr2-xlaxCuo6+δ: Comparison with other single-layer cuprates. *Phys. Rev. B* 77, 094516 (2008). URL http://link.aps.org/doi/10.1103/PhysRevB.77.094516.

18 Pintschovius, L. Electron-phonon coupling effects explored by inelastic neutron scattering. *Physica Status Solidi B-Basic Research* 242, 30-50 (2005).

19 Phillips, J. C. Self-organized networks and lattice effects in high-temperature superconductors. *Physical Review B* 75 (2007).

20 Li, C. W. et al. Structural relationship between negative thermal expansion and quartic anharmonicity of cubic scf3. *Phys. Rev. Lett.* 107, 195504 (2011). URL http://link.aps.org/doi/10.1103/PhysRevLett.107.195504.

21 Lan, T. et al. Anharmonic lattice dynamics of Ag2O studied by inelastic neutron scattering and first-principles molecular dynamics simulations. *Phys. Rev. B* 89, 054306 (2014). URL http://link.aps.org/doi/10.1103/PhysRevB.89.054306.

22 Hui, J. C. K. & Allen, P. B. Effect of lattice anharmonicity on superconductivity. *Journal of Physics F: Metal Physics* 4, L42 (1974). URL http://stacks.iop.org/0305-4608/4/i=3/a=003.

23 Crespi, V. H. Cohen, M. L. & Penn, D. R. Anharmonic phonons and the isotope effect in superconductivity. *Phys. Rev. B* 43, 12921-12924 (1991). URL, http://link.aps.org/doi/10.1103/PhysRevB.43.12921.

24 Crespi, V. H. & Cohen, M. L. Anharmonic phonons and the anomalous isotope effect in la2-x srx cuo4. *Phys. Rev. B* 44, 4712-4715 (1991). URL http://link.aps.org/doi/10.1103/PhysRevB.44.4712.

25 Crespi, V. H. & Cohen, M. L. Anharmonic phonons and high-temperature superconductivity. *Phys. Rev. B* 48, 398-406 (1993). URL http://link.aps.org/doi/10.1103/PhysRevB.48. 398.

26 Keller, H. Unconventional isotope effects in cuprate superconductors. In Müller, K. A. & Bussmann-Holder, A. (eds.) *In Superconductivity in Complex Systems. Springer Series Structure and Bonding*, vol. 114, 143-169 (Springer Berlin Heidelberg, Berlin, Heidelberg, 2005). URL http://dx.doi.org/10.1007/b101019.

27 Keller, H., Bussmann-Holder, A. & Mller, K. A. Jahn-teller physics and high-tc superconductivity. *Materials Today* 11, 38-46 (2008). URL //www.sciencedirect.com/science/article/pii/S1369702108701780.

28 de Gennes, P. G. *Superconductivity of Metals and Alloys* (Addison-Wesley Publishing Co., Inc., Redwood City, Calif., 1989).

29 Schreiffer, J. R. *Theory of Superconductivity* (Perseus Books, Reading, Mass., 1999).

30 Bogoliubov, N. N., Tolamachev, V. V. & Shirkov, D. V. *A New Method in the Theory of Superconductivity* (Consultants Bureau, Inc., New York, 1959).

31 Morel, P. & Anderson, P. W. Calculation of the superconducting state parameters with retarded electron-phonon interaction. *Phys. Rev.* 125, 1263-1271 (1962). URL http://link.aps.org/doi/10.1103/PhysRev.125.1263.

32 Cohen, M. L. Superconductivity in low-carrier density systems: Degenerate semiconductors. In Parks, R. D. (ed.) *Superconductivity*. vol. 1, 615-664 (Marcel Dekker, Inc., New York, 1969).

33 Tsuei, C. C. & Kirtley, J. R. Pairing symmetry in cuprate superconductors. *Rev. Mod Phys.* 12, 969-1016 (2000). URL http://link.aps.org/doi/10.1103/RevModPhys.72.969.

34 Schrieffer, J. R., Scalapino, D. J. & Wilkins, J. W. Effective tunneling density of states in superconductors. *Phys. Rev. Lett.* 10, 336-339 (1963). URL http://link.aps.org/doi/10.1103/PhysRevLett.10.336.

35 Scalapino, D. J., Schrieffer, J. R. & Wilkins, J. W. Strong-coupling superconductivity. i. *Phys. Rev.* 148, 263-279 (1966). URL http://link.aps.org/doi/10.1103/PhysRev.148.263.

36 Karppinen, M. et at Layer-specific hole concentrations in bi2sr2y1-xcax)cu2o8+δ as probed by xanes spectroscopy and coulometric redox analysis. *Phys. Rev. B* 67, 134522 (2003). URL http://link.aps.org/doi/10.103/PhysRevB.67.134522

37 Liang, R., Bonn, D. A. & Hardy, W. N. Evaluation of cuo2 plane hole doping in yba2cu3o6+x single crystals. *Phys. Rev. B* 73, 180505 (2006). URL http://link.aps.org/doi/10.1103/PhysRevB.73.180505.

38 Naqib, S. H., Cooper; J. R., Tallon, J. L. & Panagopoulos, C. Temperature dependence of electrical resistivity of high-t-c cuprates—from pseudogap to overdoped regions. Physica C-Superconductivity and Its Applications 387, 365-372 (2003).
39 Yoshida, T. et al. Low-energy electronic structure of the high-tc cuprates la2-xsrxcuo4 studied by angle-resolved photoemission spectroscopy. *Journal of Physics: Condensed Matter* 19, 125209(2007). URL http://stacks/iop.org/0953-8984/19/i=12/a=125209.
40 Ono, S. & Ando, Y. Evolution of the resistivity anisotropy in bi2sr2-xlaxetio6+δ single crystals for a wide range of hole doping. *Phys. Rev. B* 67, 104512 (2003). URL http://link.aps.org/doi/10.1103/PhysRevB.67.104512.
41 Bangura, A. F. et al. Fermi surface and electronic homogeneity of the overdoped cuprate superconductor tl2ba2cuo6+δ as revealed by quantum oscillations. *Phys. Rev. B* 82, 140501(2010). URL, http://link.aps.org/doi/10.1103/PhysRevB.82.140501.
42 Rourke, P. M. C. et al. A detailed de haasvan alphen effect study of the overdoped cuprate tl2ba2cuo6+δ. *New Journal of Physics* 12, 105009 (2010). URL http://stacks.iop.org/1.367-2630/12/i=10/a=105009.
43 Kurtin, S., McGill, T. C. & Mead, C. A. Fundamental transition in the electronic nature of solids. *Phys. Rev. Lett.* 22, 1433-1436 (1969). URL http://link.aps.org/doi/10.1103/PhysRevLett.22.1433.
44 Takagi, H. et of. Superconductor-to-nonsuperconductor transition in (la1-xsrx)2cuo4 as investigated by transport and magnetic measurements. *Phys. Rev. B* 40, 2254-2261 (1989). URL http://link.aps.org/doi/10.1103/PhysRevB.40.2254.
45 Herzberg, G. *Molecular Spectra and Molecular Structure I. Spectra of Diatomic Molecules* (D. Van Nostrand Company, Inc. Princeton, N.J., 1950).
46 Herzberg, G. *Molecular Spectra and Molecular Structure II. Infrared and Raman Spectra of Polyatomic Molecules.* (D. Van Nostrand Company, Inc. Princeton, N.J., 1945).
47 Wilson, E. B., Decius, J. C. & Cross, P. C. *Molecular Vibrations. The Theory of Infrared and Raman Vibrational Spectra* (Dover Publications, Inc., New York, 1980).
48 Pereiro, J. et al. Insights from the study of high-temperature interface superconductivity. *Philosophical Transactions of the Royal Society at London A: Mathematical. Physical and Engineering Sciences* 370, 4890-4903 (2012). URL http://rsta.royalsocietypublishing.org/content/370/1977/4890. http://rsta.royalsocietypublishing.org/content/370/1977/4890.full.pdf.
49 Allen, P. B. & Dynes, R. C. Transition temperature of strong-coupled superconductors reanalyzed. *Phys. Rev. B* 12, 905-922 (1975). URL http://link.aps.org/doi/10.1103/PhysRevB.12.905.
50 Blatt, J. M. *Theory of Superconductivity* (Academic Press Inc. New York and London, 1964).
51 Crowley, J. M., Tahir-Kheli, J. & Goddard, W. A. Resolution of the band gap prediction problem for materials design. *J. Phys. Chem. Lett.* 7, 1198-1203 (2016). URL http://dx.doi.org/10.1021/acs.jpclett.5b02870. http://dx.doi.org/10.1021/acs.jpclett.5b02870,
52 Ginder, J. M. et al. Photocxcitations in la2cuo4: 2-cv energy gap and long-lived defect states. *Phys. Rev. B* 37, 7506-7509 (1988).
53 Zhang, F. C & Rice. T. M. Effective hamiltonian for the superconducting cu oxides. *Phys. Rev. B* 37, 3759-3761 (1988). URL http://link.aps.org/doi/10.1103/PhysRevB.37.3759.
54 Becke, A. D. Density-functional thermochemistry. iii, the role of exact exchange. *J. Chem. Phys.* 98, 5648-5652 (1993). URL http://scitation.aip.org/content/aip/journal/jcp/98/7/10.1063/1.464913.
55 Saunders, V. et al. *CRYSTAL98 User's Manual* (University of Torino: Torino, 1998).
56 Lee, C., Yang, W. & Parr, R. G. Development of the colle-salvetti correlation-energy formula into a functional of the electron density. *Phys. Rev. B* 37, 785-789 (1988). URL http://link.aps.org/doi/10.1103/PhysRevB.37.785.
57 CRYSTAL98 only had basic Fock Matrix mixing convergence (SCF) at the time of our calculation in 2001.[9] Using the most recent version of CRYSTAL (2015), we find the gap to be 3.1 eV using exactly the same basis set. Improved SCF convergence algorithms, increased computing power, and memory indicates our result of 2001 had not fully, converged. We know hybrid functionals generally overestimate the band gaps of Mott antiferromagnets by ≈1 eV, [51] perhaps because the unrestricted spin wavefunctions (UHF) do not represent the correct spin state. Regardless, the orbital character of the doped hole is unchanged. None of the conclusions of the current disclosure are altered.
58 Hybertsen, M. S., Stechel, E. B., Foulkes, W M. C. & Schluter, M. Model for low-energy electronic states probed by x-ray absorption in high-tc cuprates. *Physical Review B* 45, 1003210050 (1992).
59 Scalapino, D. J. The electron-phonon interaction and strong-coupling superconductors. In Parks, R. D. (ed.) *Superconductivity*, vol. 1, 449-560 (Marcel Dekker, Inc., New York, 1969).
60 Vidberg, H. J. & Serene, J. W. Solving the eliashberg equations by means of n-point pad'e approximants. *Journal of Low Temperature Physics* 29, 179-192 (1977). URL http://dx.doi.org/10.1007/BF00655090.
61 Leavens, C. & Ritchie, D. Extension of the n-point pad'e approximants solution of the eliashberg equations to t~tc. *Solid State Communications* 53, 137-142 (1985). URL//www.sciencedirect.com/science/article/pii/0038109885901127.
62 Beach, K. S. D., Gooding, R. J. & Marsiglio, F. Reliable pad'e analytical continuation method based on a high-accuracy symbolic computation algorithm. *Phys. Rev. B* 61, 5147-5157 (2000). URL http://link.aps.org/doi/10.1103/PhysRevB.61.5147.
63 Ostlin, A. Chioncel, L. &. Vitos, L. One-particle spectral function and analytic continuation for many-body implementation in the exact muffin-tin orbitals method. *Phys. Rev. B* 86, 235107 (2012). URL http://link.aps.org/doi/10.1103/PhysRevB.86.235107.
64 Elliott, R. J., Krumhansl, J. A. & Leath, P. L. The theory and properties of randomly disordered crystals and related physical systems. *Rev. Mod. Phys.* 46, 465-543 (1974). URL http://link.aps.org/doi/10.1103/RevModPhys.46.465.
65 Hussey, N. E. et al. Dichotomy in the t-linear resistivity in hole-doped cuprates. *Philosophical Transactions of the Royal Society a-Mathematical Physical and Engineering Sciences* 369, 1626-66
66 Abdel-Jawad, M. et al. Anisotropic scattering and anomalous normal-state transport in a hightemperature superconductor. *Nature Physics* 2, 821--825 (2006).
67 Cooper, R. A. et al. Anomalous criticality in the electrical resistivity of la2-xsrxcuo4. *Science* 323, 603-607 (2009).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A superconducting composition of matter, comprising:
a cuprate superconductor comprising:
   a lattice of $CuO_2$ planes;
   first atoms occupying sites between said $CuO_2$ planes, dopant atoms comprising second atoms and third atoms occupying first atom sites, where the second atoms are p-type dopants relative to the first atoms, and the third atoms are n-type dopants relative to the first atoms;
wherein:
   the total concentration of said dopant atoms is greater than 20% of the concentration of said first atoms,
   the concentration of said second atoms is greater than 5% of the concentration of said first atoms, and
   the concentration of said third atoms is greater than 5% of the concentration of said first atoms.

2. The composition of matter of claim 1, wherein the first atoms have oxidation state plus three, the second atoms have oxidation state plus two, and the third atoms have oxidation state plus four.

3. The composition of matter of claim 2, wherein the first atoms comprise Yttrium or Lanthanum and the second atoms comprise Magnesium, Calcium, Strontium, Barium, Zinc, Cadmium, Copper, Nickel, or Cobalt.

4. The composition of matter of claim 3, wherein the third atoms comprise Titanium, Zirconium, Hafnium, Cerium, Carbon, Silicon, Germanium, Tin, or Lead.

5. The composition of matter of claim 1, wherein the third atoms comprise Cerium.

6. The composition of matter of claim 1, wherein the first atoms have oxidation state plus two, the second atoms have oxidation state plus one, the third atoms have oxidation state plus three.

7. The composition of matter of claim 6, wherein the first atoms comprise Magnesium, Calcium, Strontium, Barium, Zinc, Cadmium, Copper, Nickel, or Cobalt.

8. The composition of matter of claim 1, wherein the first atoms comprise Oxygen and the third atoms comprise Fluorine.

9. The superconducting composition of matter of claim 1, wherein the concentrations of the dopant atoms are selected such that the cuprate superconductor comprises an S-wave superconductor.

10. Electrical machinery or a power transmission device comprising the cuprate superconductor of claim 1, the machinery or the device utilizing S-wave properties.

11. A method of making a superconducting composition of matter, comprising:
designing and fabricating a cuprate superconductor comprising:
   a lattice of $CuO_2$ planes;
   first atoms occupying sites between said $CuO_2$ planes, dopant atoms comprising second atoms and third atoms occupying first atom sites, where the second atoms are p-type dopants relative to the first atoms, and the third atoms are n-type dopants relative to the first atoms;
wherein the designing and fabricating further comprises selecting:
   the total concentration of said dopant atoms that is greater than 20% of the concentration of said first atoms,
   the concentration of said second atoms that is greater than 5% of the concentration of said first atoms, and
   the concentration of said third atoms that is greater than 5% of the concentration of said first atoms,
so that the cuprate superconductor comprises an S-wave superconductor.

12. The method of claim 11, further comprising using the cuprate superconductor as an S-wave superconductor or utilizing S-wave properties of the S-wave superconductor.

13. The method of claim 11, wherein the first atoms have oxidation state plus three, the second atoms have oxidation state plus two, and the third atoms have oxidation state plus four.

14. The method of claim 11, wherein the first atoms comprise Yttrium or Lanthanum and the second atoms comprise Magnesium, Calcium, Strontium, Barium, Zinc, Cadmium, Copper, Nickel, or Cobalt.

* * * * *